United States Patent
Jang et al.

(10) Patent No.: US 12,435,229 B2
(45) Date of Patent: Oct. 7, 2025

(54) INK COMPOSITION, FILM FORMED USING THE INK COMPOSITION, AND ELECTRONIC APPARATUS INCLUDING THE INK COMPOSITION

(71) Applicant: Samsung Display Co., Ltd., Yongin-si (KR)

(72) Inventors: Seunghee Jang, Yongin-si (KR); Sanghee Yu, Yongin-si (KR); Taekjoon Lee, Yongin-si (KR); Kawon Pak, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 817 days.

(21) Appl. No.: 17/469,761

(22) Filed: Sep. 8, 2021

(65) Prior Publication Data
US 2022/0204795 A1 Jun. 30, 2022

(30) Foreign Application Priority Data
Dec. 28, 2020 (KR) .................. 10-2020-0185207

(51) Int. Cl.
| | | |
|---|---|---|
| *C09D 11/322* | (2014.01) | |
| *B82Y 20/00* | (2011.01) | |
| *B82Y 40/00* | (2011.01) | |
| *C09D 11/037* | (2014.01) | |
| *C09D 11/101* | (2014.01) | |
| *C09D 11/107* | (2014.01) | |
| *C09D 11/50* | (2014.01) | |
| *C09D 11/52* | (2014.01) | |
| *H10K 50/125* | (2023.01) | |
| *H10K 50/854* | (2023.01) | |
| *H10K 59/12* | (2023.01) | |
| *H10K 59/80* | (2023.01) | |

(52) U.S. Cl.
CPC .......... *C09D 11/322* (2013.01); *C09D 11/037* (2013.01); *C09D 11/101* (2013.01); *C09D 11/107* (2013.01); *C09D 11/50* (2013.01); *C09D 11/52* (2013.01); *H10K 50/125* (2023.02); *H10K 50/854* (2023.02); *B82Y 20/00* (2013.01); *B82Y 40/00* (2013.01); *H10K 59/12* (2023.02); *H10K 59/877* (2023.02)

(58) Field of Classification Search
CPC .............................. C09D 11/101; C09D 11/50
See application file for complete search history.

(56) References Cited

U.S. PATENT DOCUMENTS

| | | | |
|---|---|---|---|
| 10,647,862 B2 | 5/2020 | Jeong et al. | |
| 11,569,448 B2 | 1/2023 | Shin et al. | |
| 12,203,003 B2 | 1/2025 | Harada et al. | |
| 2019/0227431 A1 | 7/2019 | Park et al. | |
| 2020/0017704 A1 | 1/2020 | Yang et al. | |
| 2020/0103709 A1 | 4/2020 | Madigan et al. | |
| 2021/0395533 A1* | 12/2021 | Harada ................ | C09K 11/664 |

FOREIGN PATENT DOCUMENTS

| | | | | |
|---|---|---|---|---|
| JP | 2020070443 A | * | 5/2020 | ............ B32B 17/10 |
| KR | 10-2017-1813432 B1 | | 12/2017 | |
| KR | 10-2019-0081474 A | | 7/2019 | |
| KR | 10-2019-0090114 A | | 8/2019 | |
| KR | 20190100851 A | | 8/2019 | |
| KR | 10-2020-0006388 A | | 1/2020 | |
| KR | 10-2020-0006652 A | | 1/2020 | |
| WO | 2020090566 A1 | | 5/2020 | |

OTHER PUBLICATIONS

English Abstract of KR 10-2019-0081474.
English Abstract of KR 10-2016-0119833.

* cited by examiner

*Primary Examiner* — Wenwen Cai
(74) *Attorney, Agent, or Firm* — CANTOR COLBURN LLP

(57) ABSTRACT

An ink composition including: a first multifunctional monomer including two or more photo-functional groups and a first carbon-containing chain; a second monofunctional monomer including one photo-functional group and a second carbon-containing chain; and semiconductor nanoparticles, wherein the first carbon-containing chain and the second carbon-containing chain each independently contain an alkyl group, and the number of carbons in the second carbon-containing chain is less than the number of carbons in the first carbon-containing chain. A film formed using the ink composition, and an electronic apparatus including the film.

16 Claims, 3 Drawing Sheets

INK COMPOSITION, FILM FORMED USING THE INK COMPOSITION, AND ELECTRONIC APPARATUS INCLUDING THE INK COMPOSITION

CROSS-REFERENCE TO RELATED APPLICATION

This application claims the benefit and priority under 35 U.S.C. § 119 to Korean Patent Application No. 10-2020-0185207, filed on Dec. 28, 2020, in the Korean Intellectual Property Office, the disclosure of which is herein incorporated by reference in its entirety.

BACKGROUND

1. Field

Various embodiments of the disclosure relate to an ink composition, a film formed using the ink composition, and an electronic apparatus including the ink composition.

2. Description of the Related Art

Light-emitting devices are devices that convert electrical energy into light energy. Examples of such light-emitting devices include organic light-emitting devices using organic materials for an emission layer, quantum dot light-emitting devices using quantum dots for an emission layer, and the like.

Light-emitting devices may be included in various electronic apparatuses, and may be included in, for example, electronic apparatuses such as display apparatuses. Recently, display apparatuses have been used in various fields for various purposes. In particular, display apparatuses are being developed in a thin and lightweight form. Moreover, in consideration of space utilization, display apparatuses that have at least some light emitting regions that are bent, rollable, or foldable, are being developed and commercialized. However, in the case of a flexible display device the substrate that forms part of the light-emitting region is flexible, and therefore, the processes of production or use previously applied to a glass substrate may not be applied in the same manner.

SUMMARY

One or more embodiments include an ink composition with an increased adhesive force, a film formed using the ink composition, and an electronic apparatus including the ink composition. However, these objectives are examples only, and do not limited the scope of the present disclosure.

Additional aspects will be set forth in part in the description that follows, and in part, will be apparent from the description, or may be learned by practice by a person of ordinary skill following a review of the presented embodiments of the disclosure.

According to one or more embodiments, an ink composition includes a first multifunctional monomer including two or more photo-functional groups and a first carbon-containing chain,
  a second monofunctional monomer including one photo-functional group and a second carbon-containing chain, and
  semiconductor nanoparticles,
  wherein the first carbon-containing chain and the second carbon-containing chain each independently contain an alkyl group, and the number of carbons in the second carbon-containing chain is less than the number of carbons in the first carbon-containing chain.

According to one or more embodiments, a film is formed using the ink composition described above.

According to one or more embodiments, an electronic apparatus includes the film described above and a light-emitting device, wherein the light-emitting device includes a first electrode, a second electrode, and an interlayer located between the first electrode and the second electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
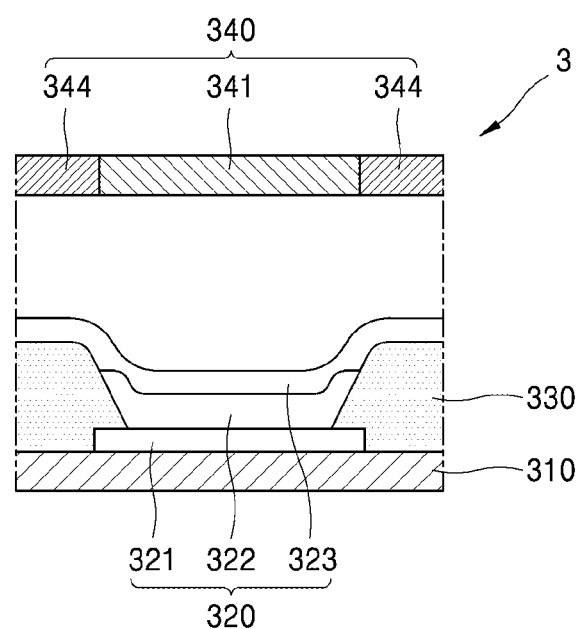
FIG. 1 is a schematic view of a light-emitting device according to an embodiment.

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein. Rather, these embodiments are provided so that this disclosure will be thorough and complete, and will fully convey the scope of the invention to those skilled in the art.

One or more embodiments of the disclosure will be described below in more detail with reference to the accompanying drawings. Those components that are the same or are in correspondence with each other are rendered the same reference numeral regardless of the figure number, and redundant explanations are omitted.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a layer, region, or component is referred to as being "on" or "onto" another layer, region, or component, it may be directly or indirectly formed on the other layer, region, or component. That is, for example, intervening layers, regions, or components may be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 10% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. Sizes of elements in the drawings may be exaggerated for convenience of explanation. In other words, because sizes and thicknesses of components in the drawings are arbitrarily illustrated for convenience of explanation, the following embodiments are not limited thereto.

In the present specification, the term "room temperature" refers to about 25° C.

Ink Composition

The ink composition comprises a first multifunctional monomer including two or more-functional groups and a first carbon-containing chain, a second monofunctional monomer including one photo-functional group and a second carbon-containing chain, and a semiconductor nanoparticle.

The first carbon-containing chain and the second carbon-containing chain may each independently include an alkyl group.

The number of carbons in the second carbon-containing chain may be less than the number of carbons in the first carbon-containing chain.

The first carbon-containing chain included in the first multifunctional monomer may include a $C_1$-$C_{10}$ alkylene group. For example, the first carbon-containing chain may be a methylene group, an ethylene group, a propylene group, a butylene group, a pentylene group, a hexylene group, a heptylene group, an octylene group, a nonylene group, or a decylene group.

The second carbon-containing chain included in the second monofunctional monomer may include a $C_1$-$C_5$ alkyl group. In an embodiment, the second carbon-containing chain may be a methane group, an ethane group, a propane group, a butane group, or a pentane group.

In an embodiment, the photo-functional groups of the first monomer and second monomer may be the same or different and each is independently a substituted or unsubstituted acrylate, or a substituted or unsubstituted methacrylate.

In an embodiment, the first multifunctional monomer may be represented by Formula 1:

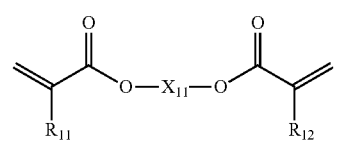

Formula 1 wherein, in Formula 1, $R_{11}$ and $R_{12}$ may each independently be hydrogen or a methyl group;

$X_{11}$ may be: a $C_1$-$C_{10}$ alkylene group; or a $C_1$-$C_7$ alkylene group substituted with deuterium, a hydroxy group, a $C_1$-$C_3$ alkyl group, an acrylate group, or a methacrylate group.

In an embodiment, the first monomer may include ethylene glycol diacrylate, ethylene glycol dimethacrylate, propylene glycol diacrylate, propylene glycol dimethacrylate, neopentyl glycol diacrylate, neopentyl glycol dimethacrylate, 1,3-butanediol diacrylate, 1,3-butanediol dimethacrylate, 1,4-butanediol diacrylate, 1,4-butanediol dimethacrylate, 1,6-hexanediol diacrylate, 1,6-hexanediol dimethacrylate, trimethylolpropane triacrylate, trimethylolpropane trimethacrylate, or any combination thereof.

In an embodiment, the second monofunctional monomer may be represented by Formula 2:

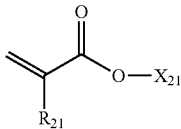

Formula 2 wherein, in Formula 2, $R_{21}$ may be hydrogen or a methyl group;

$X_{21}$ may be: a $C_1$-$C_5$ alkyl group; a $C_1$-$C_3$ alkyl group substituted with deuterium, a hydroxy group, a $C_1$-$C_2$ alkyl group, an acrylate group, or a methacrylate group.

In an embodiment, the second monomer may include methyl acrylate, methyl methacrylate, ethyl acrylate, ethyl methacrylate, n-butyl acrylate, n-butyl methacrylate, iso-butyl acrylate, iso-butyl methacrylate, or any combination thereof.

In an embodiment, the first monomer may be 1,6-hexanediol diacrylate, and the second monomer may be ethyl acrylate or ethyl methacrylate.

An amount of the first monomer may be in a range of about 10 parts by weight to about 50 parts by weight, about 13 parts by weight to about 45 parts by weight, or about 15 parts by weight to about 40 parts by weight, based on 100 parts by weight of the ink composition.

An amount of the second monomer may be in a range of about 1 part by weight to about 40 parts by weight, about 3 parts by weight to about 30 parts by weight, or about 5 parts by weight to about 25 parts by weight, based on 100 parts by weight of the ink composition.

When the amounts of the first monomer and the second monomer are within these ranges, the viscosity of the ink composition may be maintained essentially constant or at an ink-workable value, and the curing degree and the cross-linking degree may be improved during curing.

An amount of the second monomer may be from about 20 parts by weight to about 100 parts by weight based on 100 parts by weight of the first monomer.

When the ratio of the first monomer to the second monomer is within these ranges, the adhesive force and peel-off force of the ink composition may be further improved.

In an embodiment, a third monofunctional monomer including one photo-functional group and a third carbon-containing chain may be further included in the composition, wherein the third carbon-containing chain includes an alkyl group, the number of carbons in the third carbon-containing chain may be less than the number of carbons in the first carbon-containing chain, and the second monomer and the third monomer may be different from each other.

In an embodiment, the third carbon-containing chain may be a $C_1$-$C_5$ alkyl group.

In an embodiment, the photo-functional group of the third monomer may be a substituted or unsubstituted acrylate or a substituted or unsubstituted methacrylate.

The photo-functional group of the second monomer may be an acrylate, and the photo-functional group of the third monomer may be a methacrylate.

In an embodiment, the third monomer may be represented by Formula 3:

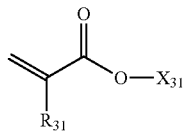

Formula 3 wherein, in Formula 3, $R_{31}$ may be hydrogen or a methyl group; and $X_{31}$ may be: a $C_1$-$C_5$ alkyl group, or a $C_1$-$C_3$ alkyl group substituted with deuterium, a hydroxy group, a $C_1$-$C_2$ alkyl group, an acrylate group, or a (meth)acrylate group.

In an embodiment, the third monomer may include methyl acrylate, methyl methacrylate, ethyl acrylate, ethyl methacrylate, n-butyl acrylate, n-butyl methacrylate, iso-butyl acrylate, iso-butyl methacrylate, or any combination thereof.

In an embodiment, i) the first monomer is 1,6-hexanediol diacrylate, the second monomer is ethyl acrylate, and the third monomer is ethyl methacrylate; or ii) the first monomer may be 1,6-hexanediol diacrylate, the second monomer may be ethyl methacrylate, and the third monomer may be ethyl acrylate.

In an embodiment, an amount of the third monomer may be in a range of about 1 part by weight to about 40 parts by weight, for example, about 3 parts by weight to about 30 parts by weight, or about 5 parts by weight to about 25 parts by weight, based on 100 parts by weight of the ink composition.

When the amount of the third monomer is within these ranges, the viscosity of the ink composition may be maintained essentially constant or at an ink-workable value, and the curing degree and the cross-linking degree may be improved during curing.

An amount of the third monomer may be from about 20 parts by weight to about 100 parts by weight based on 100 parts by weight of the first monomer.

When the ratio of the first monomer to the third monomer is within these ranges, the adhesive force and peel-off force of the ink composition may be further improved.

In an embodiment, the ink composition may include less than 2 parts by weight of a solvent based on 100 parts by weight of the ink composition. In an embodiment, the ink composition may substantially not include the solvent. For example, the ink composition may be a solvent-free ink composition.

Due to the absence of the solvent in the ink composition, the ink composition may be suitable for use in an inkjet process. In contrast, in the case where the ink composition includes a small amount of solvent, the inkjet process needs to take into consideration a target level of the film thickness after drying, e.g., about five times the thickness than if the solvent-free ink composition is used. Accordingly, in some instances, an inkjet process may not be suitable for forming a film because color admixture of adjacent pixels may more readily occur when forming a color conversion member.

The ink composition may further include a photopolymerization initiator. The photopolymerization initiator is used to promote polymerization of a photopolymerizable monomer and may improve or optimize curing times. A known photopolymerization initiator may be used herein without particular limitation.

In an embodiment, the photopolymerization initiator may include an oxime-based compound, an acetophenone-based compound, a thioxanthone-based compound, a benzophenone-based compound, or any combination thereof.

According to an embodiment, the oxime-based compound may include 1,2-octanedione, 2-dimethylamino-2-(4-methylbenzyl)-1-(4-morpholine-4-yl-phenyl)-butane-1-one, 1-(4-phenylsulfanylphenyl)-butane-1,2-dione-2-oxime-O-benzoate, 1-(4-phenylsulfanylphenyl)-octane-1,2-dione-2-oxime-O-benzoate, 1-(4-phenylsulfanylphenyl)-octane-1-onoxime-O-acetate, 1-(4-phenylsulfanylphenyl)-butane-1-one-2-oxime-O-acetate, 2-(O-benzoyloxime)-1-[4-(phenylthio)phenyl]-1,2-octanedione, 1-(O-acetyloxime)-1-[9-ethyl-6-(2-methylbenzoyl)-9H-carbazole-3-yl]ethanone, O-ethoxycarbonyl-α-oxyamino-1-phenylpropane-1-one, or any combination thereof.

According to an embodiment, the acetophenone-based compound may include 4-phenoxy dichloroacetophenone, 4-t-butyl dichloroacetophenone, 4-t-butyl trichloroacetophenone, 2,2-diethoxyacetophenone, 2-hydroxy-2-methyl-1-phenyl-propane-1-one, 1-(4-isopropylphenyl)-2-hydroxy-2-methyl-propane-1-one, 1-(4-dodecylphenyl)-2-hydroxy-2-methylpropane-1-one, 4-(2-hydroxyethoxy)-phenyl-(2-hydroxy-2-propyl)ketone, 1-hydroxy cyclohexyl phenyl ketone, 2-methyl-1-[4-(methylthio)phenyl]-2-morpholinopropane-1-one, or any combination thereof.

In an embodiment, the thioxanthone-based compound may include thioxanthone, 2-chlorothioxanthone, 2-methylthioxanthone, isopropyl thioxanthone, 2,4-diethyl thioxanthone, and 2,4-diisopropyl thioxanthone, or any combination thereof.

In an embodiment, the benzophenone-based compound may include benzophenone, benzoyl benzoic acid, benzoyl benzoic acid methyl ester, 4-phenyl benzophenone, hydroxy benzophenone, 4-benzoyl-4'-methyl diphenyl sulfide, and 3,3'-dimethyl-4-methoxy benzophenone, or any combination thereof.

In an embodiment, the amount of the photopolymerization initiator may be in a range of about 0.01 parts by weight to about 20 parts by weight, for example, about 0.1 parts by weight to about 5 parts by weight. In an embodiment, the amount of the photopolymerization initiator may be from about 0.5 parts by weight to about 2 parts by weight, based on 100 parts by weight of the ink composition.

The ink composition may further include a scatterer.

In an embodiment, the scatterer may include a plurality of inorganic particles having different particle diameters.

In an embodiment, the scatterer may include $BiFeO_3$, $Fe_2O_3$, $WO_3$, $TiO_2$, SiC, $BaTiO_3$, ZnO, $ZrO_2$, ZrO, $Ta_2O_5$, $MoO_3$, $TeO_2$, $Nb_2O_5$, $Fe_3O_4$, $V_2O_5$, $Cu_2O$, BP, $Al_2O_3$, $In_2O_3$, $SnO_2$, $Sb_2O_3$, and ITO, or any combination thereof.

In an embodiment, the plurality of inorganic particles may have an average particle diameter of about 20 nanometers (nm) to about 2 micrometers (μm).

In an embodiment, the inorganic particles may have a refractive index of greater than 1.5.

As described above, the scatterer may include inorganic particles having various particle diameters, such that a refractive index may be increased. For example, a difference in refractive index between the scatterer and the surrounding polymer of the cured ink composition may be increased, and thus, a total reflection of blue light may more likely occur, and thereby, increasing the absorption rate of blue light and improvement in light conversion efficiency.

In an embodiment, the scatterer may include inorganic particles having a refractive index greater than 1.5 and an average particle diameter of about 100 nm to about 300 nm.

In an embodiment, the scatterer may include $TiO_2$.

In an embodiment, the amount of the scatterer may be in a range of about 1 part by weight to about 20 parts by weight, for example, about 1 part by weight to about 10 parts by weight, or about 2 parts by weight to about 8 parts by weight, based on 100 parts by weight of the ink composition.

An ink composition according to an embodiment includes semiconductor nanoparticles.

The semiconductor nanoparticles may include, for example, quantum dots, perovskite, or the like, and may include any material that emits light of different emission wavelengths according to a size of a crystal. The type of compound that make up the semiconductor nanoparticles is not particularly limited. The quantum dots and perovskite are described as follows.

In an embodiment, the semiconductor nanoparticle may include Group III-VI semiconductor compound; Group II-VI semiconductor compound; Group III-V semiconductor compound; Group III-VI semiconductor compound; Group semiconductor compound; Group IV-VI semiconductor compound; Group IV element or compound; or any combination thereof.

In an embodiment, the semiconductor nanoparticle has a core-shell structure including a core and a shell covering at least a portion of the core; and, the core may include: a Group II-VI semiconductor compound; a Group III-V semiconductor compound; a Group III-VI semiconductor compound; a Group semiconductor compound; a Group IV-VI semiconductor compound; a Group IV element or compound, or a combination thereof, and the shell may include an oxide of a metal, a metalloid, or a non-metal, a semiconductor compound, or a combination thereof.

In an embodiment, the core may include a Group II-VI semiconductor compound; Group III-V semiconductor compound; or any combination thereof, and the shell may include a Group III-V semiconductor compound or any combination thereof.

Here, the Group II-VI semiconductor compound, the Group III-V semiconductor compound, the Group III-VI semiconductor compound, the Group semiconductor compound, the Group IV-VI semiconductor compound, the Group IV element or compound, the oxide of metal, metalloid, or non-metal, and the semiconductor compound will be described in detail.

In an embodiment, the amount of the semiconductor nanoparticles may be 20 parts by weight to 60 parts by weight, specifically 25 parts by weight to 50 parts by weight, and more specifically 30 parts by weight to 45 parts by weight, based on 100 parts by weight of the ink composition.

In an embodiment, the ink composition may further include various additives, and thus, the ink composition may experience various modifications.

The ink composition may have a viscosity of about 1 centiPoise (cP) to about 25 cP, for example, about 10 cP to about 15 cP at room temperature. The ink composition satisfying the viscosity range may be suitable for manufacturing a film by using a solution process, for example, an inkjet printing method.

The ink composition may have a surface tension of about 10 dynes/cm to about 40 dynes/cm at room temperature. The ink composition satisfying the viscosity range may be suitable for manufacturing a film by using a solution process, for example, an inkjet printing method.

Film

Hereinafter, a film formed using the ink composition will be described. The film may be formed by photo-curing the ink composition. That is, the film may include a photo-cured product of the ink composition.

Another aspect of the present disclosure provides a method of forming the film including: applying the ink composition on a substrate; and exposing the applied ink composition to light to promote crosslinking of the ink composition.

In an embodiment, the applying of the ink composition to a substrate may be performed by a solution process. The solution process may be an inkjet printing method, a spin coating method, a slit coating method, a drop casting method, a casting method, a gravure coating method, a bar coating method, a roll coating method, a dip coating method, a spray coating method, a screen coating method, a flexographic printing method, an offset printing method, or a nozzle printing method, but is not limited thereto.

In an embodiment, the solution process may be performed by an inkjet printing method, but is not limited thereto. For example, the ink composition may be applied in the form of micro droplets on a substrate by an inkjet printing method.

Because the ink composition has excellent inkjet ejection stability, the ink composition may be suitably used for an inkjet printing method.

The inkjet printing method may use an inkjet printer having an inkjet head mounted with a piezo-type nozzle that applies pressure according to a voltage.

In an embodiment, the ink composition is ejected from a nozzle of an inkjet head onto a substrate.

In this case, the ejection amount of the ink composition may be from about 1 picoliter per second (pL/s) to about 50 pL/s, for example, from about 1 pL/s to about 30 pL/s. In an embodiment, and the ejection amount of the ink composition may be from about 1 pL/s to about 20 pL/s.

The aperture diameter of the inkjet head may be about 5 μm to about 50 μm, for example, about 10 μm to about 30 μm, in order to minimize clogging of the nozzle and improve the degree of precision of ejection, but is not limited thereto.

The ejection pressure of the inkjet head may from about 1000 $s^{-1}$ to about 10000 $s^{-1}$ based on the shear rate, but is not limited thereto.

The temperature at the time of ejection may be, but is not limited to, about 10° C. to about 50° C., about 15° C. to about 40° C., about 15° C. to about 30° C., or about 20° C. to about 25° C., in terms of suppressing crystallization of a material included in the ink composition.

In an embodiment, the exposing and crosslinking of the polymer may be performed by irradiating light having an intensity of about 1 Watt (W) to about 500 W and a wavelength of about 250 nm to about 350 nm, but embodiments are not limited thereto.

In an embodiment, the substrate may be an electrode of the light-emitting device, but embodiments of the present disclosure are not limited thereto.

In an embodiment, the ink composition may be applied on the electrode to form a film having a thickness of about 10 nm to about 100 nm.

Electronic Apparatus

Hereinafter, an electronic apparatus including the above-described film will be described. The electronic apparatus may include a film and a light-emitting device including a first electrode, a second electrode, and an interlayer disposed between the first electrode and the second electrode.

In an embodiment, the electronic apparatus may include a liquid crystal display apparatus (LCD), an organic light-emitting display apparatus (OLED), or an inorganic light-emitting display apparatus.

For example, when the electronic apparatus includes a liquid crystal display apparatus (LCD), he light-emitting device may act as a light source, and the film may be positioned external to the light-emitting device and the liquid crystal to act as a color conversion member.

In an embodiment, where the interlayer of the light-emitting device includes an emission layer and the emission layer includes an organic material, the electronic apparatus may be an organic light-emitting display apparatus. The light-emitting device may act as a light source, and the film may be positioned external the light-emitting device to act as a color conversion member.

In an embodiment, in the case where the interlayer of the light-emitting device includes an emission layer and the emission layer includes an inorganic material, for example, a film described herein, the electronic apparatus may be an inorganic light-emitting display apparatus.

The electronic apparatus may further include a thin-film transistor in addition to the light-emitting device as described above. The thin-film transistor may include a source electrode, a drain electrode, and an activation layer, wherein the source electrode or the drain electrode may be electrically connected to the first electrode or the second electrode of the light-emitting device.

The thin-film transistor may further include a gate electrode, a gate insulating film, activation layer, etc.

The activation layer may include crystalline silicon, amorphous silicon, organic semiconductor, oxide semiconductor, or the like.

The electronic apparatus may further include a sealing portion for sealing the light-emitting device. The sealing portion would be transparent thereby allowing light to be emitted from the light-emitting device, while simultaneously preventing ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion according to use of the electronic apparatus. Examples of the functional layers include a color filter, a color conversion layer, a touch screen layer, and a polarizing layer. The touch screen layer may be a pressure-sensitive touch screen layer, a capacitive touch screen layer, or an infrared touch screen layer.

The electronic apparatus 3 according to an embodiment is described with reference to FIG. 1. The electronic apparatus 3 includes a light-emitting device 320 and a first substrate 340.

According to an embodiment, film may be included external from the light-emitting device 320 (i.e., on a first electrode and/or a second electrode). For example, the film may be included in the first substrate 340 external from the light-emitting device 320. Accordingly, the first substrate 340 may function as a color conversion member, and the light-emitting device 320 may function as a light source.

The light-emitting device 320 may include a first electrode 321, a second electrode 323, and an interlayer 322 located between the first electrode 321 and the second electrode 323. The electronic apparatus 3 may be an organic light-emitting display apparatus. Accordingly, the light-emitting device 320 may include an organic emission layer in the interlayer 322. A pixel-defining layer 330 may be located on the first electrode 321. The pixel-defining layer 330 provides a region of the first electrode 321 in which an interlayer 322 may be arranged in the region.

In an embodiment, a region 341 of the first substrate 340 may include the film. In this case, the first substrate 340 may be positioned proximate to a surface from which light is emitted from the light-emitting device 320. That is, the film may be located at a distance from the light-emitting device 320 and proximate to a surface from which light is emitted from the light-emitting device 320.

The film may absorb light of a first color an emit light of a second color. Accordingly, the first substrate 340 may be designed to absorb the first-color light and emit the second-color light in a broad wavelength range of the visible spectrum.

In an embodiment, the first substrate 340 may further include a scatterer.

In an embodiment, the first substrate 340 may further include another region (not shown) different from the region 341, and the other region may not include the film, and the other region may transmit light of a first color from a light-emitting device 320. In detail, only the region 341 may include the film, and the other region may include the scatterer.

In an embodiment, the first substrate 340 may further include a light-shielding pattern 344 between the region 341 and the other region.

In an embodiment, the electronic apparatus 3 may further include a second substrate 310. The electronic apparatus 4 according to an embodiment will be described with reference to FIG. 2. The electronic apparatus 4 includes a first substrate 410 and a light-emitting device 420. The light-emitting device 420 includes a first electrode 421, a second electrode 423, and an interlayer 422 disposed between the first electrode 421 and the second electrode 423.

The film may be included in the interlayer 422, for example, in the emission layer included in the interlayer 422.

When an electric field is applied between the first electrode 421 and the second electrode 423, the film may emit visible light. Accordingly, the light-emitting device 420 may be designed to emit light in a broad wavelength range of the visible spectrum.

The interlayer 422 may further include an auxiliary layer (not shown) between the emission layer and the first electrode and/or between the emission layer and the second electrode. The auxiliary layer may directly contact the emission layer. The auxiliary layer may improve thin film characteristics of the emission layer.

The interlayer 422 may further include a first charge transport region (not shown) between the emission layer and the first electrode and/or a second charge transport region between the emission layer and the second electrode.

Figure 3:
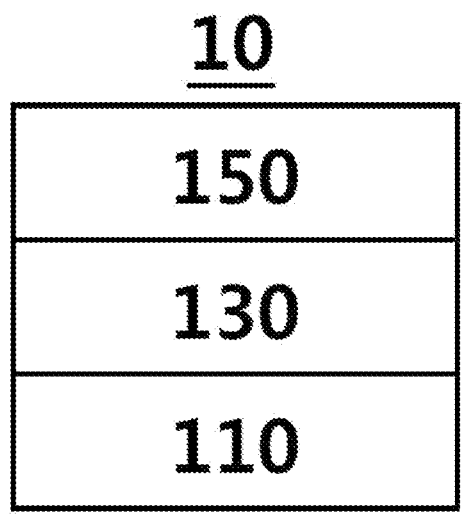
FIG. 3 is a schematic view of a light-emitting device according to an embodiment.

FIG. 3 is a schematic cross-sectional view of a light-emitting device 10. The light-emitting device 10 includes a first electrode 110, an interlayer 130, and a second electrode 150. A structure and a manufacturing method of the light-emitting device 10 will be described with reference to FIG. 3.

First Electrode 110

In FIG. 3, a substrate (not shown) may be additionally positioned under the first electrode 110 or above the second electrode 150. As the substrate, a glass substrate or a plastic substrate may be used. In an embodiment, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed, for example, by depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. For example, the first electrode may include indium tin oxide (ITO), indium zinc oxide (IZO), tin oxide ($SnO_2$), zinc oxide (ZnO), magnesium (Mg), silver (Ag), aluminum (Al), aluminum-lithium (Al—Li), calcium (Ca), magnesium-indium (Mg—In), magnesium-silver (Mg—Ag), or any combination thereof.

In an embodiment, when the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode.

The first electrode 110 may be a single-layered structure or a multilayer structure including a plurality of layers. For example, the first electrode 110 may have a three-layered structure of ITO/Ag/ITO.

Interlayer 130

The interlayer 130 may be disposed on the first electrode 110. The interlayer 130 may include an emission layer. The interlayer 130 refers to a single layer and/or a plurality of layers located between the first electrode 110 and the second electrode 150 in the light-emitting device 10. The material included in the interlayer 130 may be an organic material and/or an inorganic material.

The interlayer 130 may further include a hole-transporting region placed between the first electrode 110 and the emission layer and an electron-transporting region placed between the emission layer and the second electrode 150.

The interlayer 130 may further include metal-containing compounds such as organometallic compounds, inorganic materials such as quantum dots, and the like, in addition to various organic materials.

In one or more embodiments, the interlayer 130 may include: i) two or more emitting units sequentially stacked between the first electrode 110 and the second electrode 150; and ii) a charge generation layer located between the two emitting units. When the interlayer 130 includes the emitting unit and the charge generation layer as described above, the light-emitting device 10 may be a tandem or stacked light-emitting device.

The hole-transporting region may have; i) a single-layered structure consisting of a single material, ii) a single-layered structure consisting of a plurality of different materials, or iii) a multi-layered structure including a plurality of layers including different materials. The hole-transporting region may include a hole injection layer, a hole-transporting layer, an emission auxiliary layer, an electron-blocking layer, or any combination thereof. For example, the hole-transporting region may have a multi-layered structure including a hole injection layer/hole-transporting layer structure, a hole injection layer/hole-transporting layer/emission auxiliary layer structure, a hole injection layer/emission auxiliary layer structure, a hole-transporting layer/emission auxiliary layer structure, or a hole injection layer/hole-transporting layer/electron-blocking layer structure, wherein, in each structure, layers are stacked sequentially from the first electrode 110.

The hole-transporting region may include a compound represented by Formula 201, a compound represented by Formula 202, or any combination thereof:

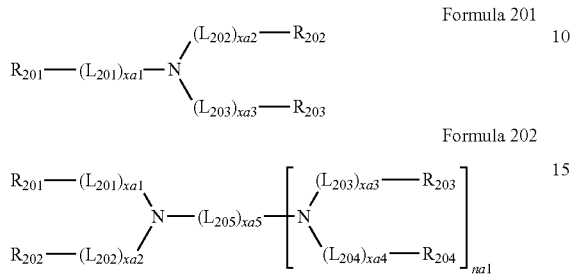

Formula 201

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In one or more embodiments, each of Formulae 201 and 202 may include at least one group represented by Formulae CY201 to CY217.

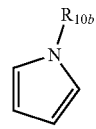

CY201

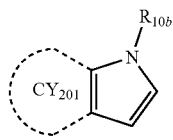

CY202

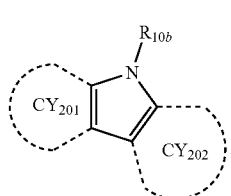

CY203

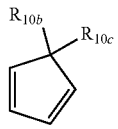

CY204

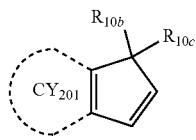

CY205

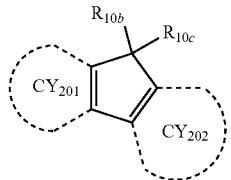

CY206

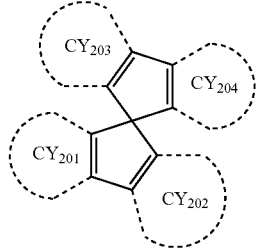

CY207

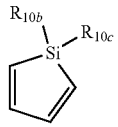

CY208

-continued

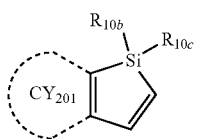

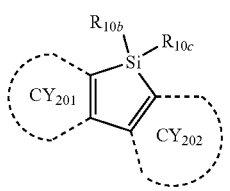

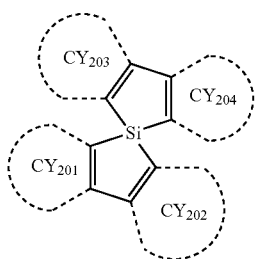

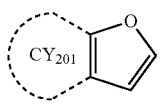

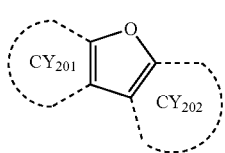

-continued

CY209

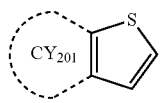

CY210

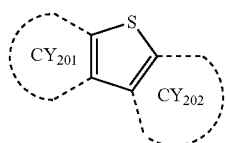

CY211

CY212

CY213

CY214

CY215

CY216

CY217

$R_{10b}$ and $R_{10c}$ in Formulae CY201 to CY217 are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one group represented by Formulae CY201 to CY203.

In one or more embodiments, Formula 201 may include at least one group represented by Formulae CY201 to CY203 and at least one group represented by Formulae CY204 to CY217.

In one or more embodiments, xa1 in Formula 201 is 1, $R_{201}$ is a group represented by one of Formulae CY201 to CY203, xa2 may be 0, and $R_{202}$ may be a group represented by one of Formulae CY204 to CY207.

In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203, and may include at least one of groups represented by Formulae CY204 to CY217.

In an embodiment, each of Formulae 201 and 202 may not include a group represented by one of Formulae CY201 to CY217.

In an embodiment, the hole-transporting region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

17 18
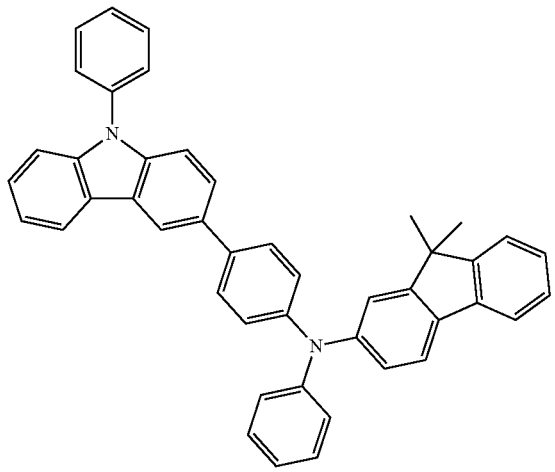
HT1
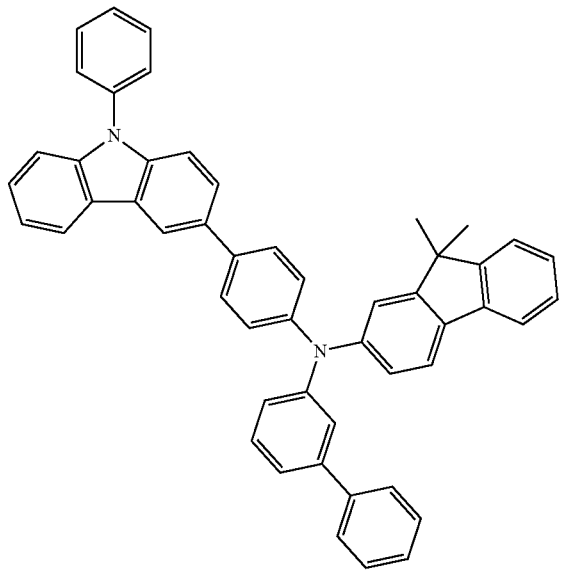
HT2
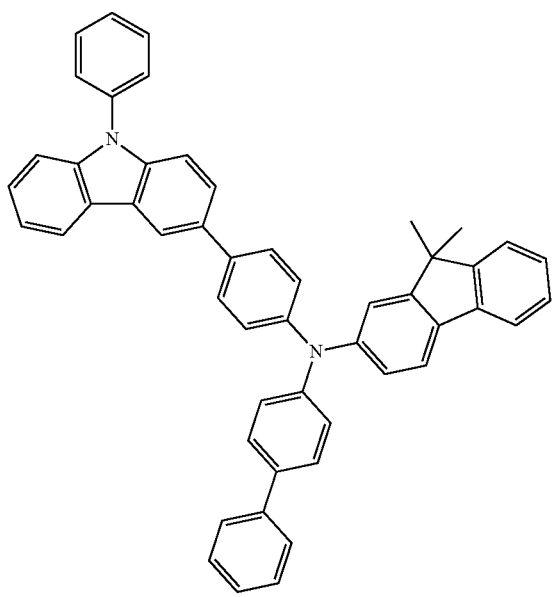
HT3
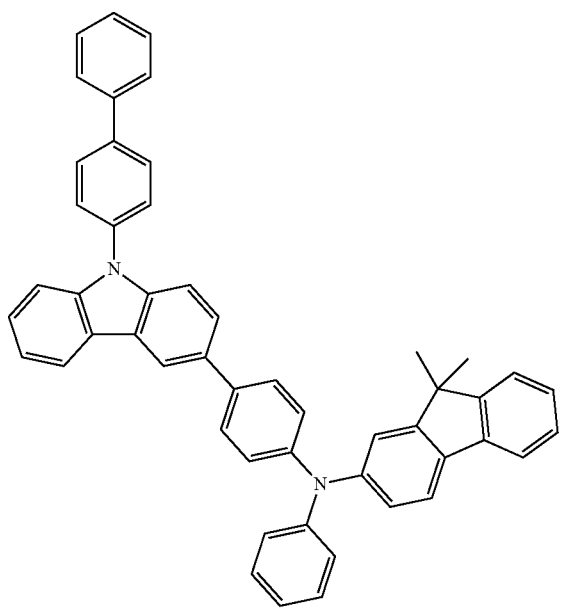
HT4

-continued
HT5
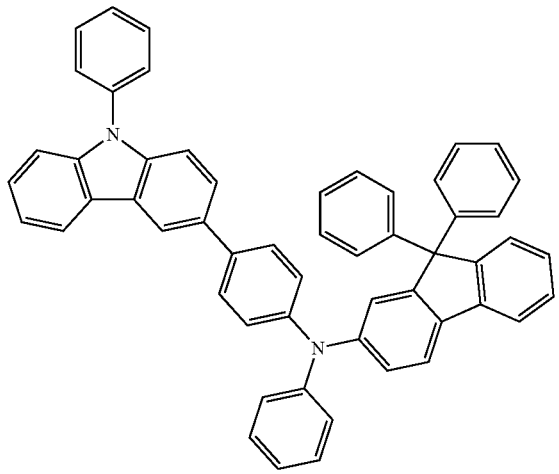
HT6
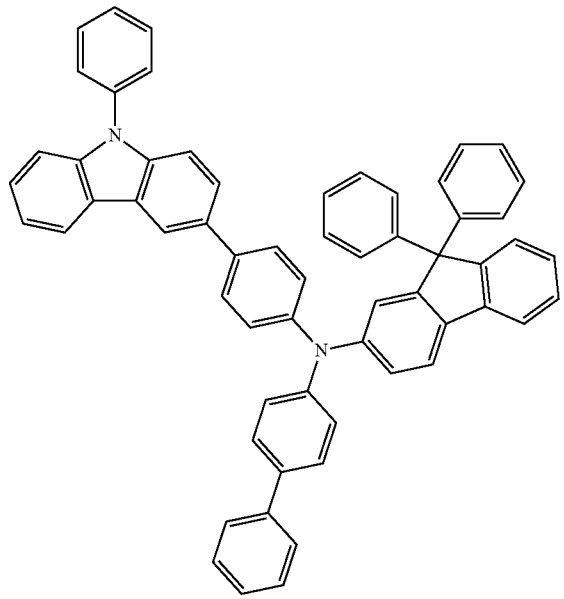
HT7
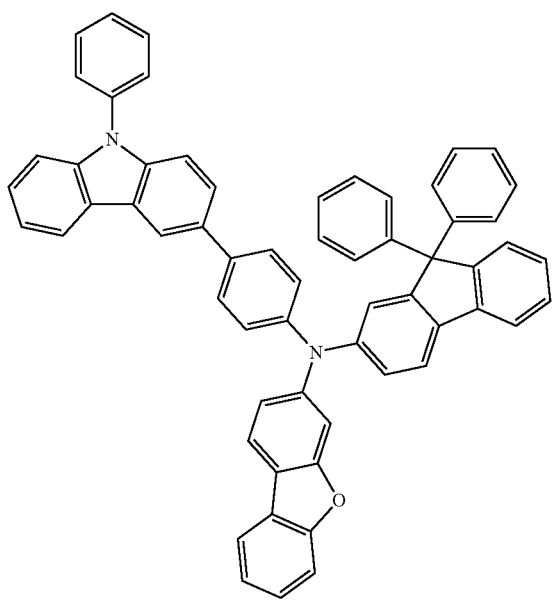
HT8
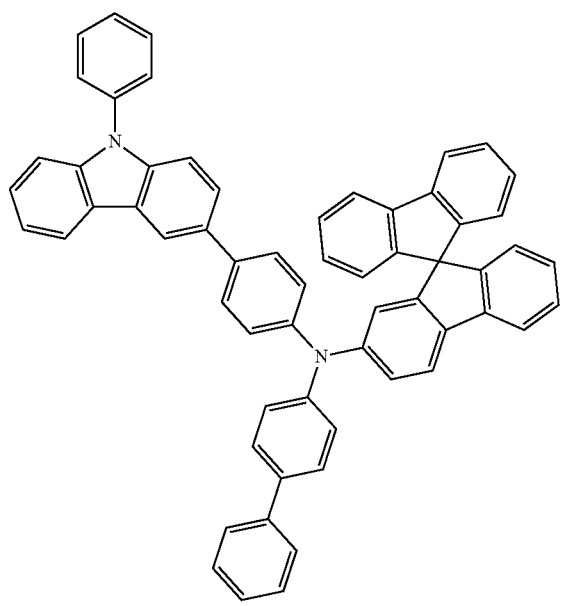

-continued
HT9
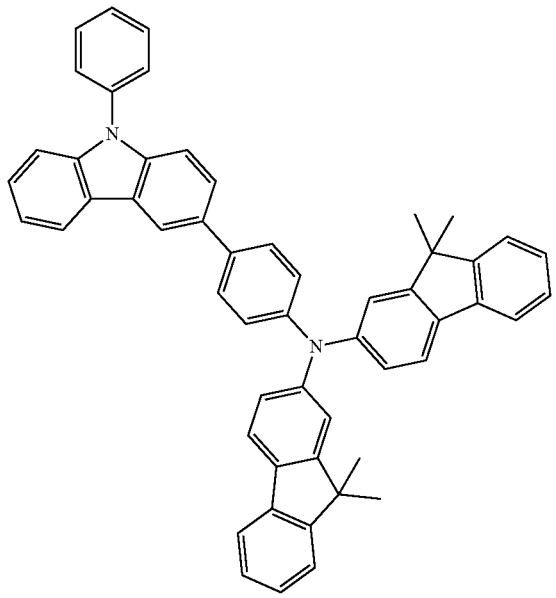
HT10
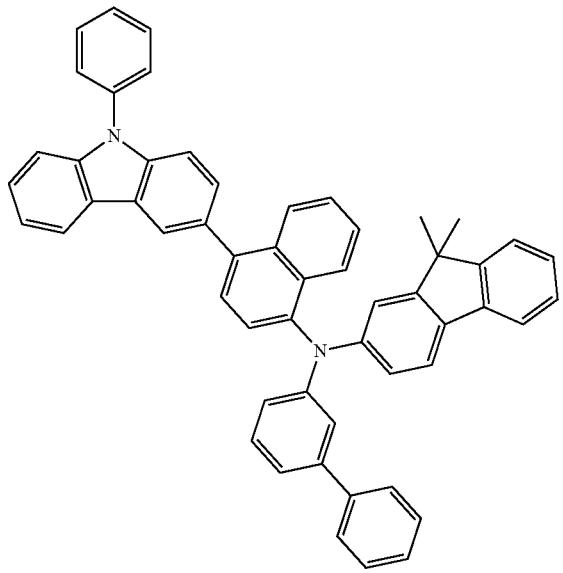
HT11
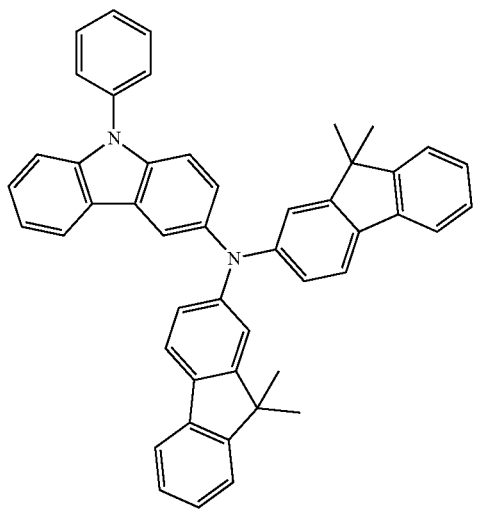
HT12
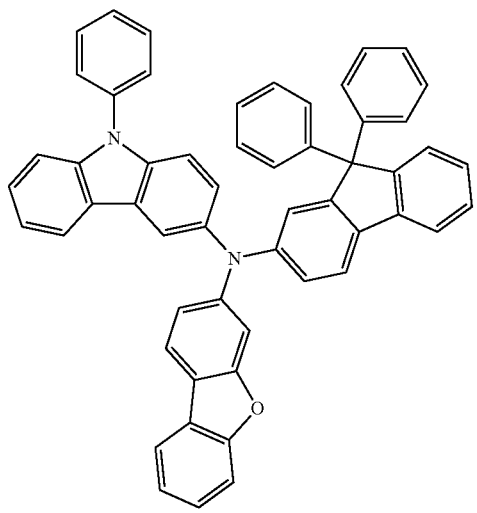

-continued
HT13
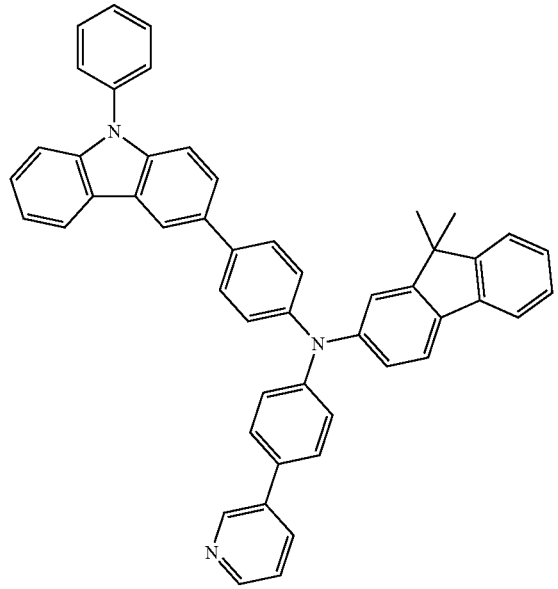
HT14
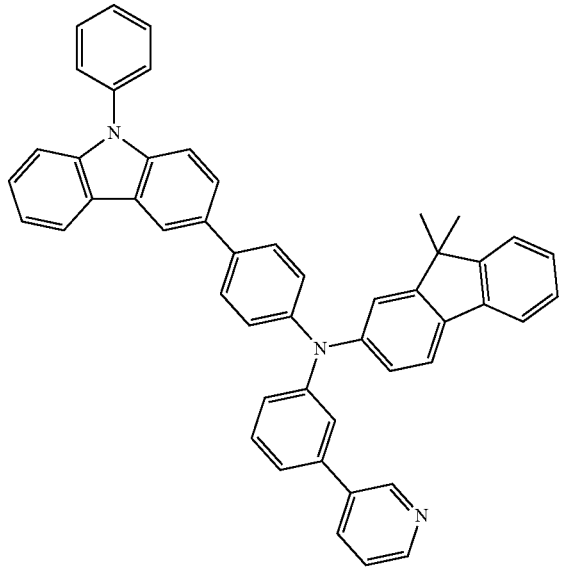
HT15
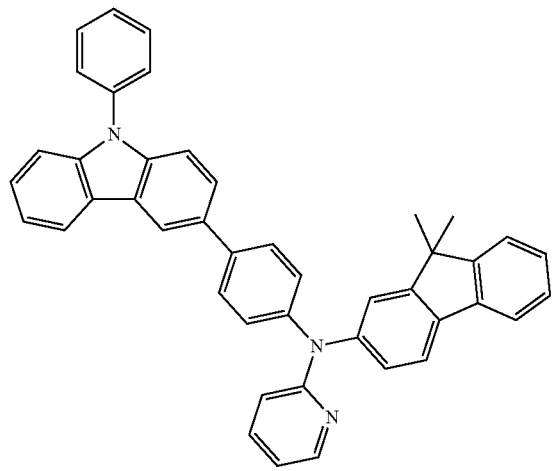
HT16
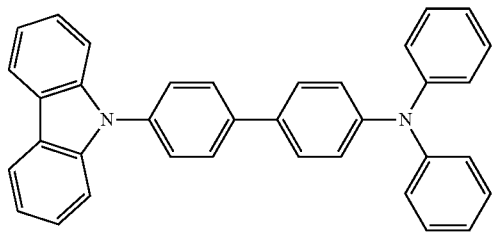
HT17
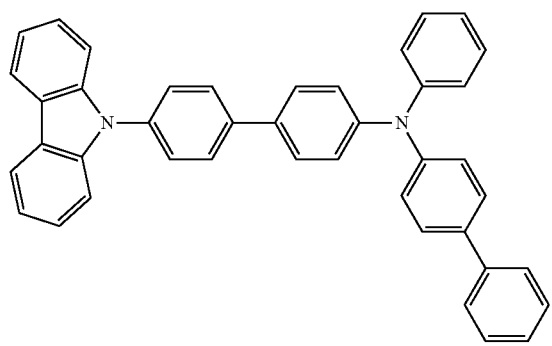
HT18
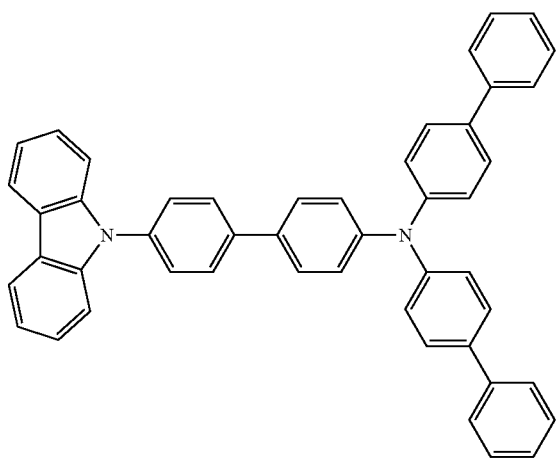

HT19
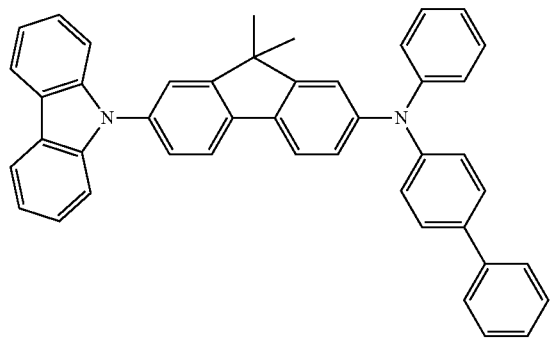
HT20
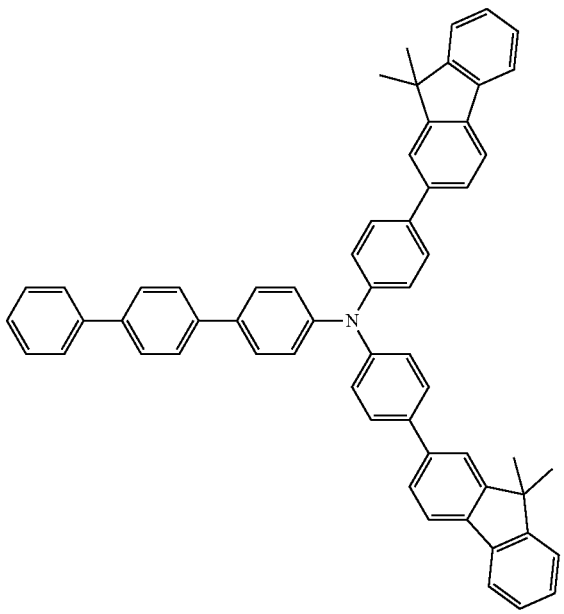
HT21
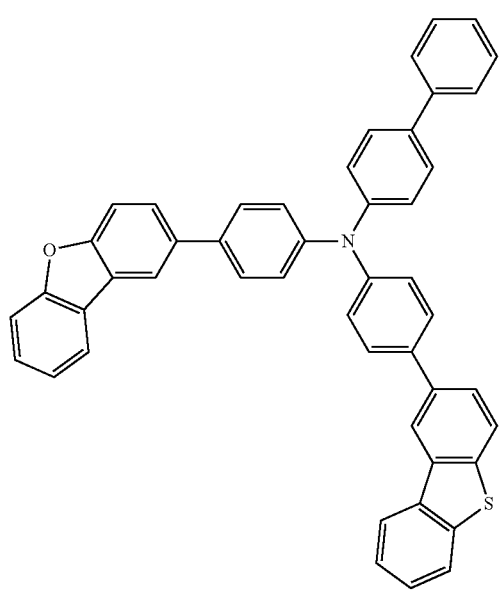
HT22
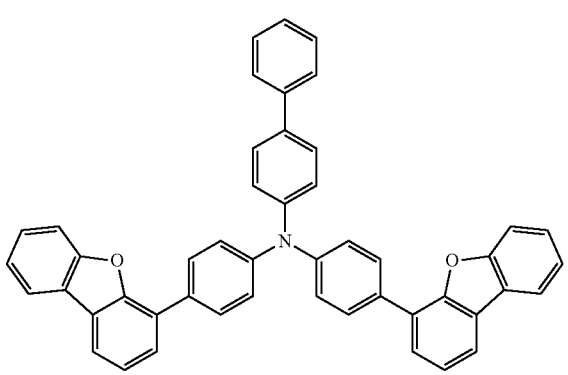

-continued
HT23
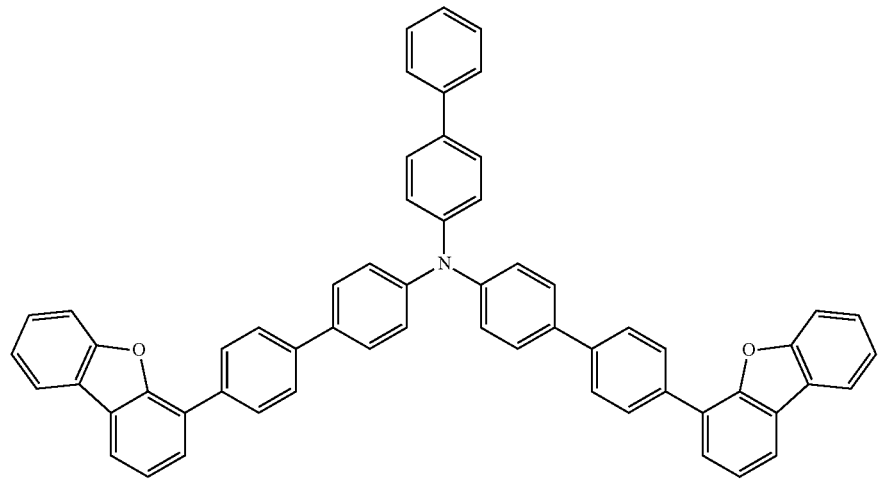
HT24
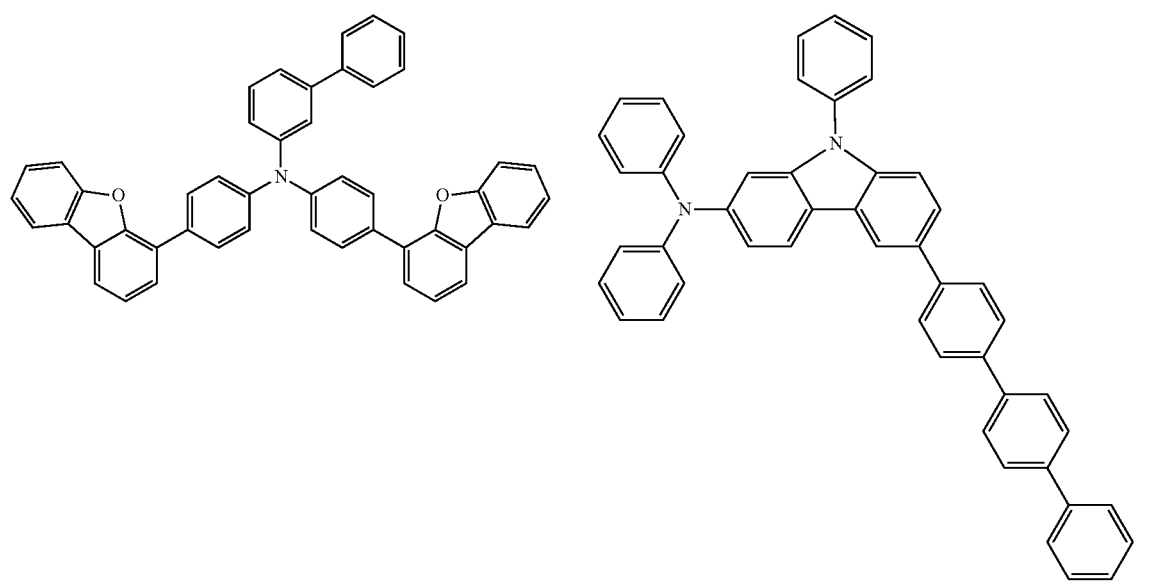
HT25
HT26
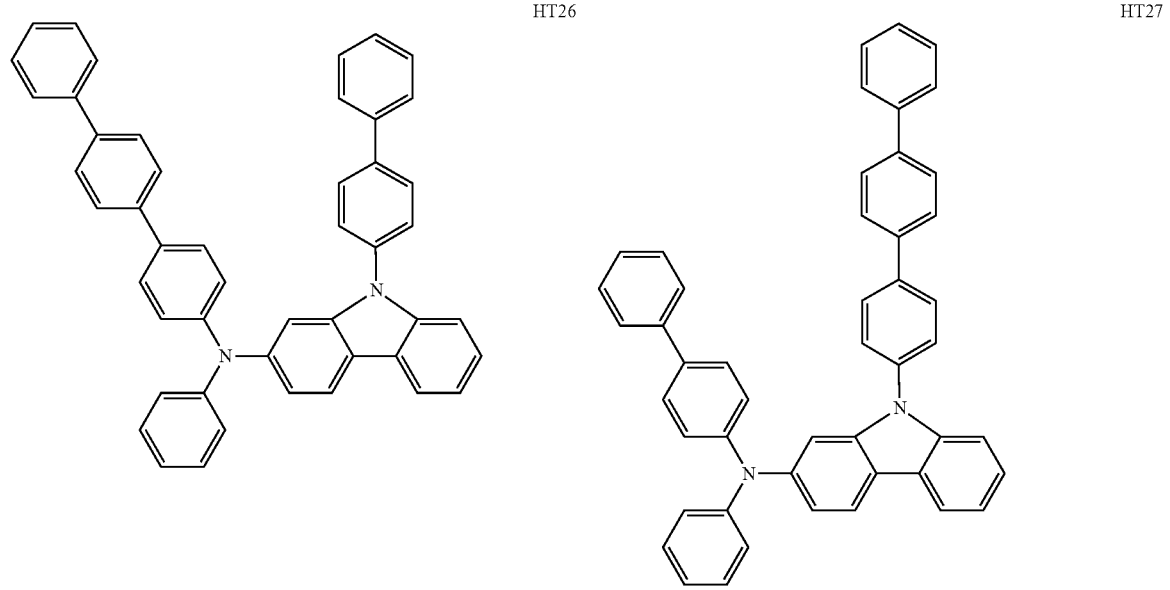
HT27

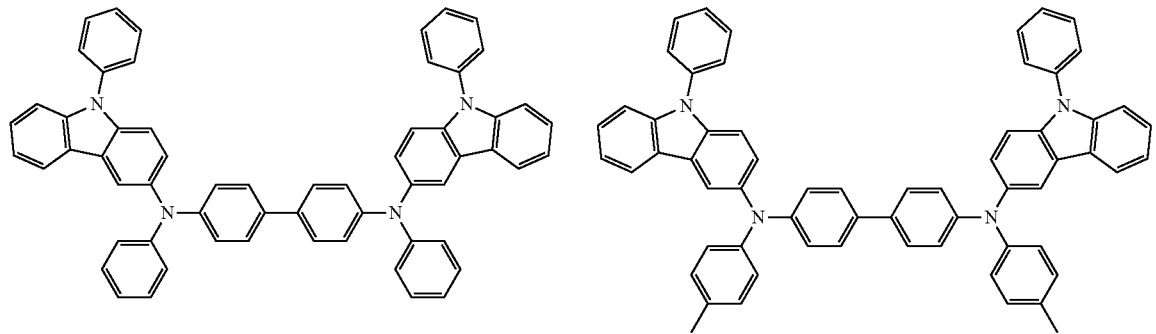
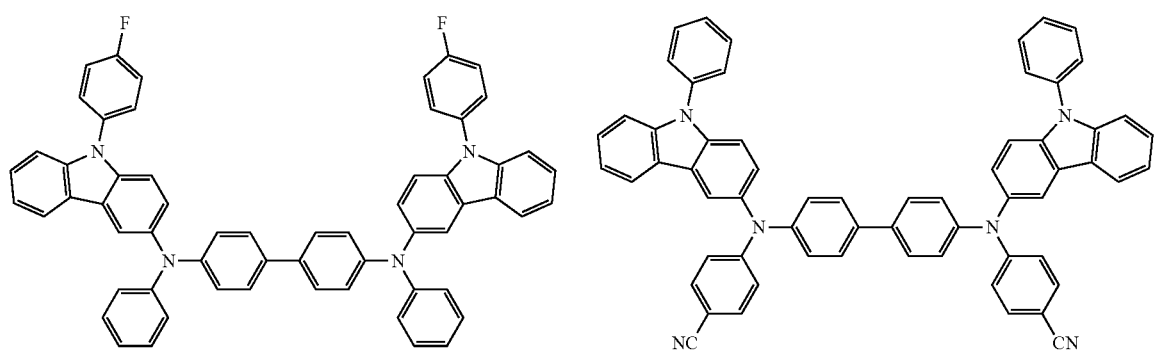
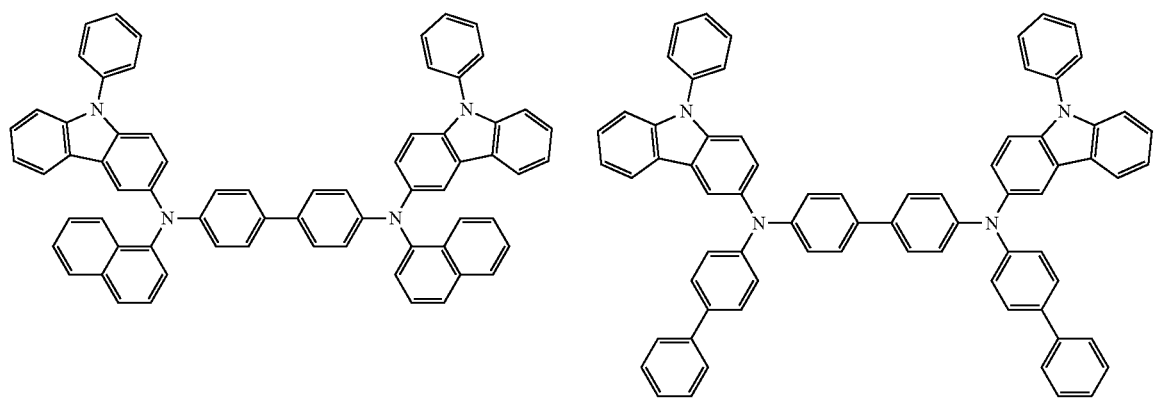

-continued
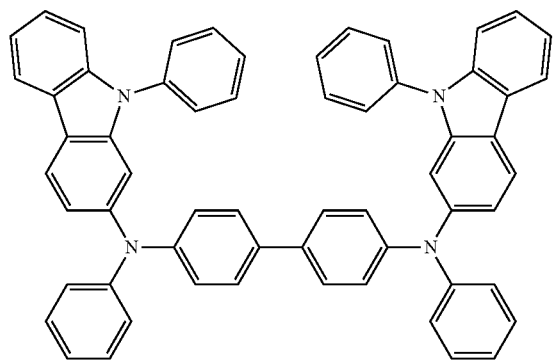
HT34
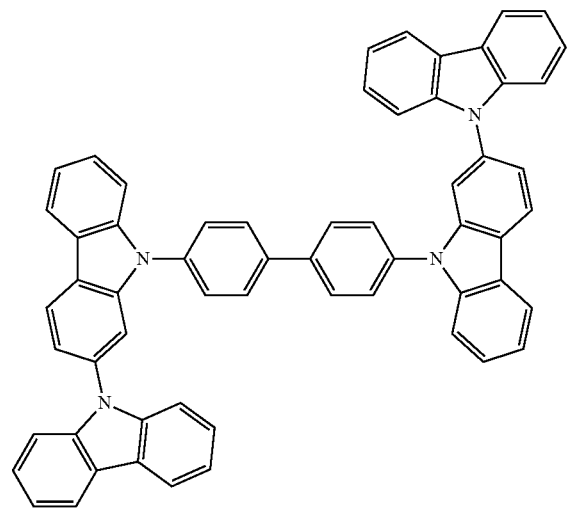
HT35
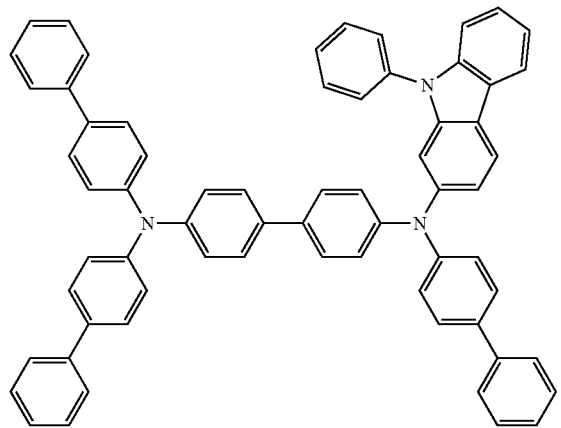
HT36
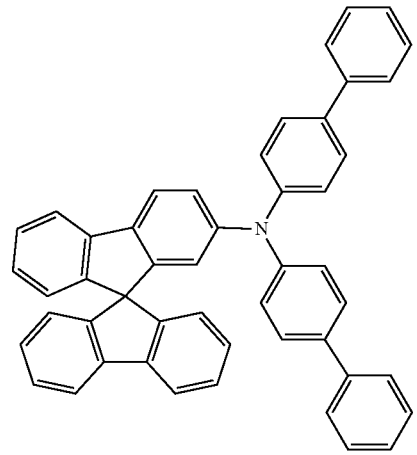
HT37
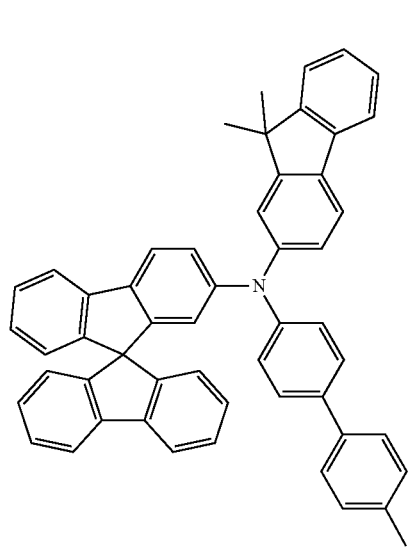
HT38
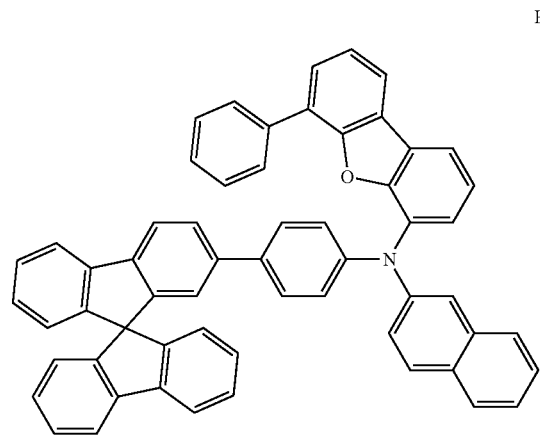
HT39

-continued
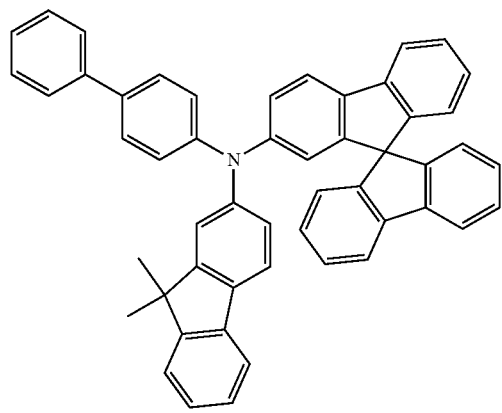
HT40
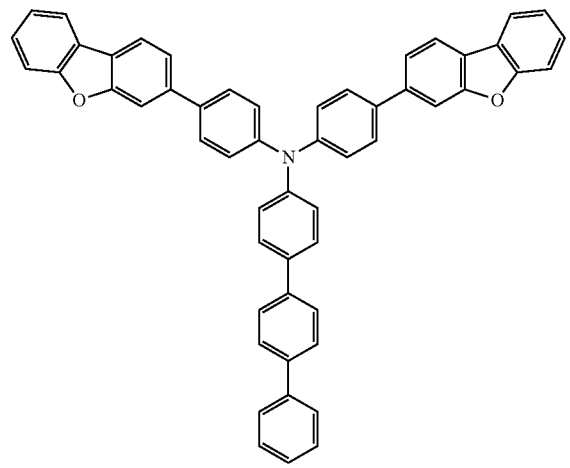
HT41
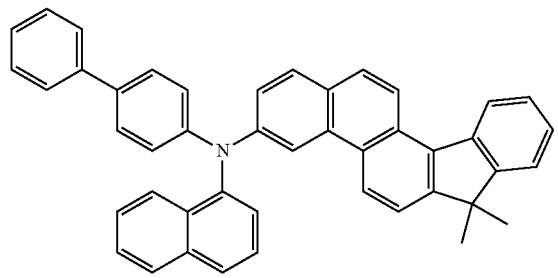
HT42
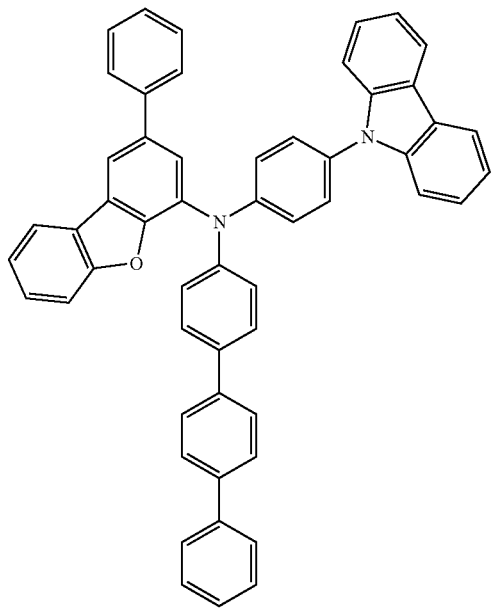
HT43
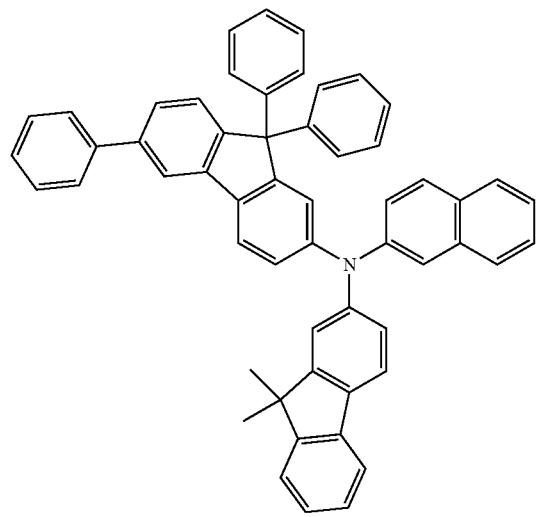
HT44
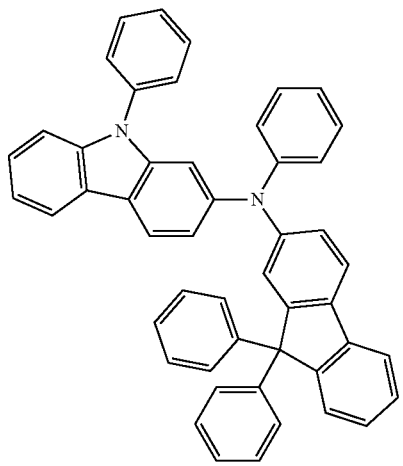
HT45

-continued
HT46
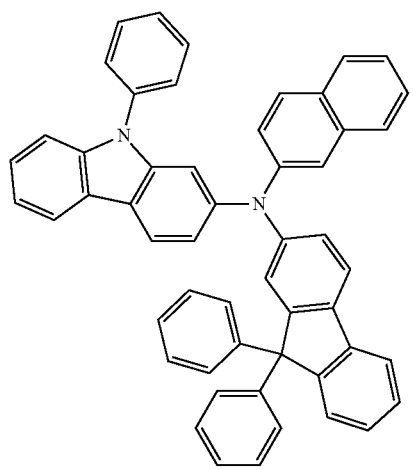
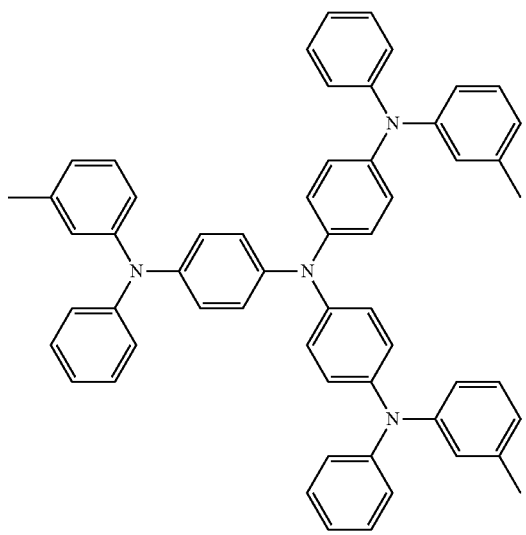
m-MTDATA
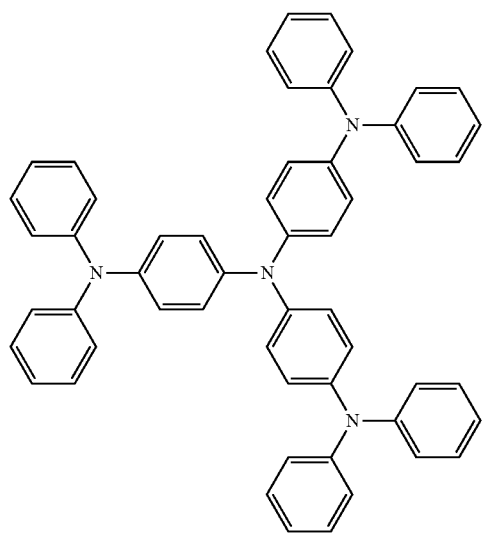
TDATA
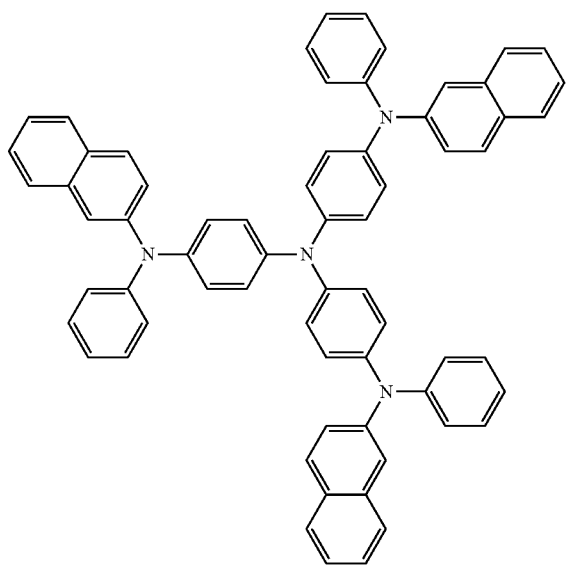
2-TNATA
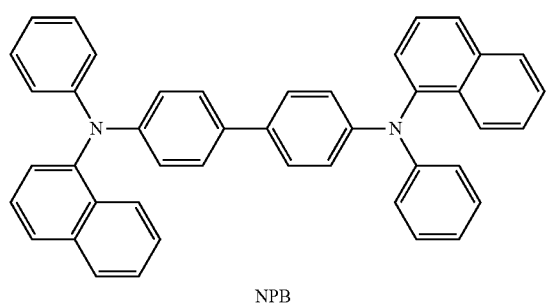
NPB
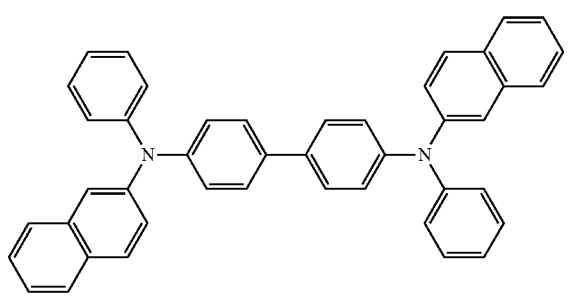
β–NPB

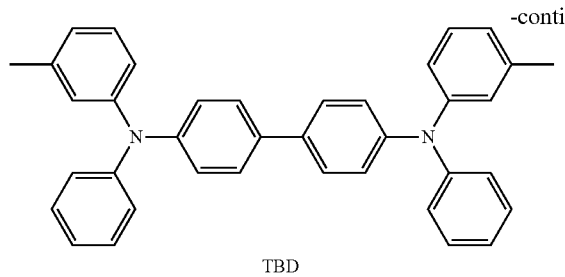
TBD

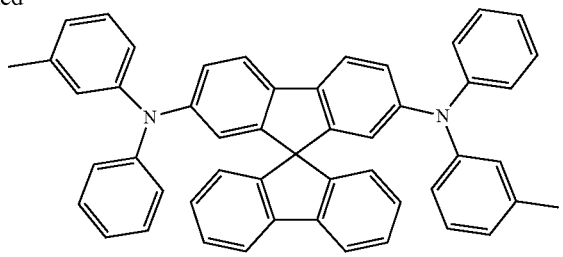
Spiro-TPD

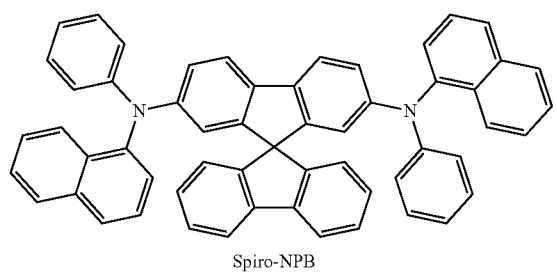
Spiro-NPB

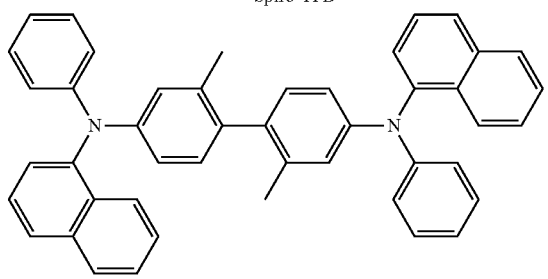
methylated-NPB

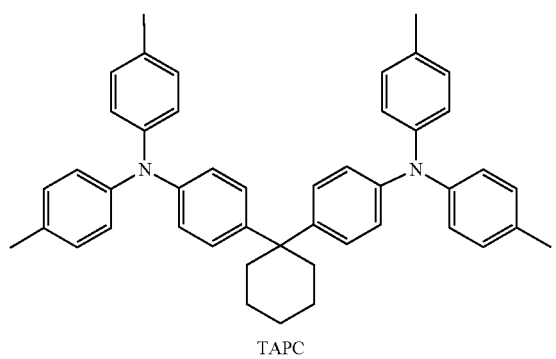
TAPC

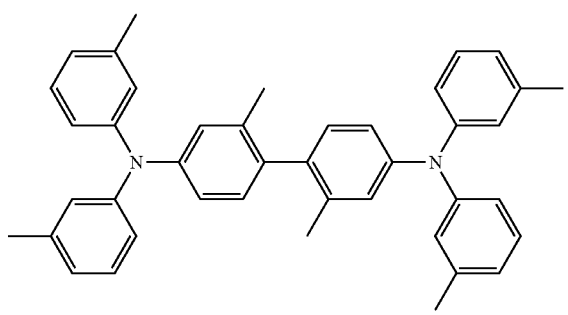
HMTPD

A thickness of the hole-transporting region may be in a range of about 50 Å to about 10,000 Å, for example, about 100 Å to about 4,000 Å. When the hole-transporting region includes a hole injection layer, a hole-transporting layer, or any combination thereof, a thickness of the hole injection layer may be in a range of about 100 Å to about 9,000 Å, for example, about 100 Å to about 1,000 Å, and a thickness of the hole-transporting layer may be in a range of about 50 Å to about 2,000 Å, for example, about 100 Å to about 1,500 Å. When the thicknesses of the hole-transporting region, the hole injection layer and the hole-transporting layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron-blocking layer may block the leakage of electrons from an emission layer to a hole-transporting region. Materials that may be included in the hole-transporting region may be included in the emission auxiliary layer and the electron-blocking layer.

The hole-transporting region may further include, in addition to these materials, a charge-generation material for the improvement of conductive properties. The charge-generation material may be uniformly or non-uniformly dispersed in the hole-transporting region (for example, in the form of a single layer consisting of a charge-generation material). The charge-generation material may be, for example, a p-dopant.

In one embodiment, the lowest unoccupied molecular orbital (LUMO) energy level of the p-dopant may be −3.5 eV or less.

In an embodiment, the p-dopant may include a quinone derivative, a cyano group-containing compound, a compound containing element EL1 and element EL2, or any combination thereof.

Examples of the quinone derivative are TCNQ, F4-TCNQ, etc.

Examples of the cyano group-containing compound are HAT-CN, and a compound represented by Formula 221 below.

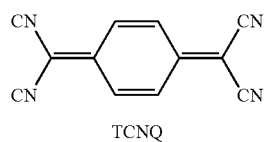
TCNQ

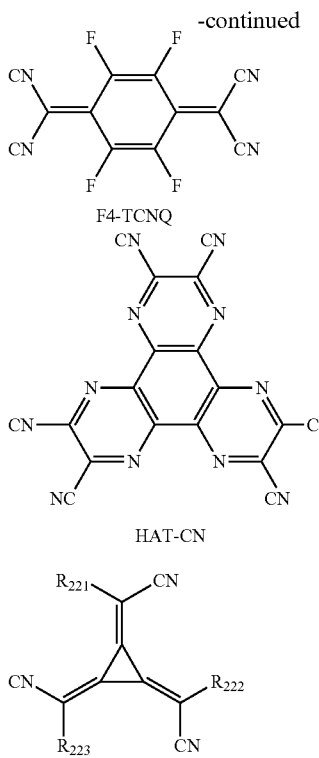

F4-TCNQ

HAT-CN

Formula 221

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be metal, metalloid, or a combination thereof, and element EL2 may be non-metal, metalloid, or a combination thereof.

Examples of the metal are an alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid are silicon (Si), antimony (Sb), and tellurium (Te).

Examples of the non-metal are oxygen (O) and halogen (for example, F, Cl, Br, I, etc.).

In an embodiment, examples of the compound containing element EL1 and element EL2 are metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, or any combination thereof.

Examples of the metal oxide are tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide are alkali metal halide, alkaline earth metal halide, transition metal halide, post-transition metal halide, and lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide are zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide are YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

An example of the metalloid halide is antimony halide (for example, $SbCl_5$, etc.).

Examples of the metal telluride are alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full color light-emitting device, the emission layer may include emission layers emitting different colors according to individual subpixels.

In one or more embodiments, the emission layer may be patterned, for each subpixel, as a first color emission layer, a second color emission layer, and a third color emission layer. In this case, at least one of the emission layers may include a thin film formed using the ink composition described herein. In an embodiment, the first color emission layer may be an inorganic emission layer including semiconductor nanoparticles, and the second color emission layer and the third color emission layer may be organic emission layers including organic compounds, respectively. In this regard, the first color through the third color are different colors, and for example, the first color through the third color may have different maximum luminescence wavelengths. The first color through the third color, collectively, may result in the emission of white light.

In an embodiment, the emission layer may further include a fourth color emission layer, and at least one of the first to fourth color emission layers may be an inorganic emission layer including semiconductor nanoparticles, and the remaining emission layers may be organic emission layers including organic compounds. In this regard, the first color through the fourth color are different colors, and for example, the first color through the fourth color may have different maximum luminescence wavelengths. The first color through the fourth color may be white when combined with each other.

In one or more embodiments, the light-emitting device may have a stacked structure in which two or more emission layers emitting light of identical or different colors contact each other or are separated from each other. At least one of the two or more emission layers may be an inorganic emission layer including semiconductor nanoparticles, and the remaining emission layer may be an organic emission layer including an organic compound. In detail, the light-emitting device includes a first color emission layer and a second color emission layer, and the first color and the second color may be the same color or different colors. More specifically, when the first color and the second color are the same, the first color and the second color may each be blue. In an embodiment, in the case where the first color and the second color are different from each other, the first color and the second color, collectively, may result in the emission of white light.

When the emission layer is an organic emission layer, the emission layer may include a host and a dopant. The dopant may include a phosphorescent dopant, a fluorescent dopant, a delayed fluorescence dopant, or any combination thereof.

The amount of the host in the emission layer may be greater than the amount of the dopant in the emission layer. In an embodiment, the amount of the dopant in the emission layer may be from about 0.01 to about 15 parts by weight based on 100 parts by weight of the host.

Alternatively, the emission layer may be an inorganic emission layer including semiconductor nanoparticles. Specifically, a film formed using the ink composition described herein.

Meanwhile, the emission layer may include a delayed fluorescence material. The delayed fluorescence material may act as a host or a dopant in an emission layer, and depending on the purpose of use, may be a delayed fluorescence host or a delayed fluorescence dopant.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

In one or more embodiments, the host may include a compound represented by Formula 301 below:

$$[Ar_{301}]xb11-[(L_{301})xb1-R_{301}]xb21 \quad \text{Formula 301}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ are the same as described in connection with $Q_1$.

For example, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination thereof:

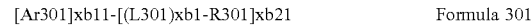

Formula 301-1

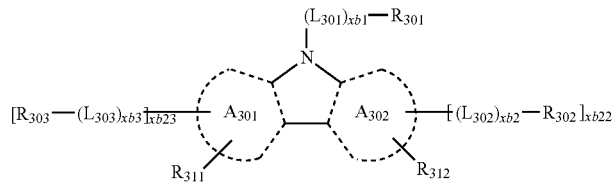

-continued

Formula 301-2

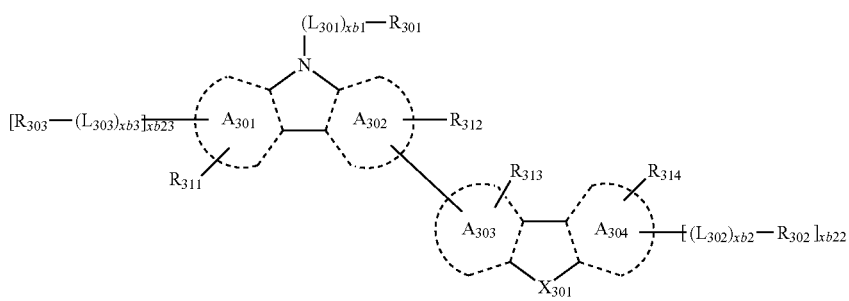

In Formulae 301-1 to 301-2,
ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
$X_{301}$ may be O, S, N-$[(L_{304})_{xb4}$-$R_{304}]$, C($R_{304}$)($R_{305}$), or Si($R_{304}$)($R_{305}$),
xb22 and xb23 may each independently be 0, 1, or 2,
$L_{301}$, xb1, and $R_{301}$ are the same as described in the present specification,
$L_{302}$ to $L_{304}$ may each independently be the same as described in connection with $L_{301}$,
xb2 to xb4 may each independently be the same as described in connection with xb1, and
$R_{302}$ to $R_{305}$ and $R_{311}$ to $R_{314}$ are the same as described in connection with $R_{301}$.

In an embodiment, the host may include an alkali earth metal complex, a post-transition metal complex, or a combination thereof. In an embodiment, the host may include a Be complex (for example, Compound H55), an Mg complex, a Zn complex, or a combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof:

H1

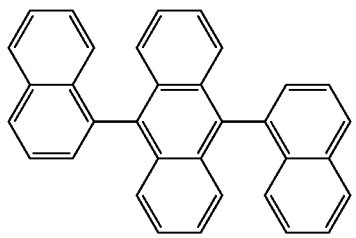

H2

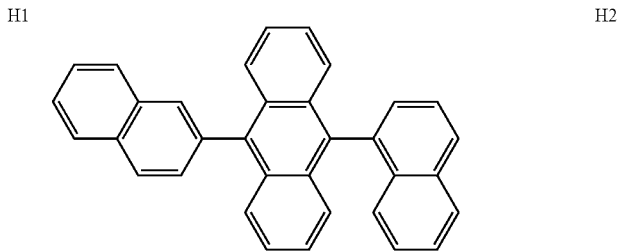

H3

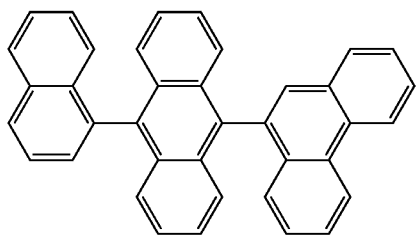

H4

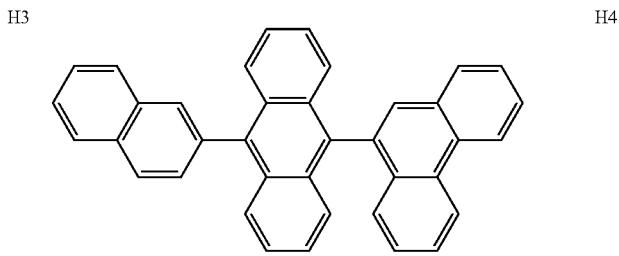

H5

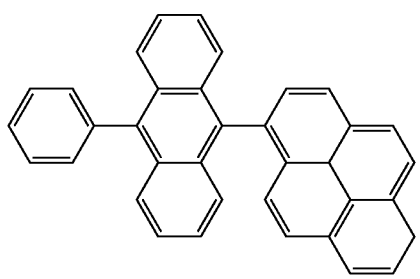

H6

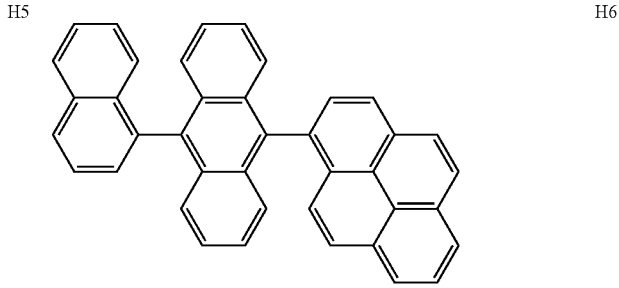

-continued
H7
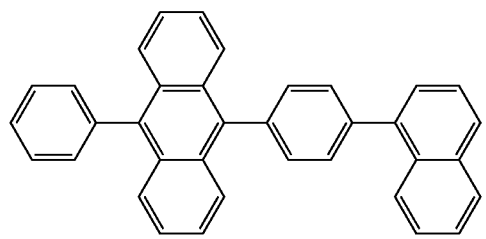
H8
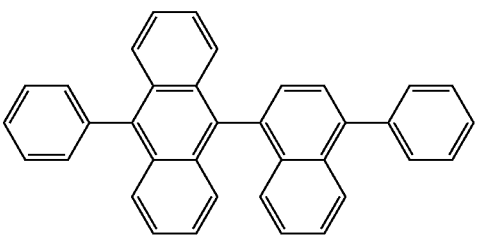
H9
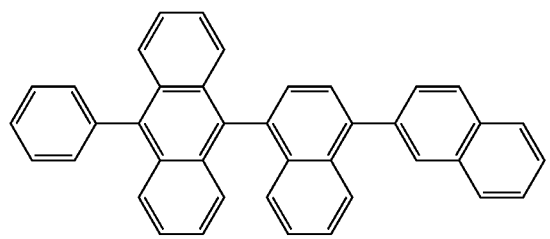
H10
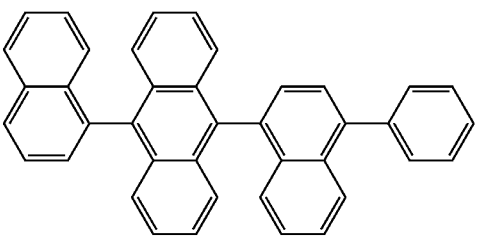
H11
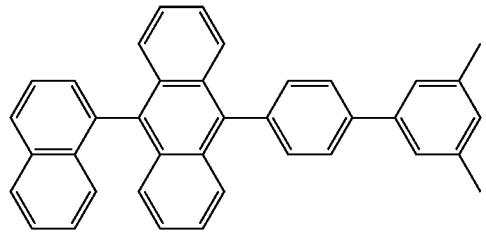
H12
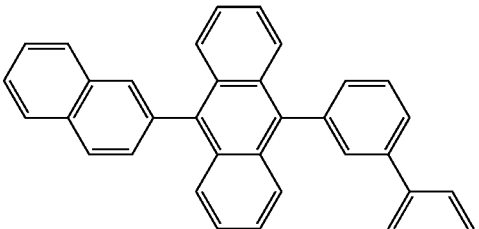
H13
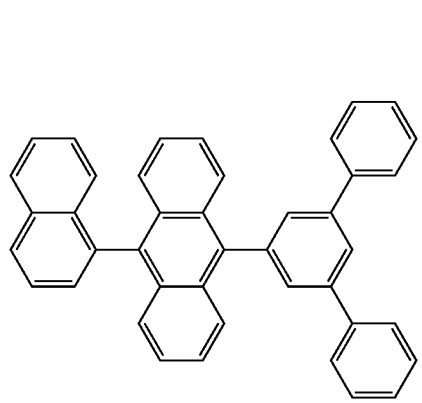
H14
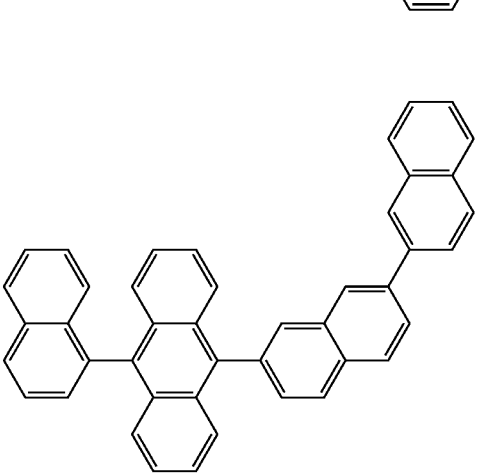
H15
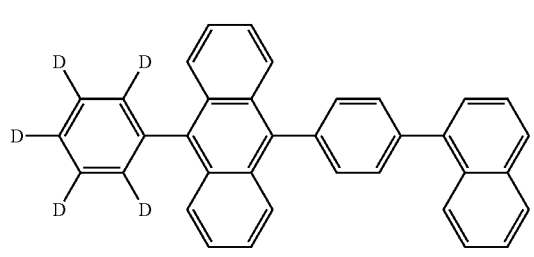
H16
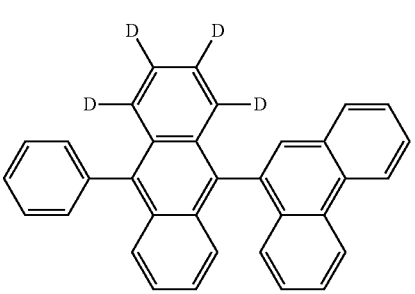

-continued
H17
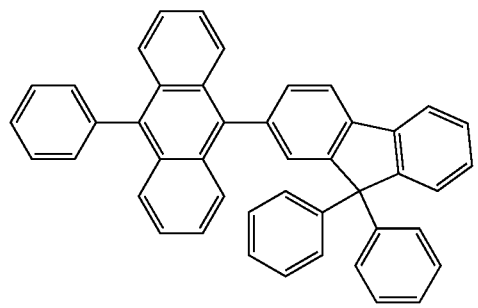
H18
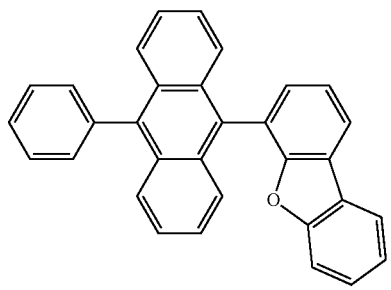
H19
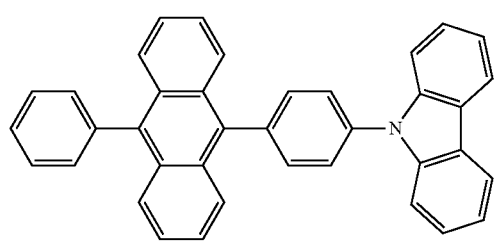
H20
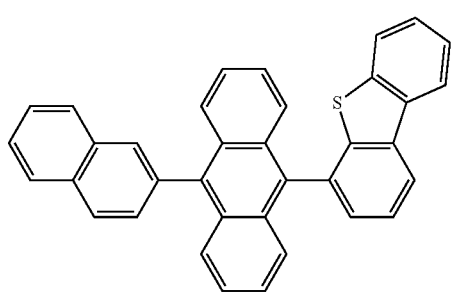
H21
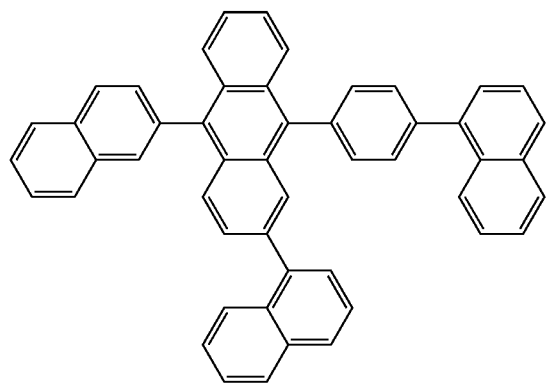
H22
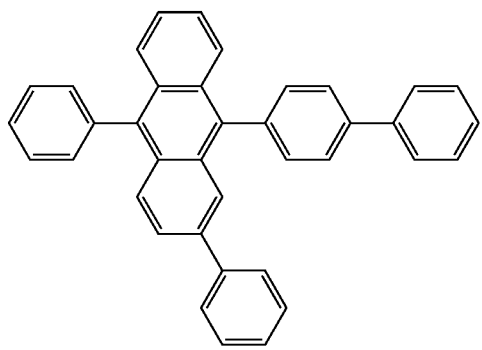
H23
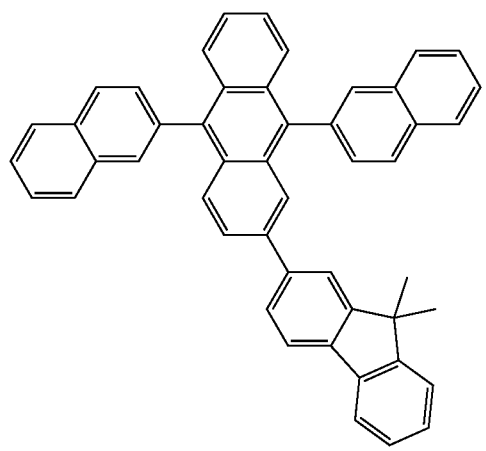
H24
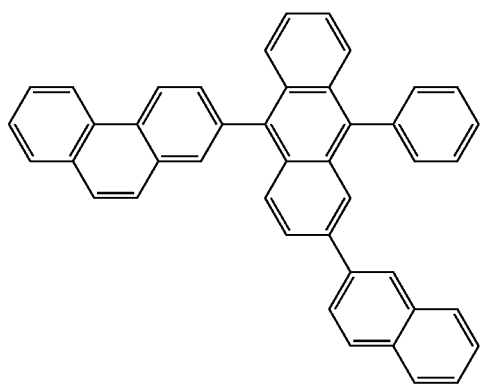

-continued
H25
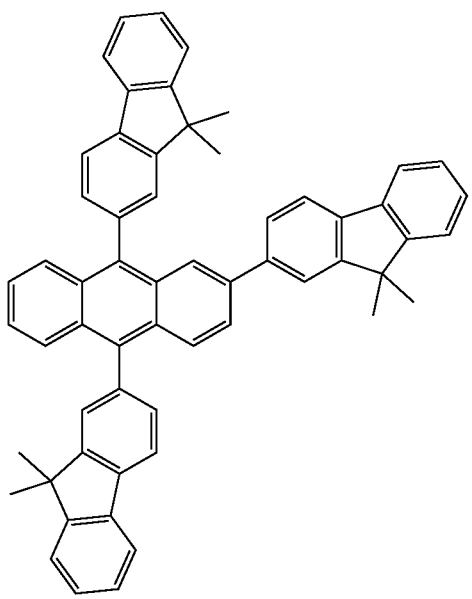
H26
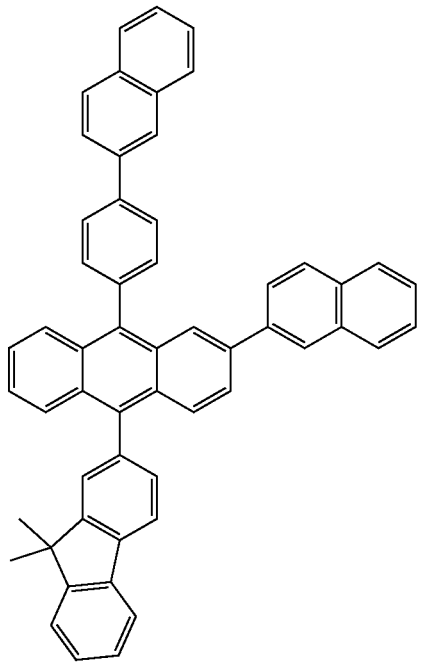
H27
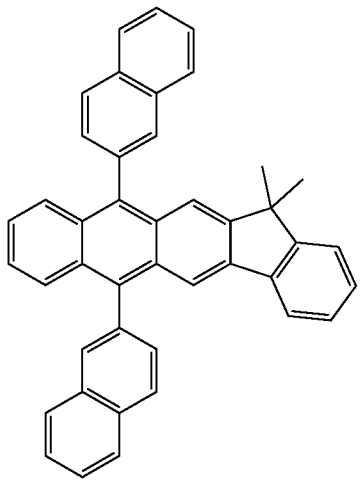
H28
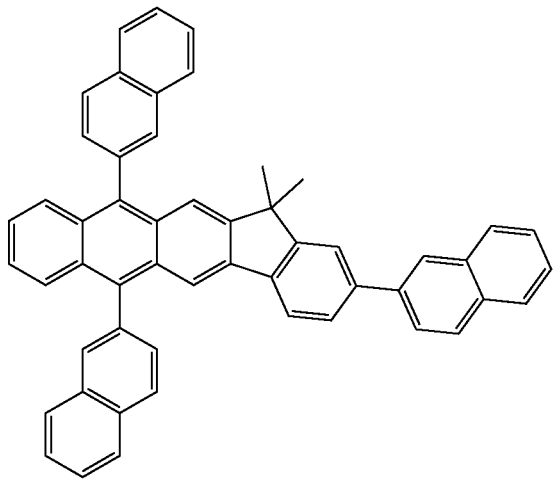
H29
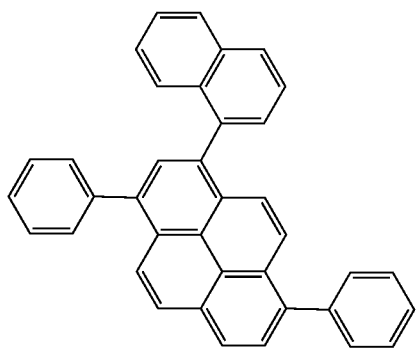
H30
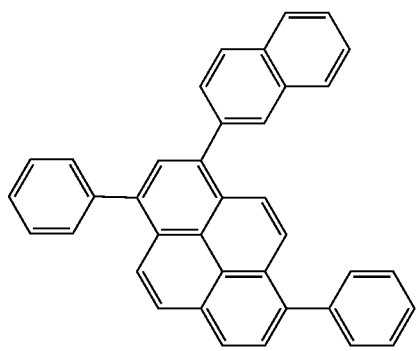

-continued
H31
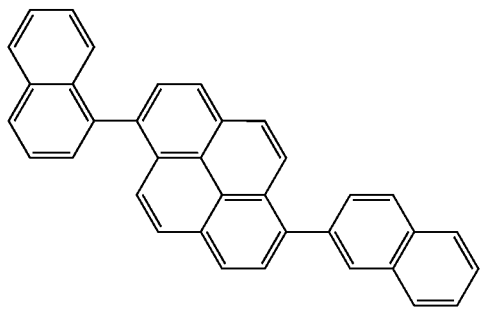
H32
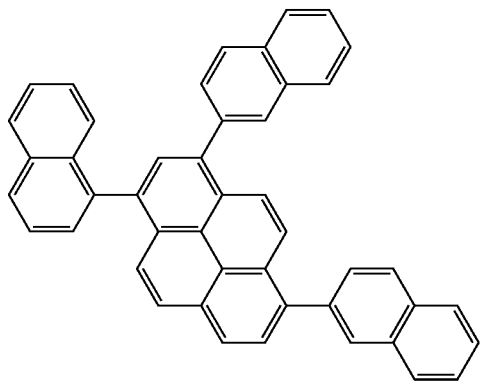
H33
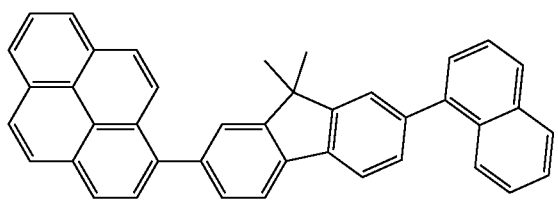
H34
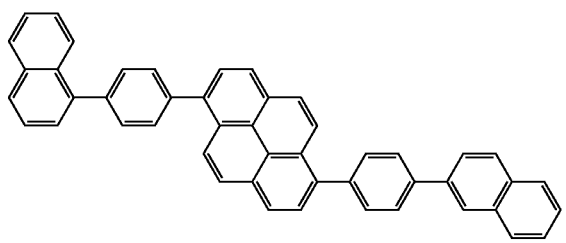
H35
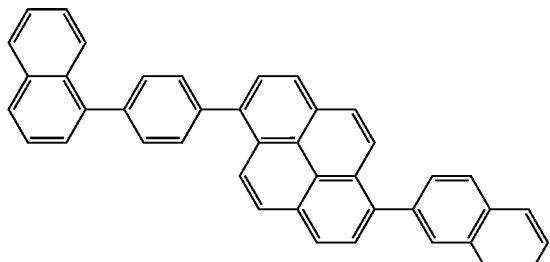
H36
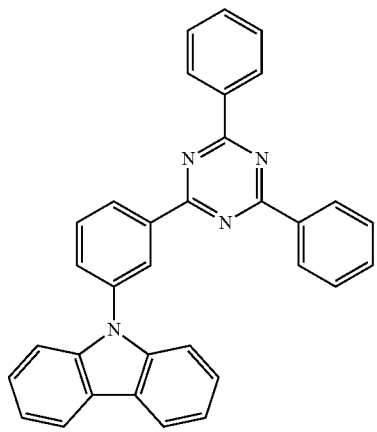
H37
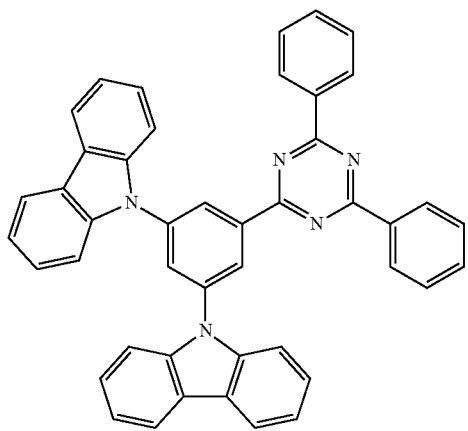
H38
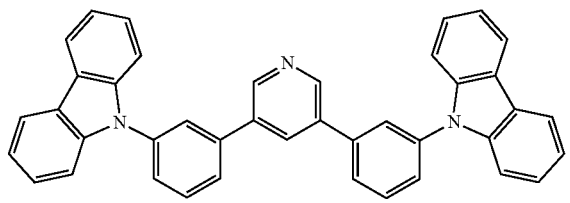

-continued
H39
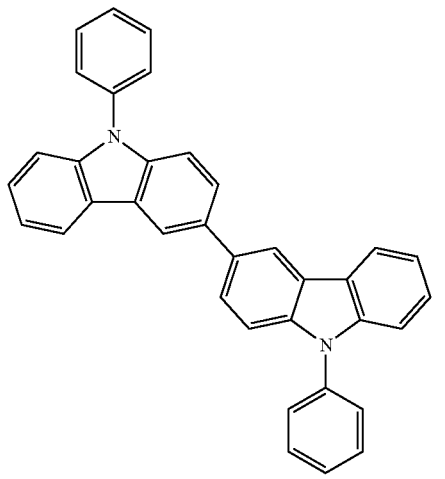
H40
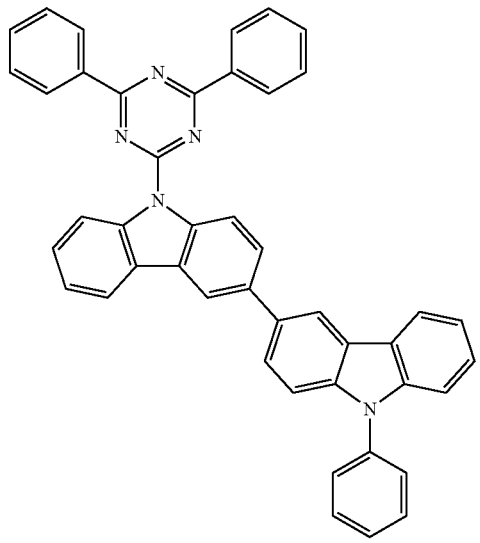
H41
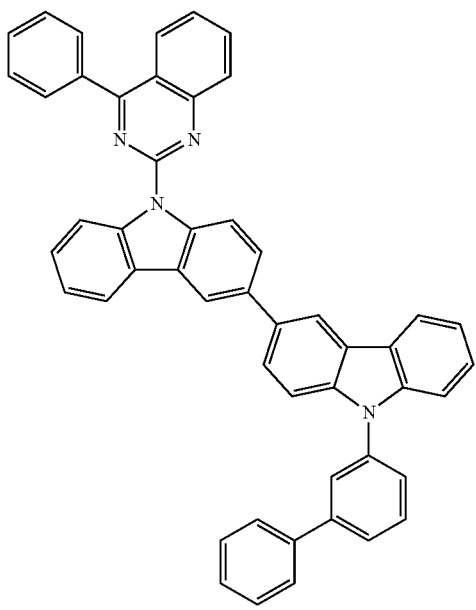
H42
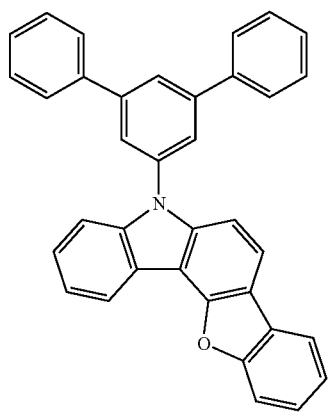
H43
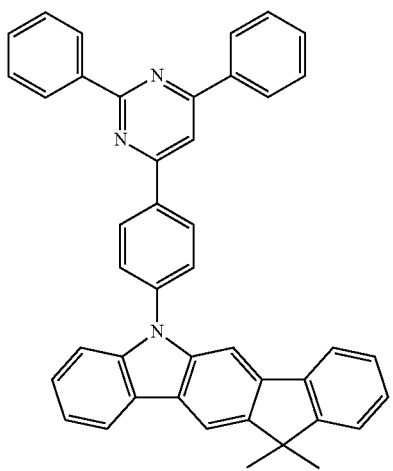
H44
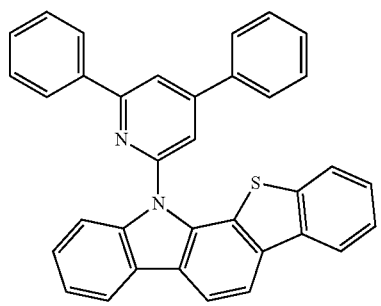

-continued
H45
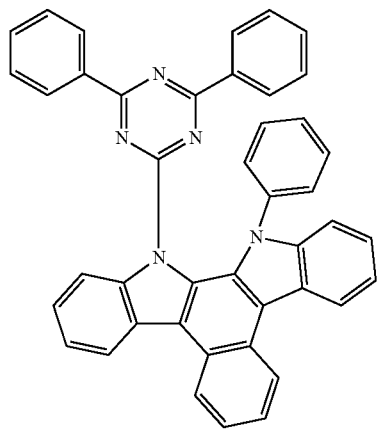
H46
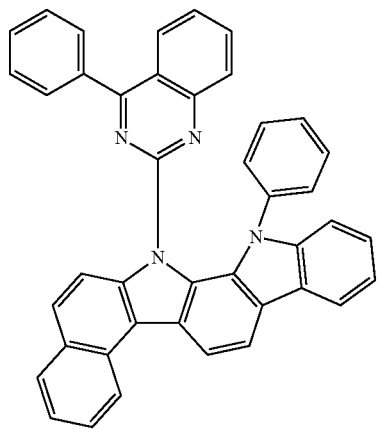
H47
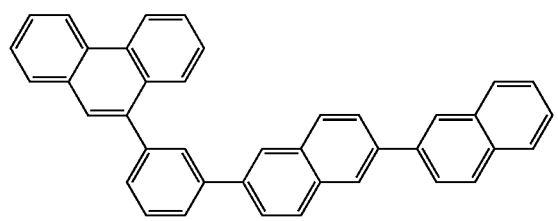
H48
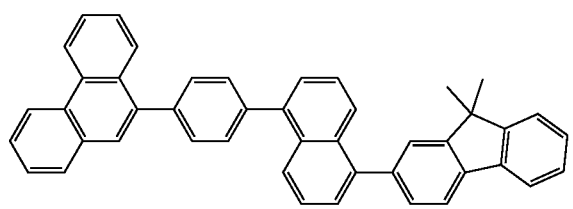
H49
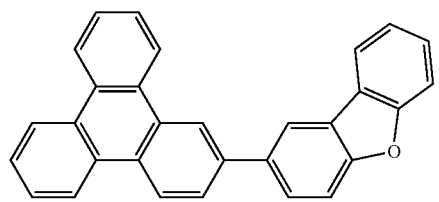
H50
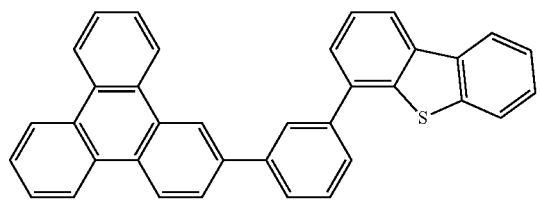
H51
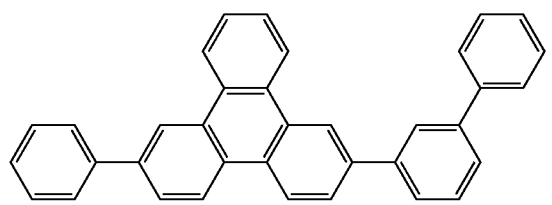
H52
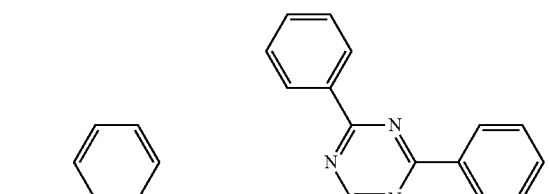
H53
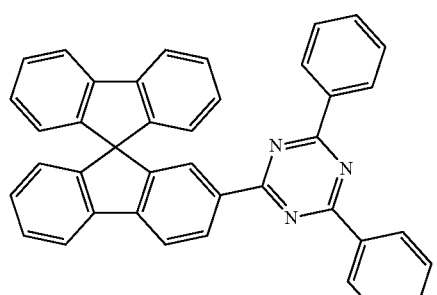
H54
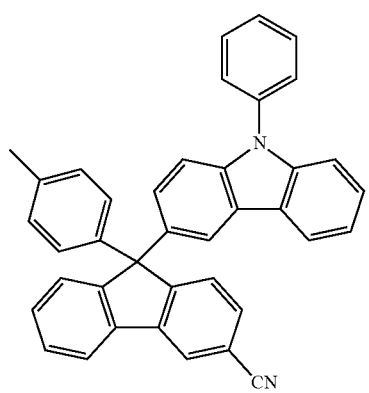

-continued
H55
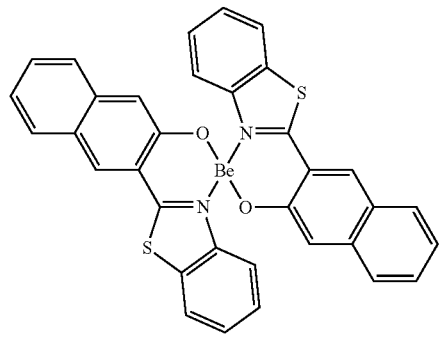
H56
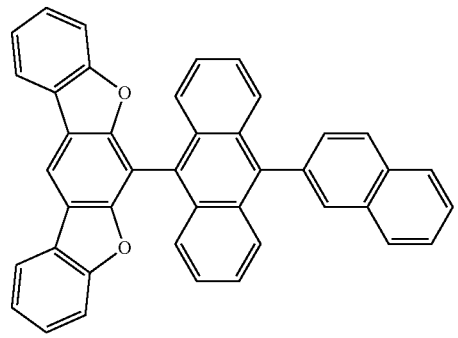
H57
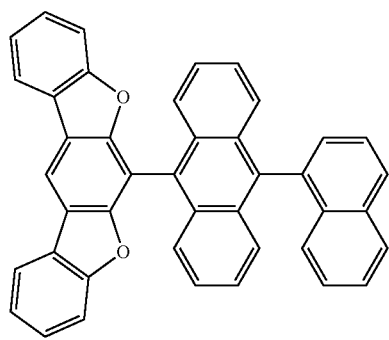
H58
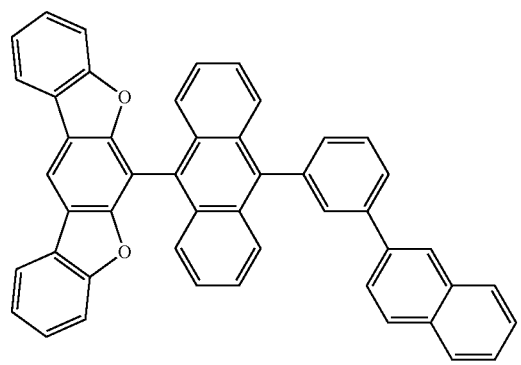
H59
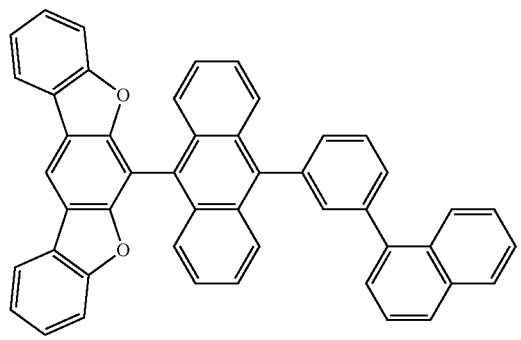
H60
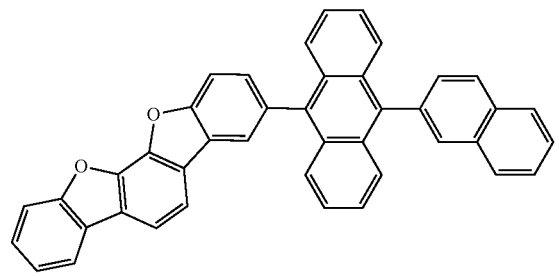
H61
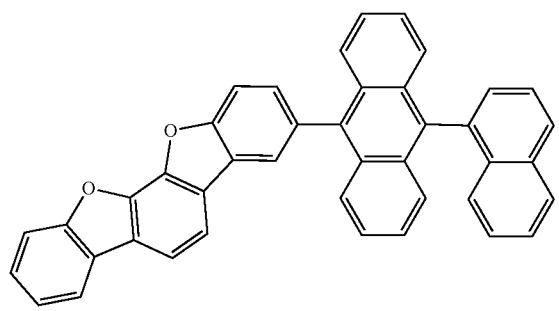
H62
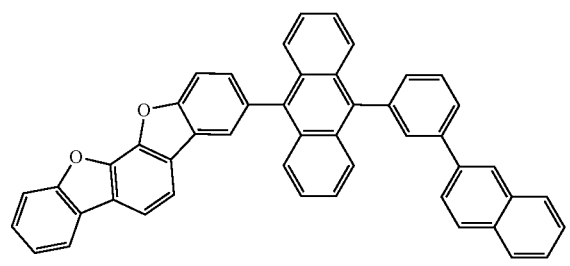

-continued
H63
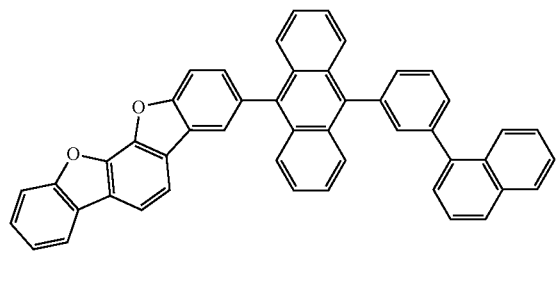
H64
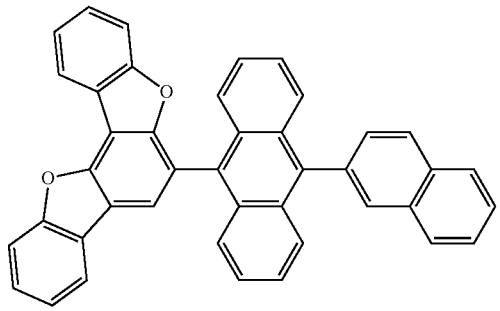
H65
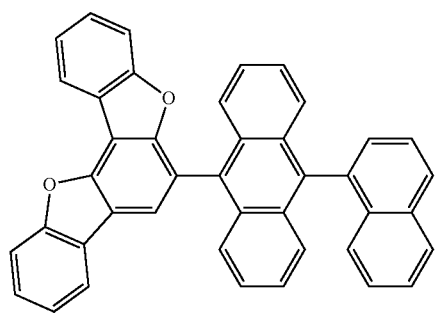
H66
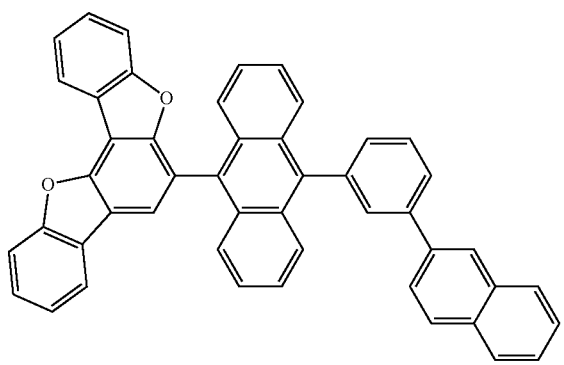
H67
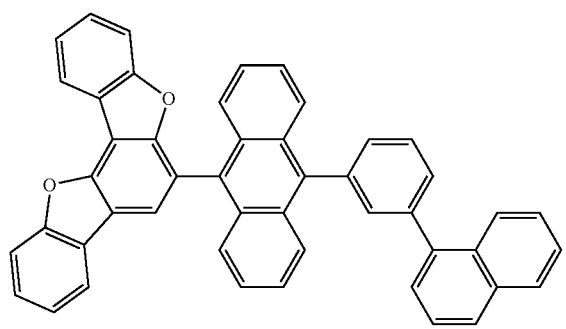
H68
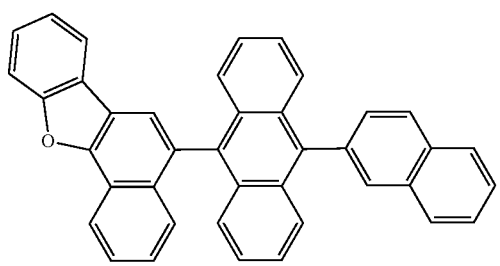
H69
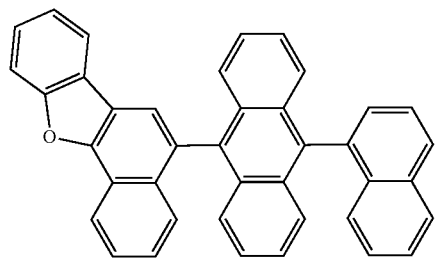
H70
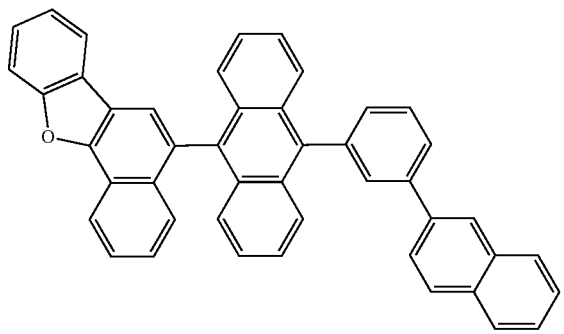

-continued
H71
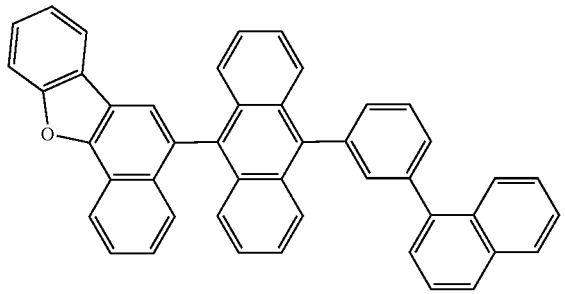
H72
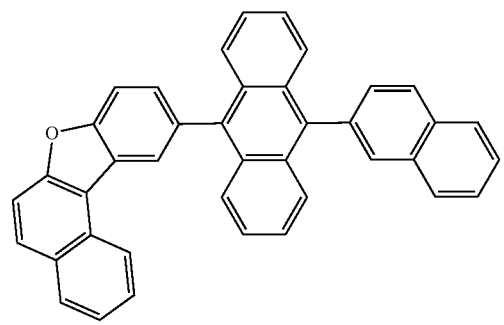
H73
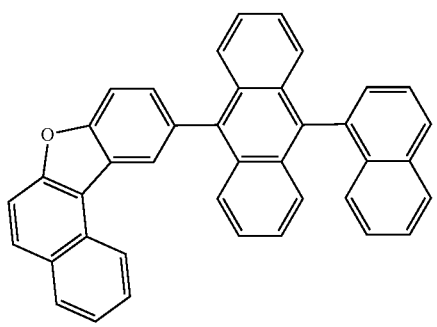
H74
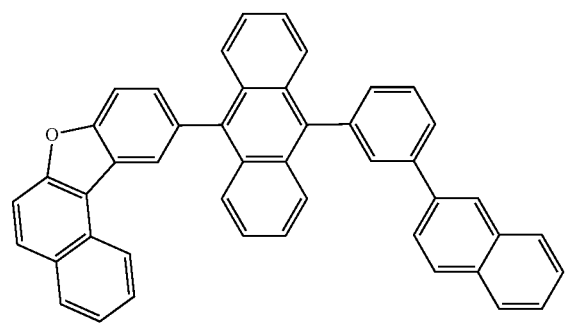
H75
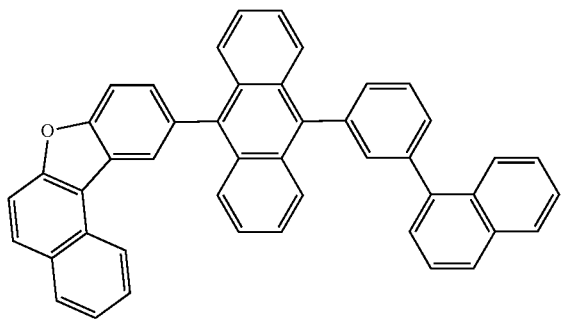
H76
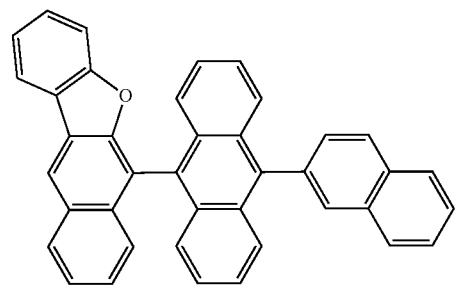
H77
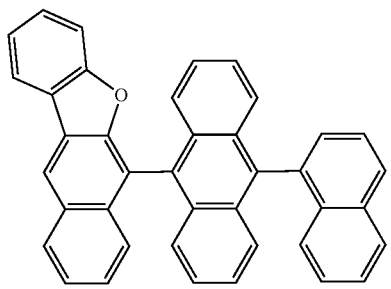
H78
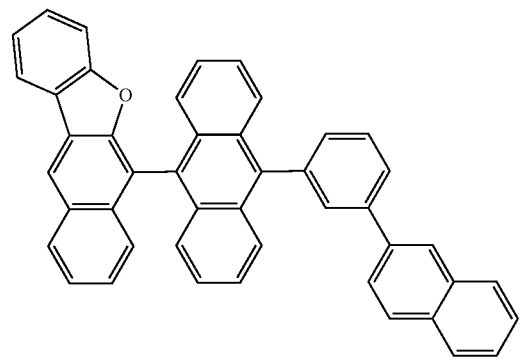

-continued
H79
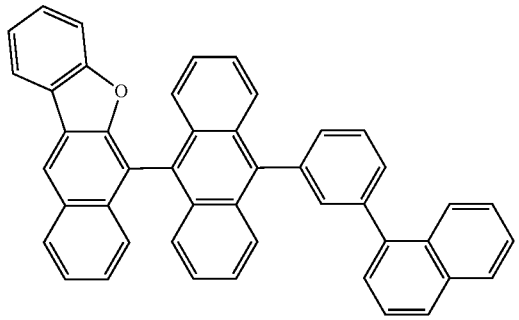
H80
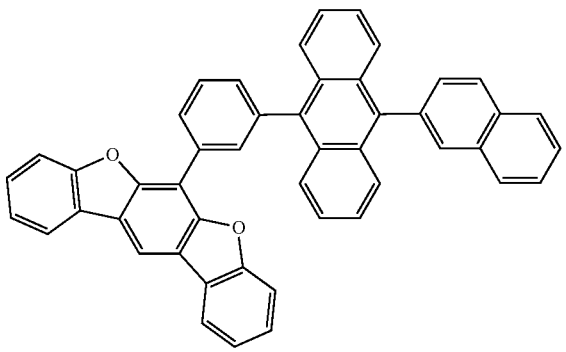
H81
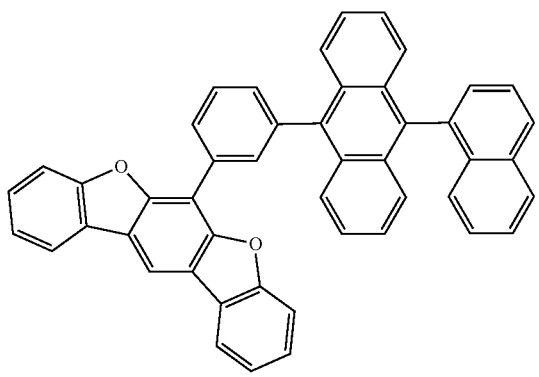
H82
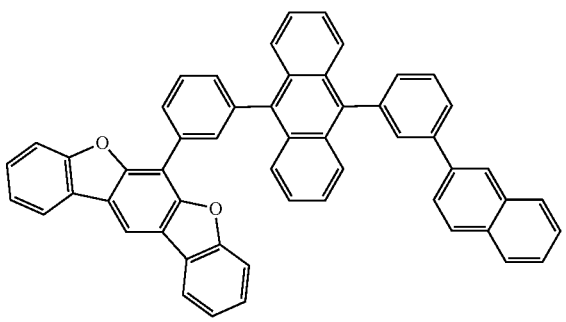
H83
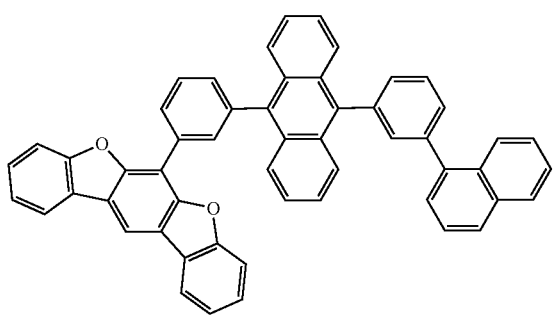
H84
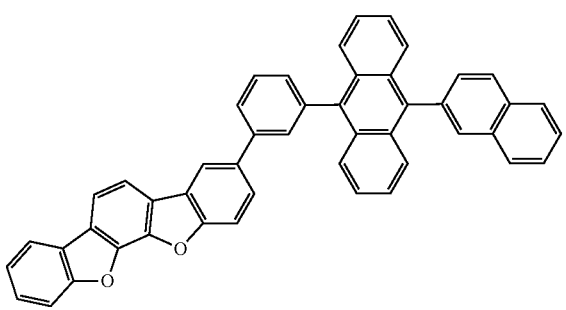
H85
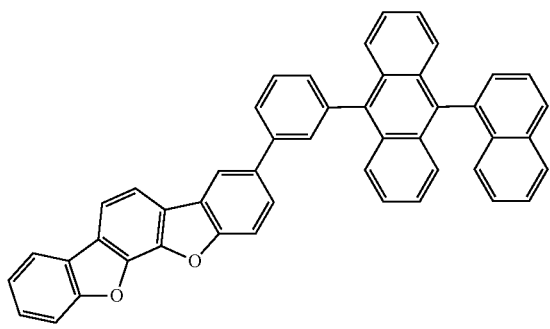
H86
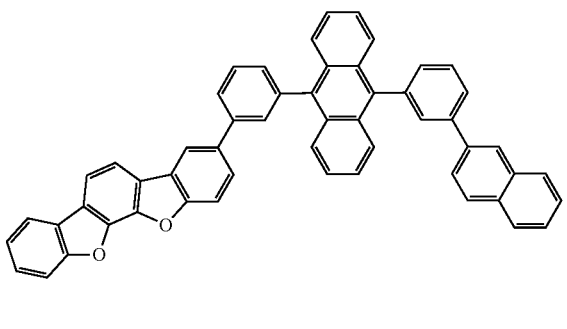

-continued
H87
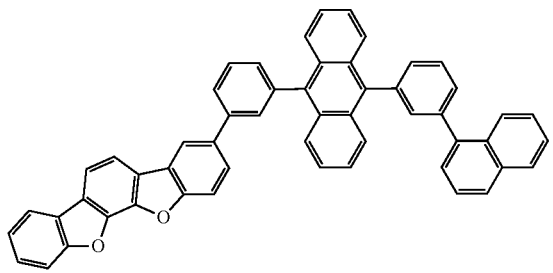
H88
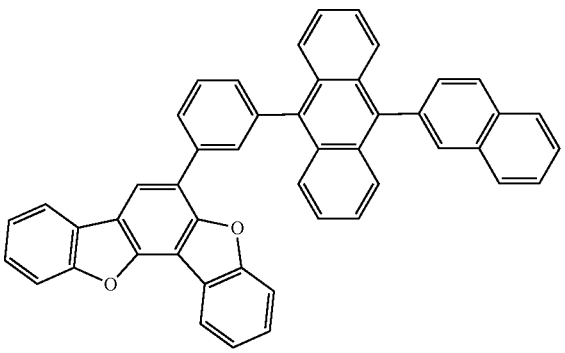
H89
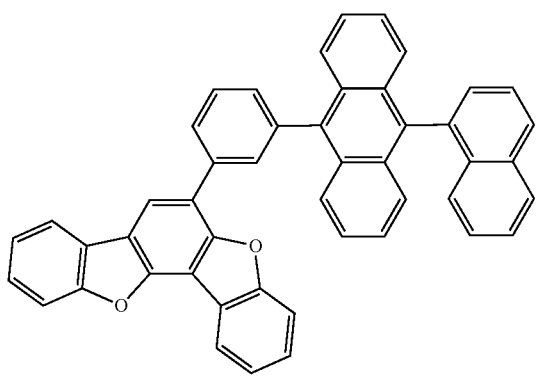
H90
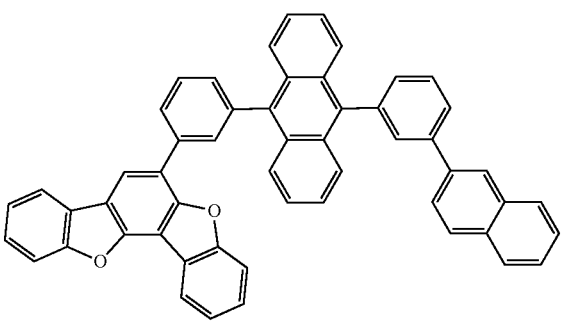
H91
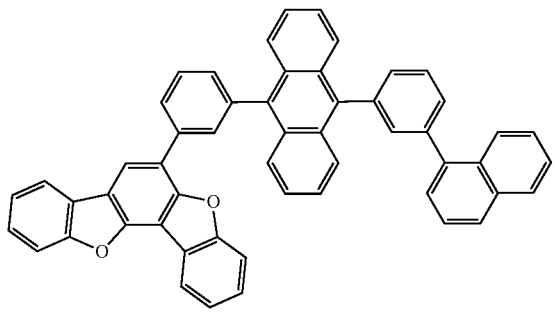
H92
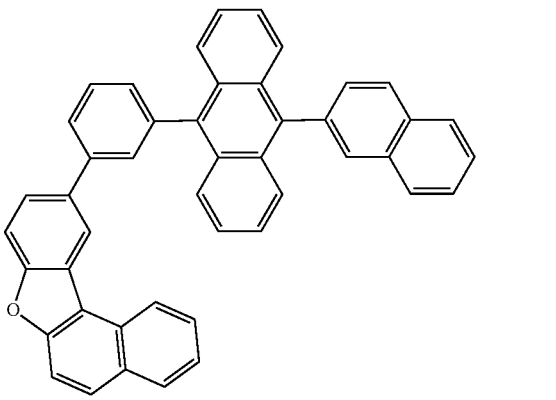
H93
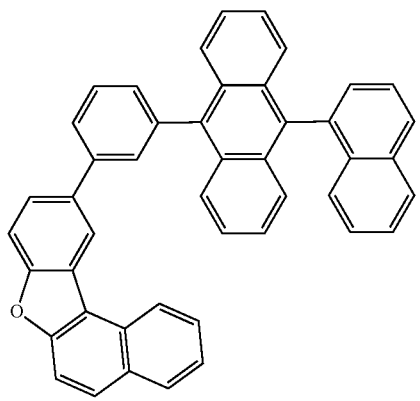
H94
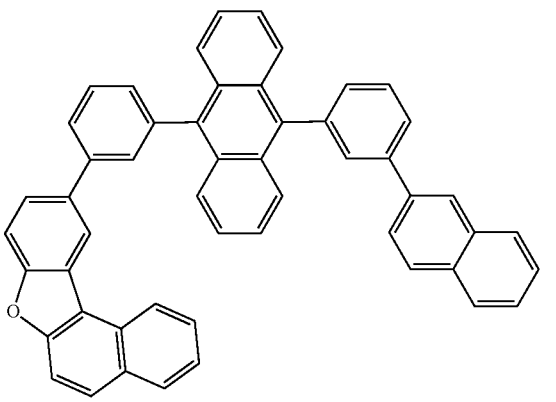

-continued
H95
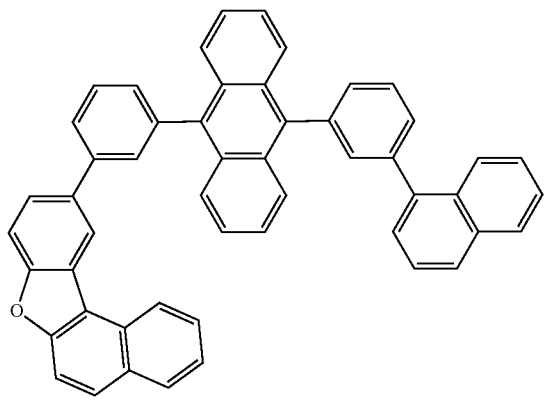
H96
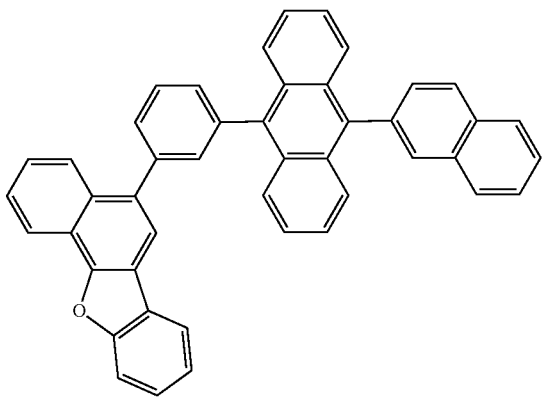
H97
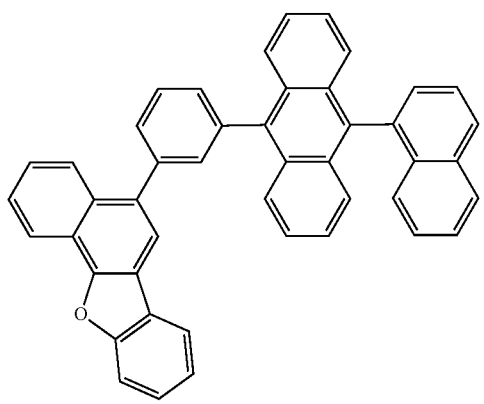
H98
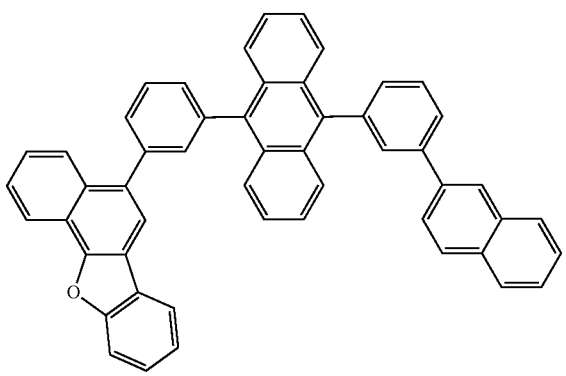
H99
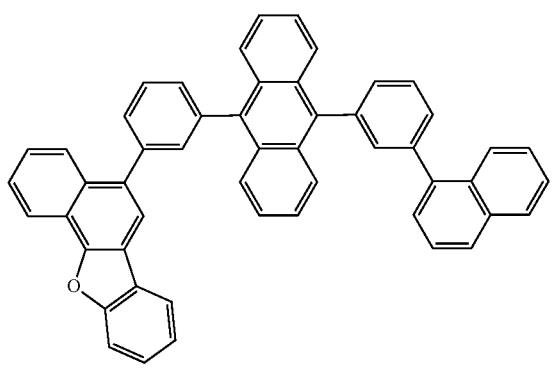
H100
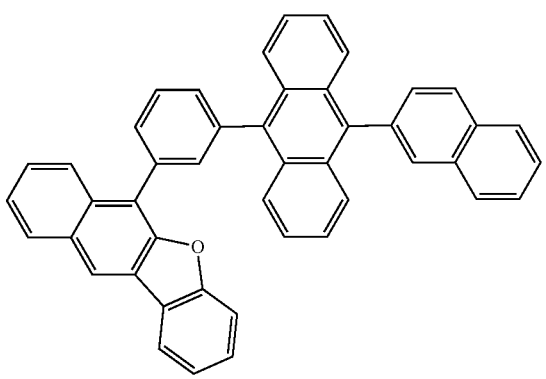
H101
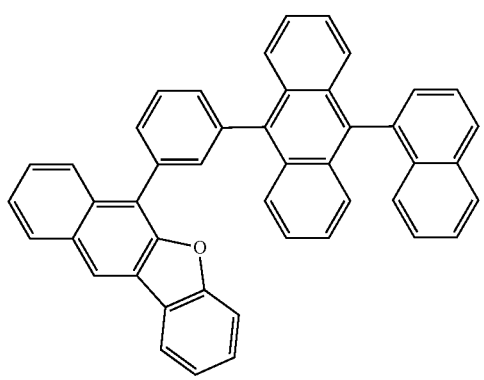
H102
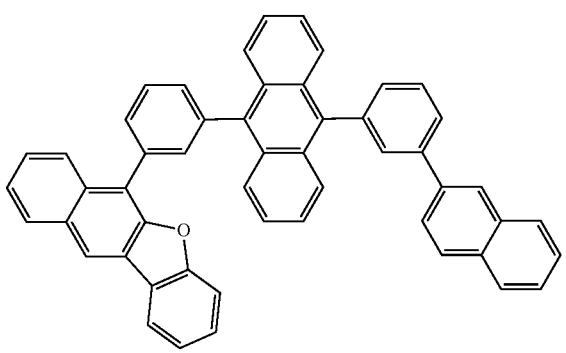

-continued
H103
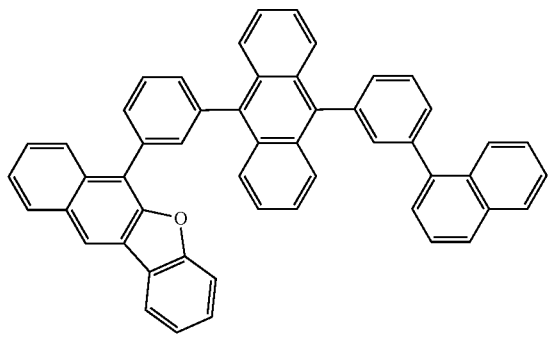
H104
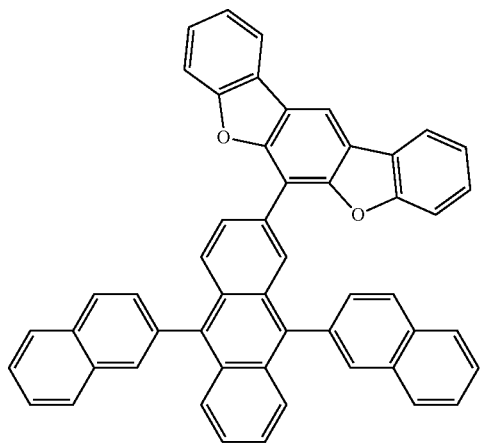
H105
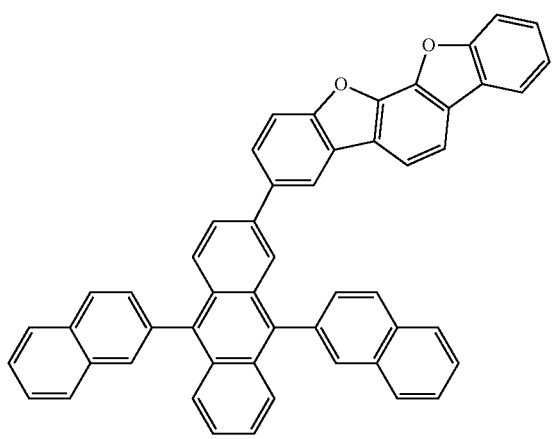
H106
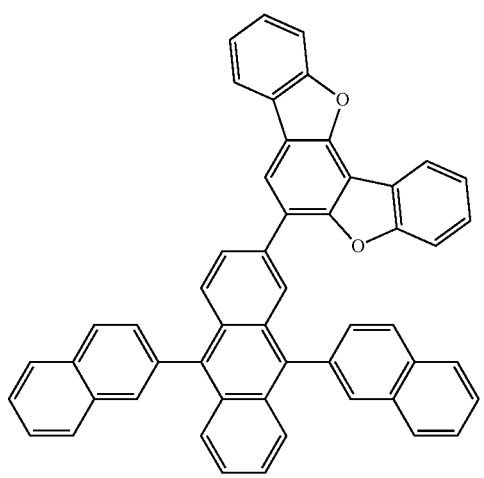
H107
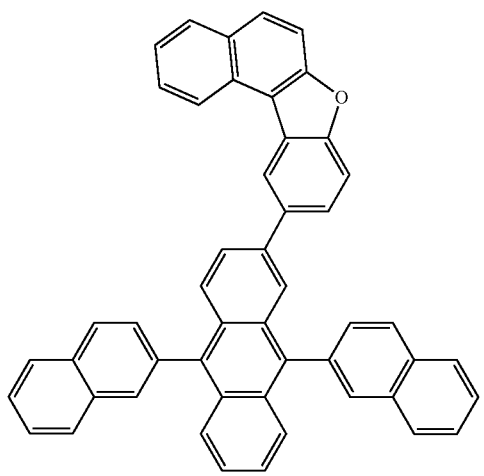
H108
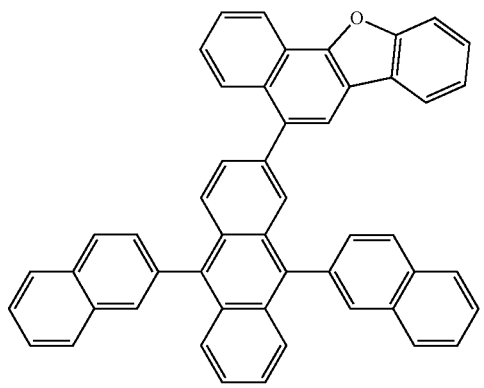

-continued
H109
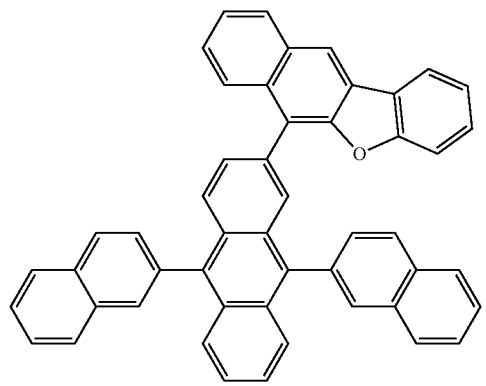
H110
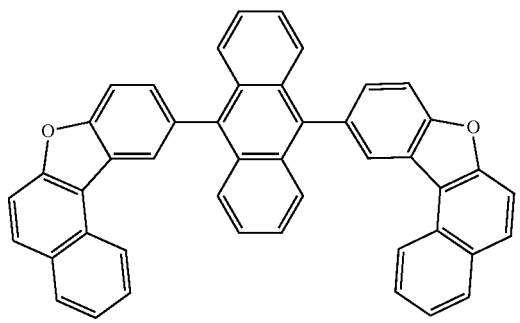
H111
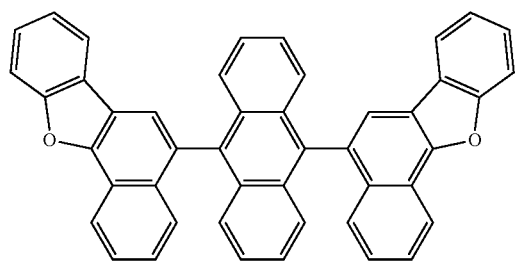
H112
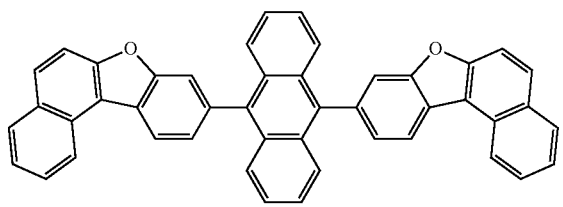
H113
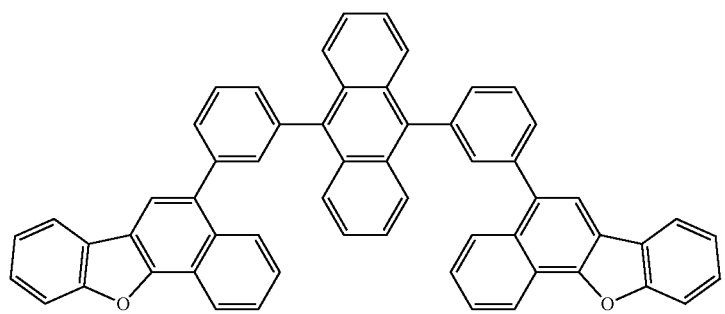
H114
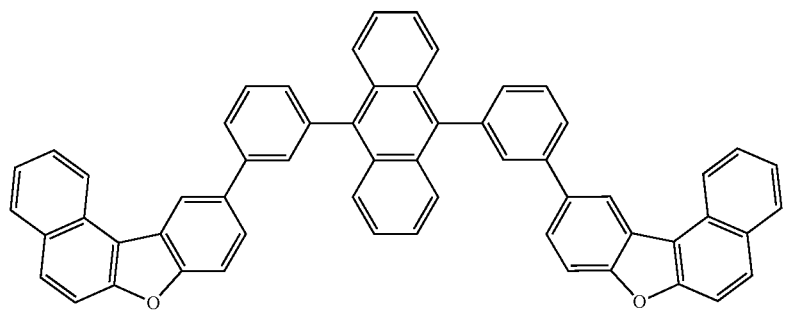

-continued
H115
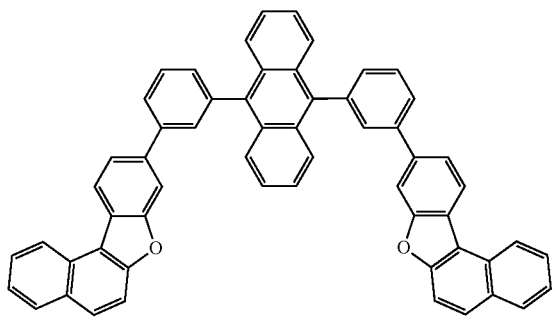
H116
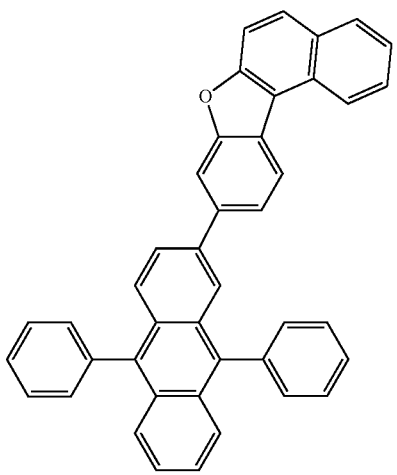
H117
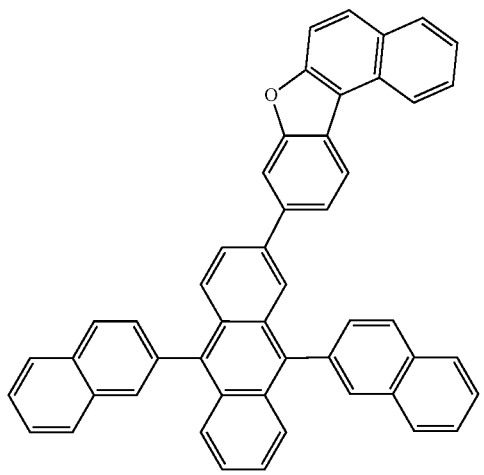
H118
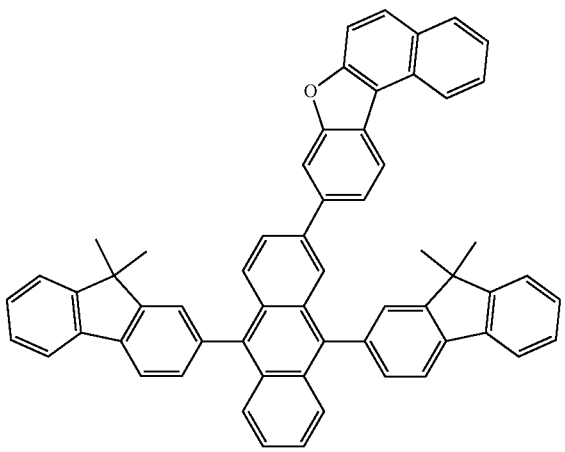
H119
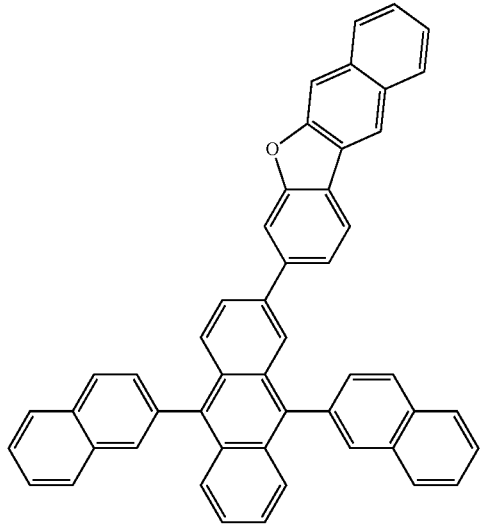
H120
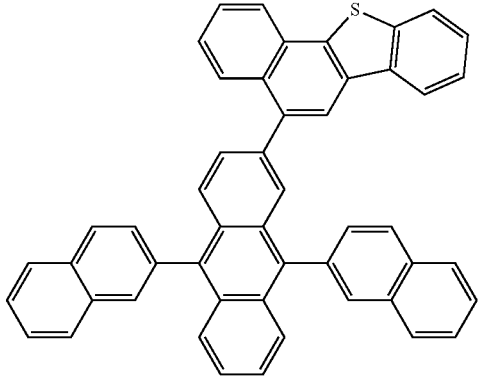

-continued
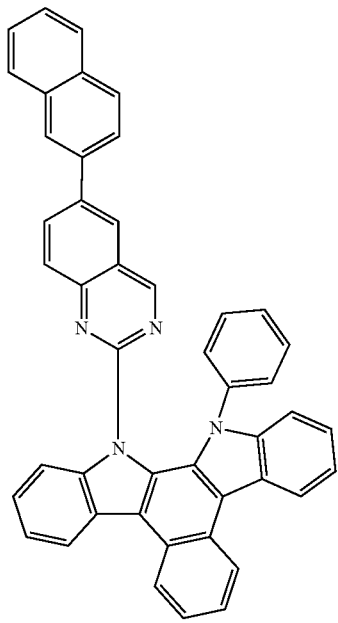
H121
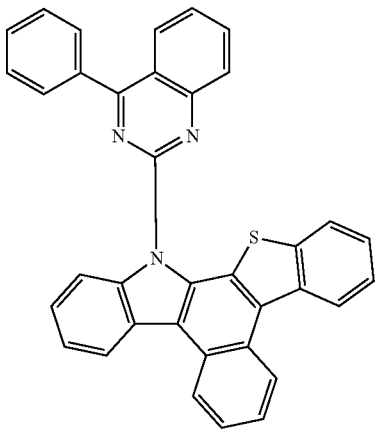
H122
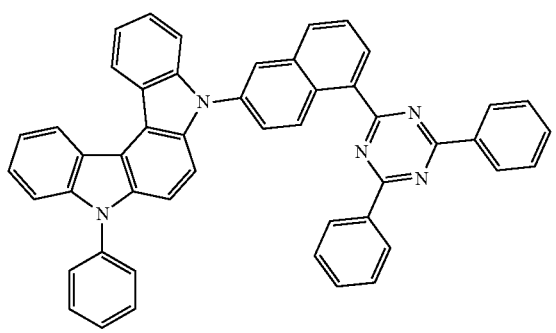
H123
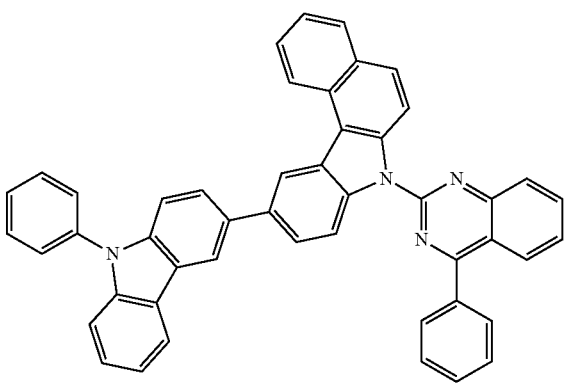
H124

In an embodiment, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral. For example, the phosphorescent dopant may include an organometallic compound represented by Formula 401:

Formula 401

$M(L_{401})_{xc1}(L_{402})_{xc2}$

Formula 402

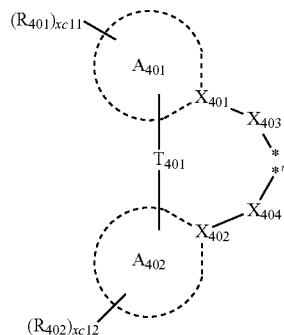

In Formulae 401 and 402,

M may be transition metal (for example, iridium (Ir), platinum (Pt), palladium (Pd), osmium (Os), titanium (Ti), gold (Au)hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—C(=O)—*', *—N($Q_{411}$)—*', *—C($Q_{411}$)($Q_{412}$)—*', *—C($Q_{411}$)=C($Q_{412}$)—*', *—C($Q_{411}$)=*', or *=C($Q_{411}$)—*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$, xc11 and xc12 may each independently be an integer from 0 to 10,

* and *' in Formula 402 each indicate a binding site to M in Formula 401.

For example, in Formula 402, i) $X_{401}$ is nitrogen, and $X_{402}$ is carbon, or ii) each of $X_{401}$ and $X_{402}$ is nitrogen.

In an embodiment, when xc1 in Formula 402 is 2 or more, two ring $A_{401}$ in two or more of $L_{401}$(s) may be optionally linked to each other via $T_{402}$, which is a linking group, and two ring $A_{402}$ may optionally be linked to each other via $T_{403}$, which is a linking group (see Compounds PD1 to PD4 and PD7). $T_{402}$ and $T_{403}$ are the same as described in connection with $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, one of compounds PD1 to PD39, or any combination thereof:

PD1

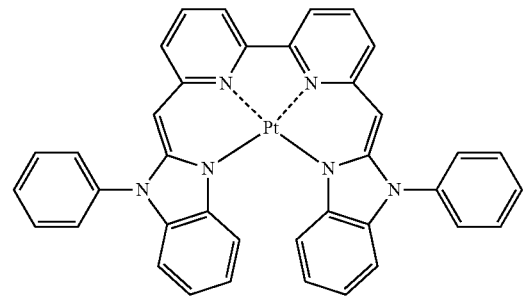

PD2

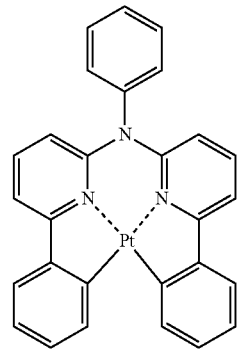

PD3

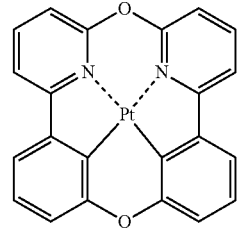

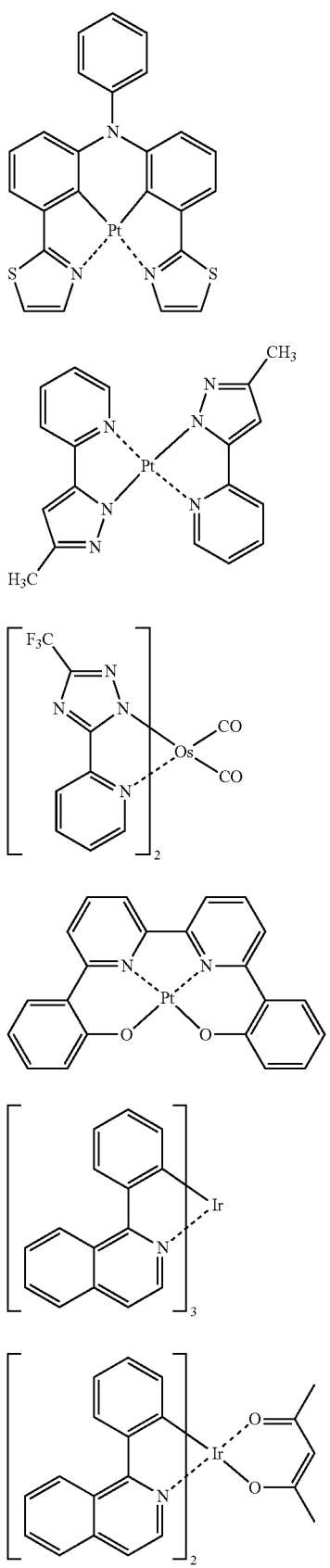
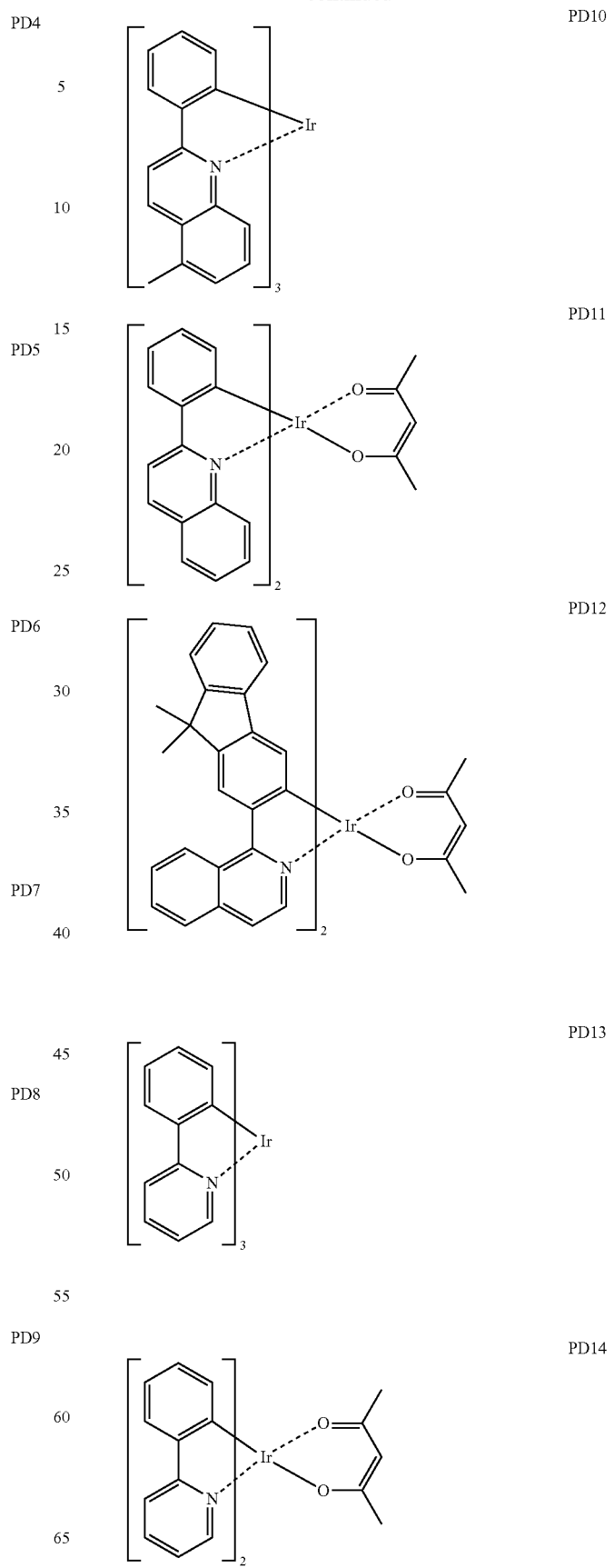

-continued
PD15
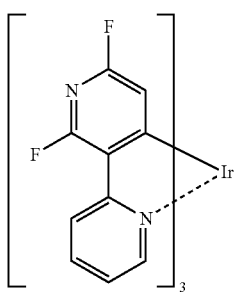
PD16
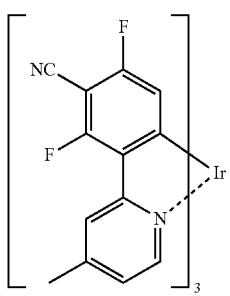
PD17
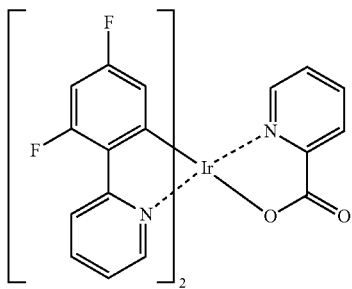
PD18
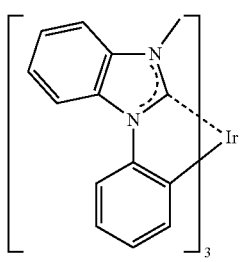
PD19
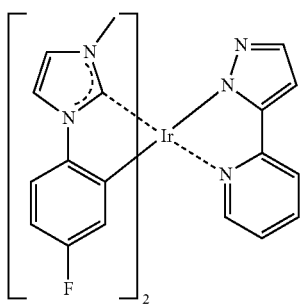
-continued
PD20
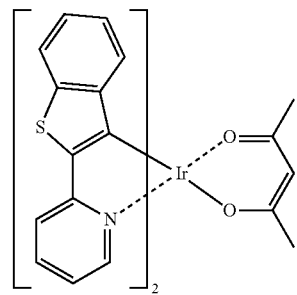
PD21
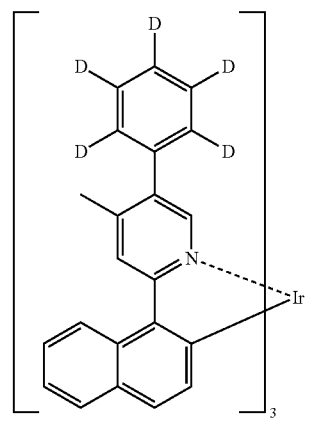
PD22
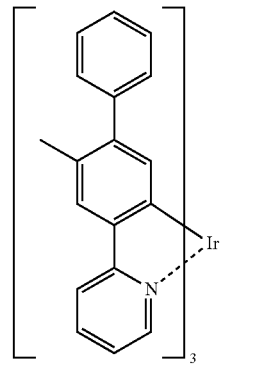
PD23

-continued
PD24
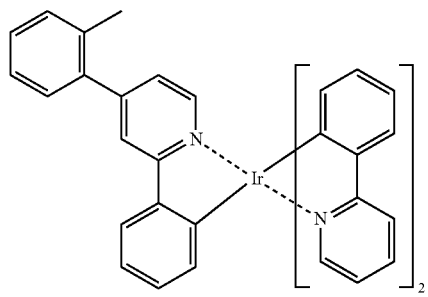
PD25
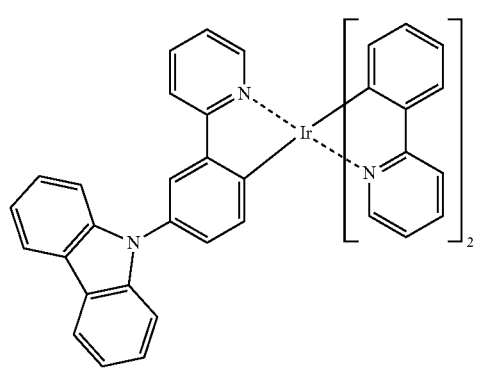
PD26
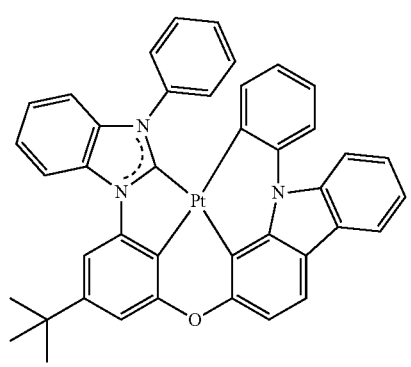
PD27
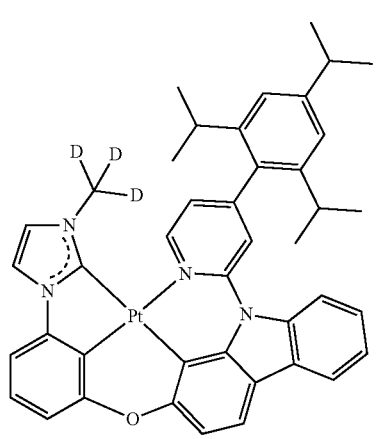
-continued
PD28
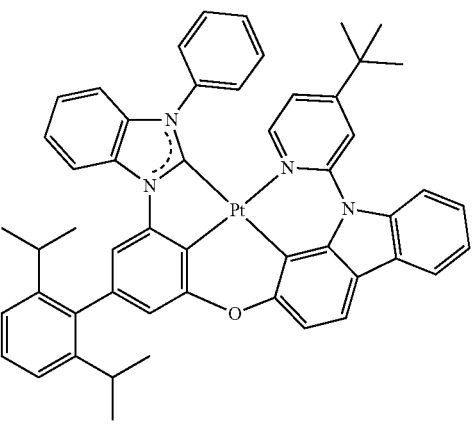
PD29
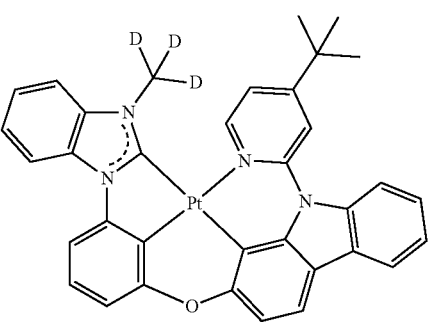
PD30
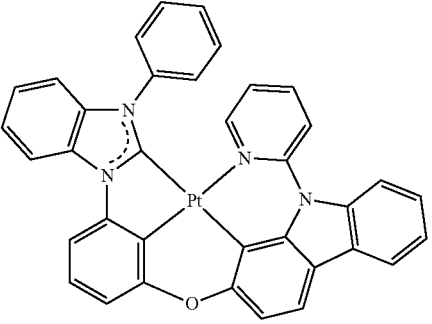
PD31
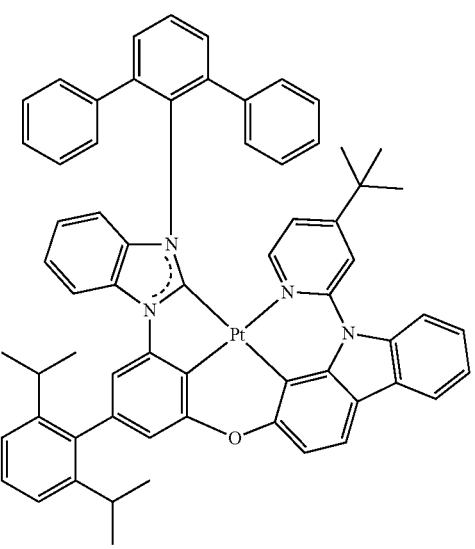

PD32
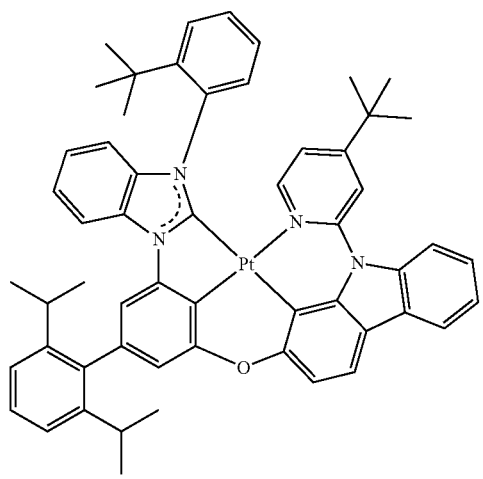
PD35
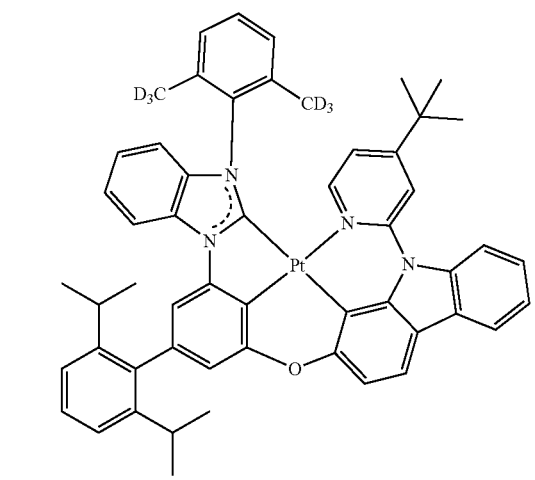
PD33
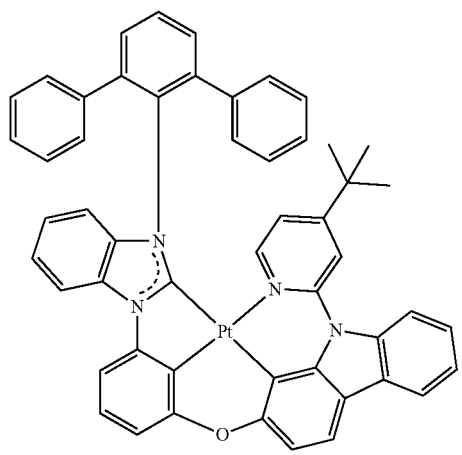
PD36
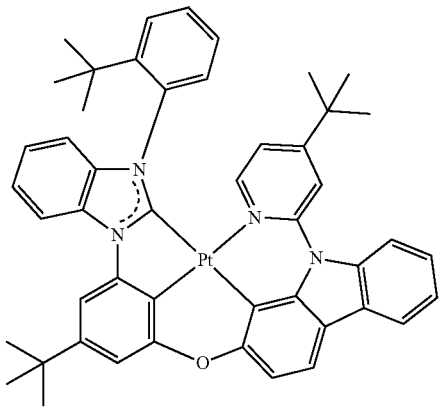
PD34
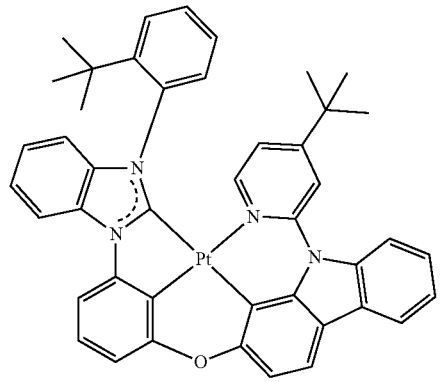
PD37
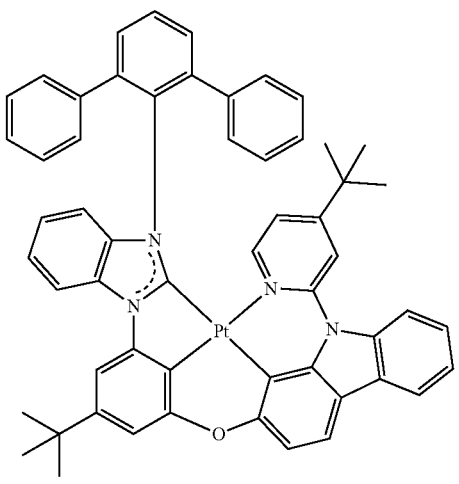

PD38

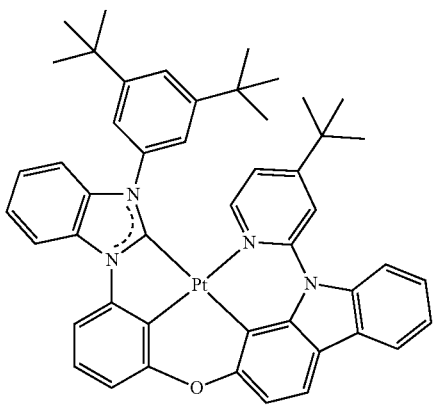

PD39

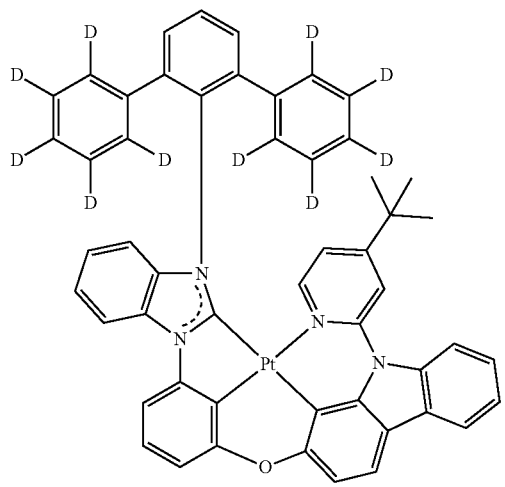

Fluorescent Dopant

The fluorescent dopant may include an amine group-containing compound, a styryl group-containing compound, or any combination thereof.

In an embodiment, the fluorescent dopant may include a compound represented by Formula 501:

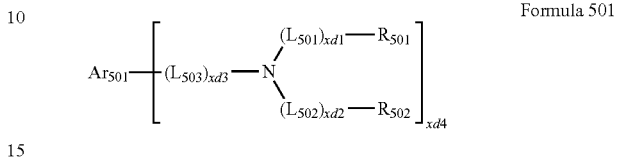

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

In an embodiment, the fluorescent dopant may include: one of Compounds FD1 to FD36; DPVBi; DPAVBi; or any combination thereof:

FD1

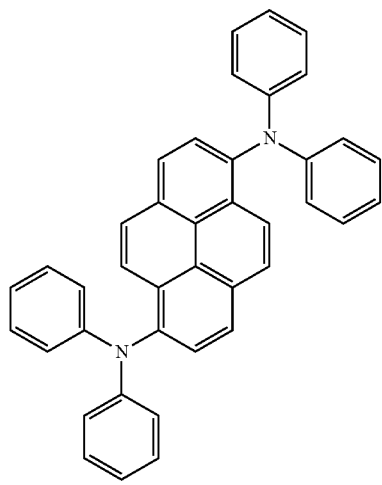

FD2

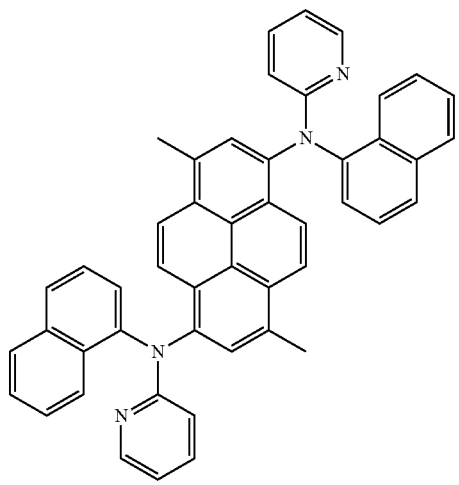

89
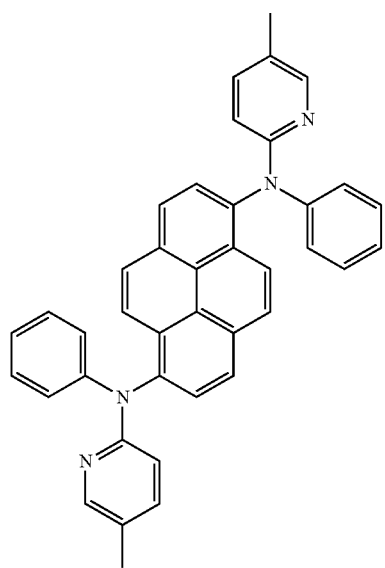
90
-continued
FD3
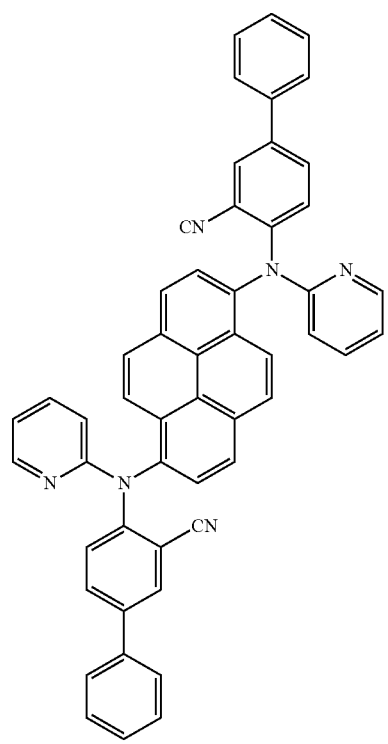
FD4
FD5
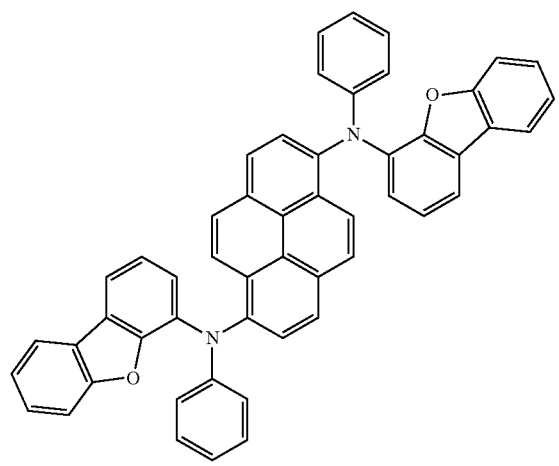
FD6
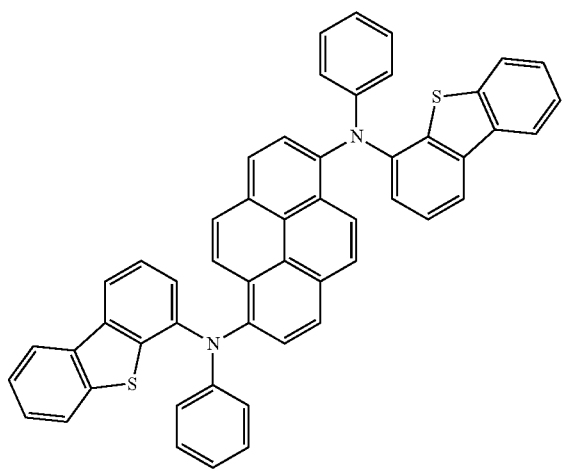

-continued
FD7
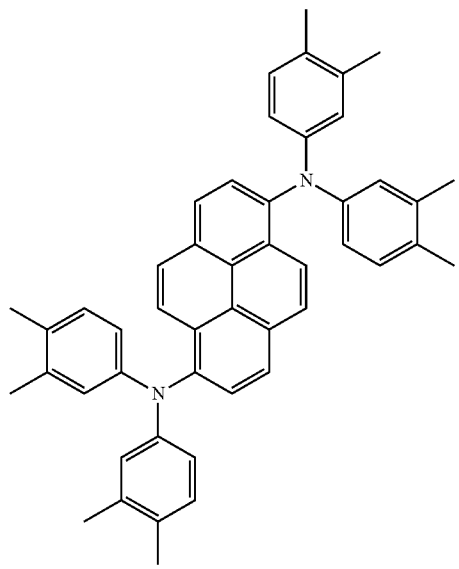
FD8
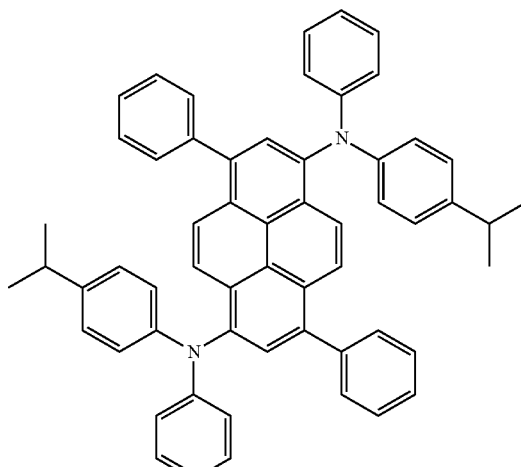
FD9
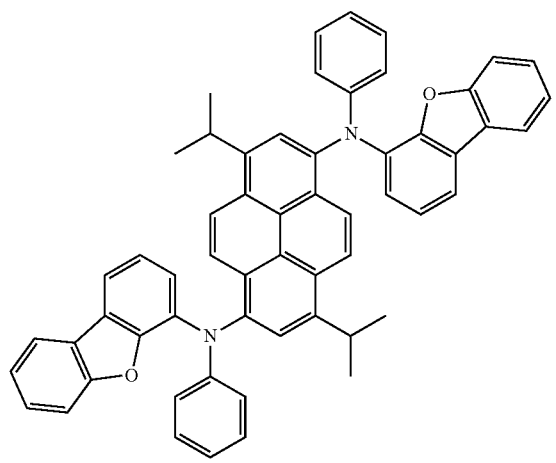
FD10
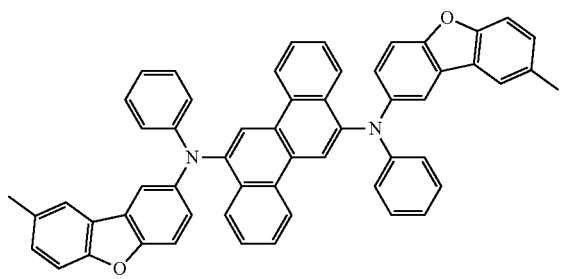
FD11
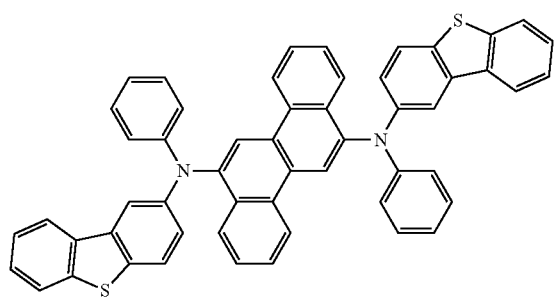
FD12
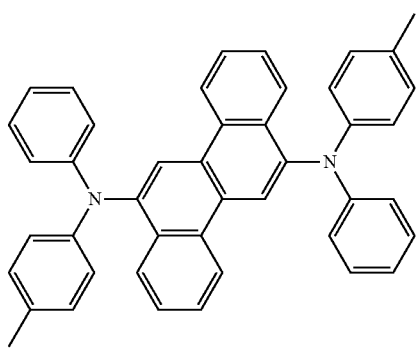

-continued
FD13
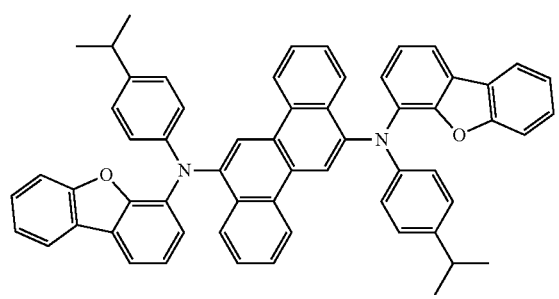
FD14
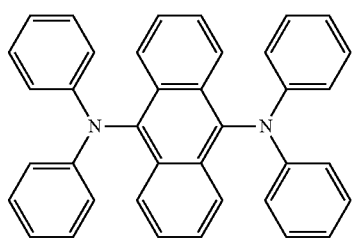
FD15
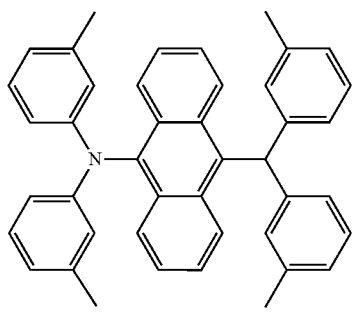
FD16
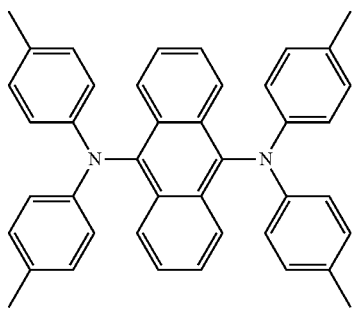
FD17
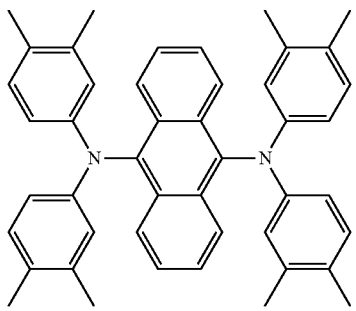
FD18
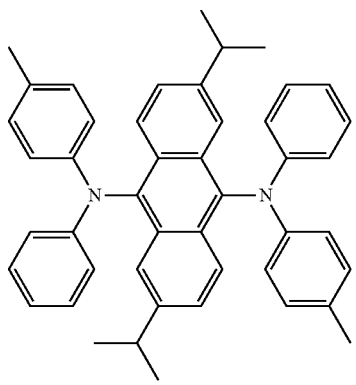
FD19
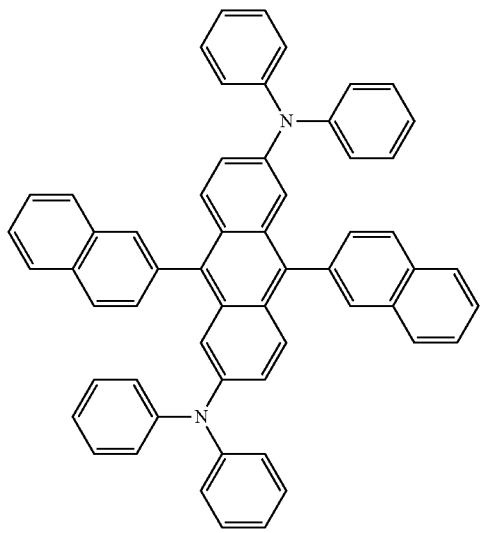
FD20
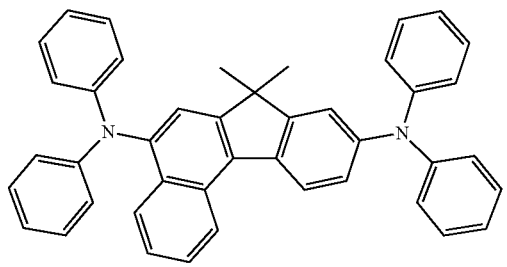

-continued
FD21
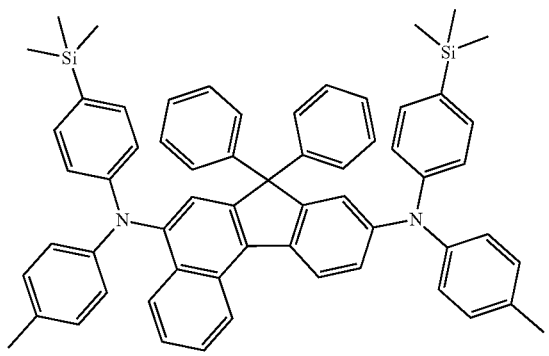
FD22
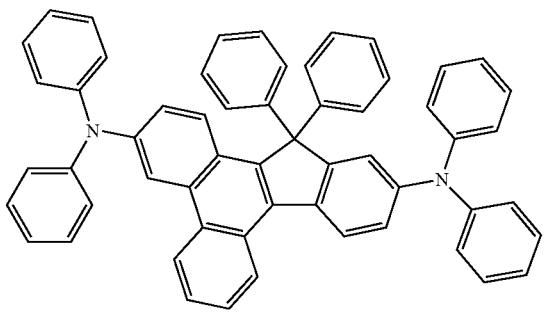
FD23
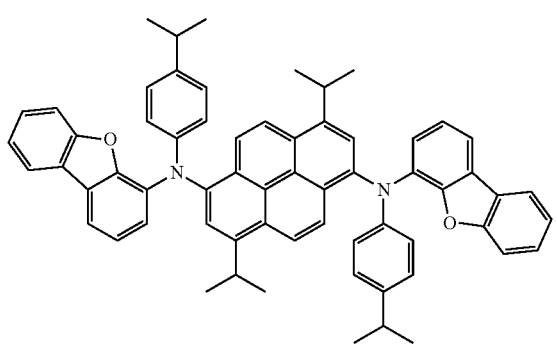
FD24
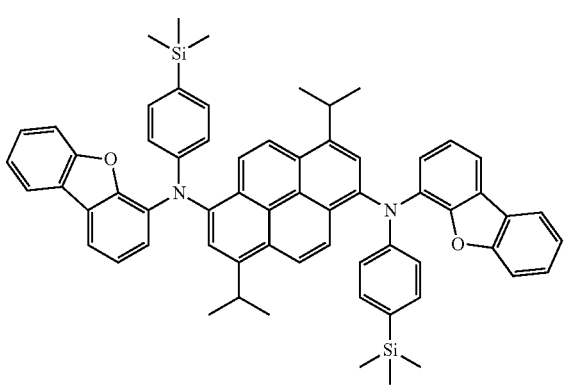
FD25
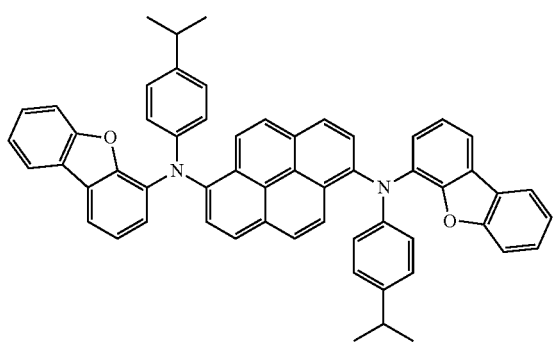
FD26
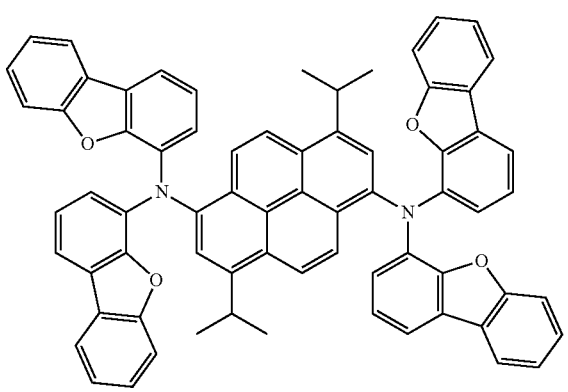
FD27
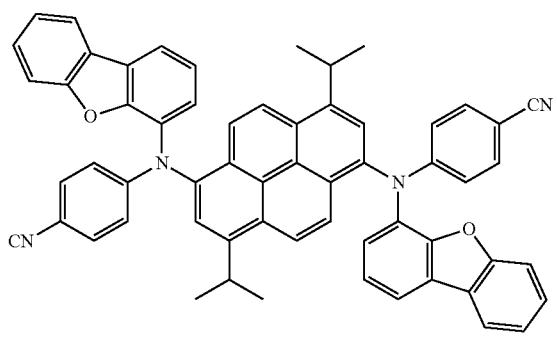
FD28
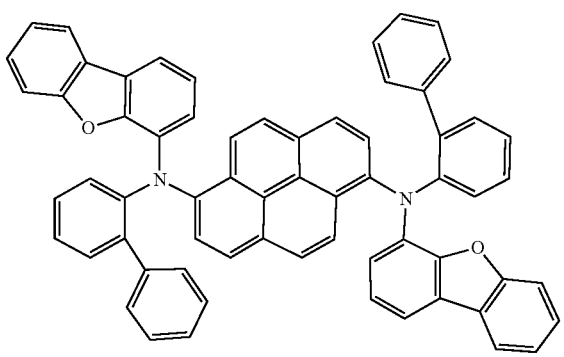

-continued
FD29
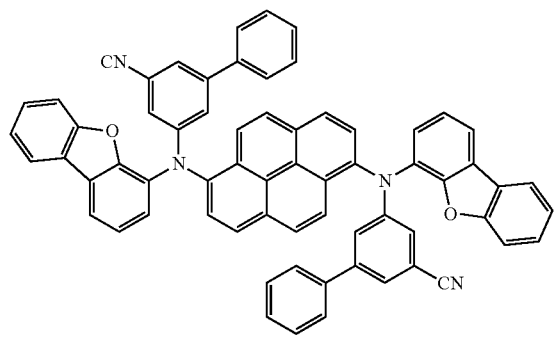
FD30
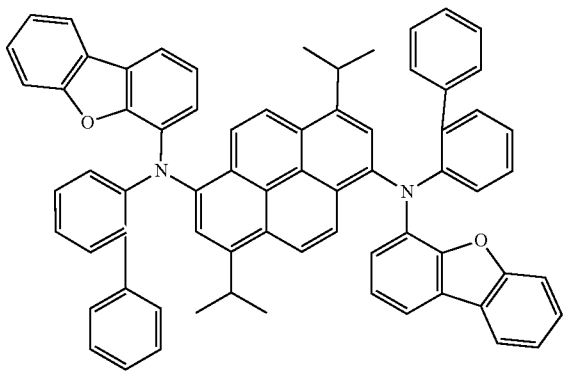
FD31
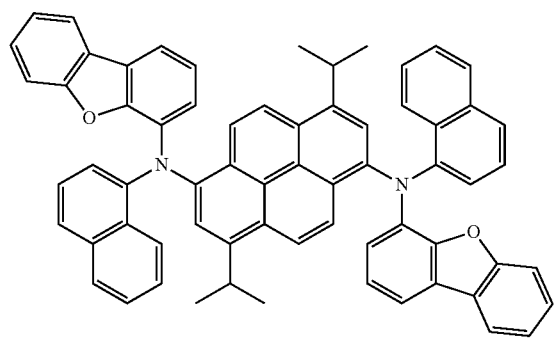
FD32
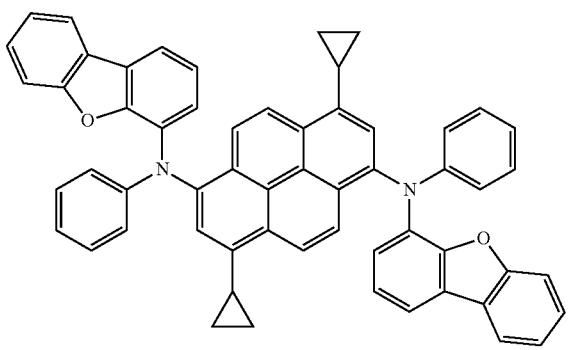
FD33
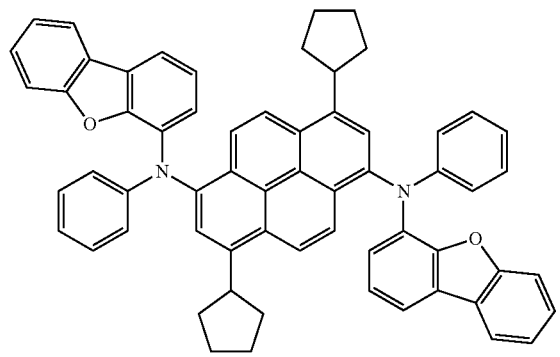
FD34
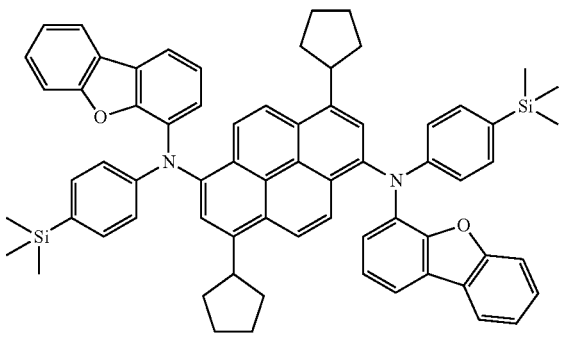
FD35
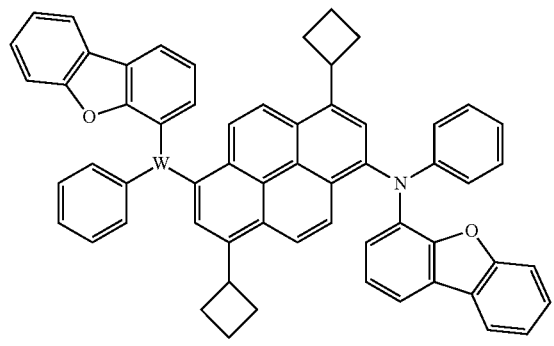
FD36
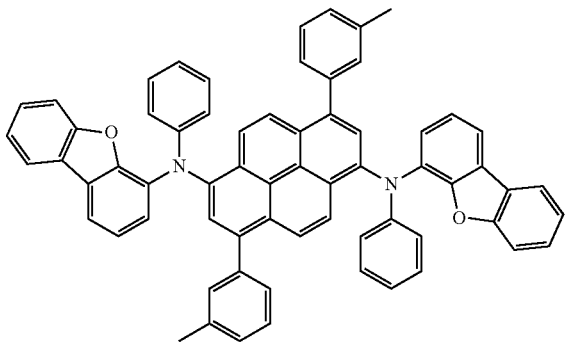

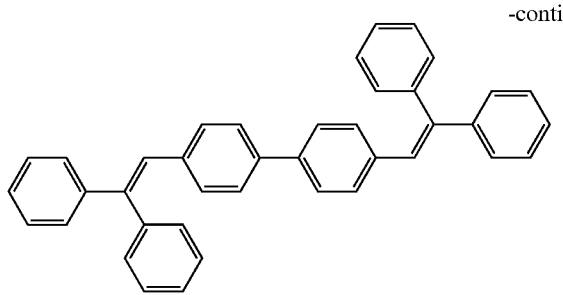

DPVBi

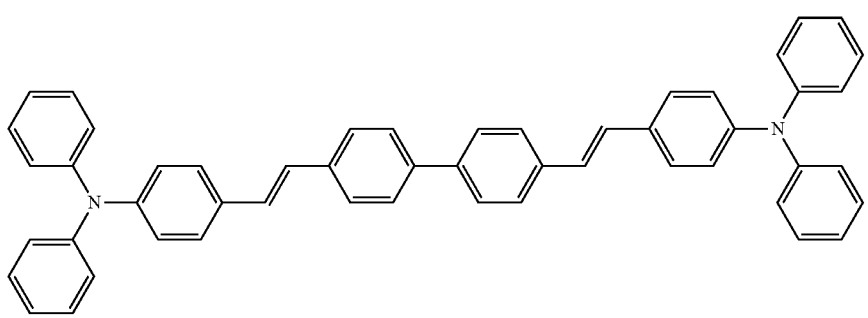

DPAVBi

Delayed Fluorescence Material

The emission layer may include a delayed fluorescence material.

In the present specification, the delayed fluorescence material may be selected from compounds capable of emitting delayed fluorescence based on a delayed fluorescence emission mechanism. The delayed fluorescent material included in the emission layer may act as a host or a dopant depending on the type of other materials included in the emission layer.

In an embodiment, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescent material and the singlet energy level (eV) of the delayed fluorescent material satisfies the above-described range, up-conversion from the triplet state to the singlet state of the delayed fluorescent materials may effectively occur, and thus, the emission efficiency of the light-emitting device 10 may be improved.

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

In an embodiment, the delayed fluorescence material may include at least one of the following compounds DF1 to DF9:

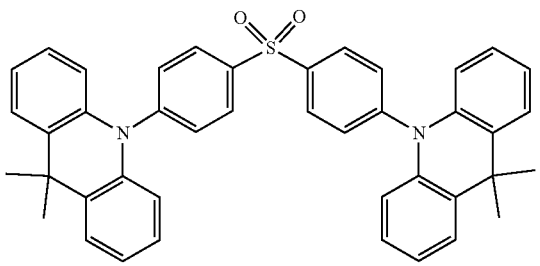

DF1(DMAC-DPS)

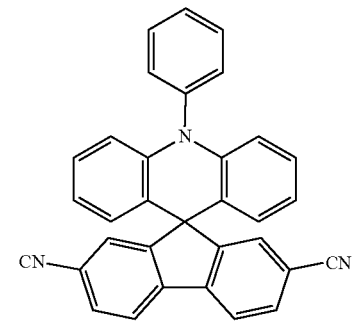

DF2(ACRFLCN)

-continued

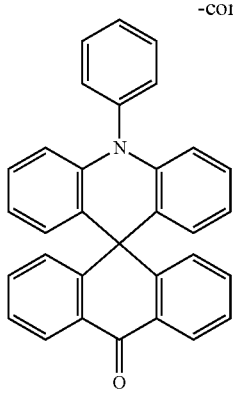
DF3(ACRSA)

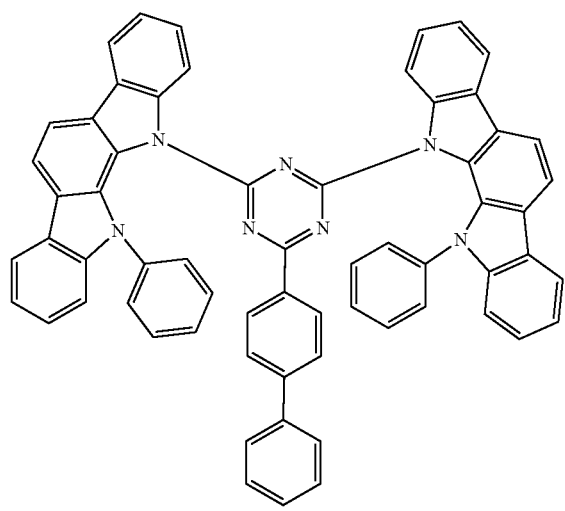
DF4(CC2TA)

-continued

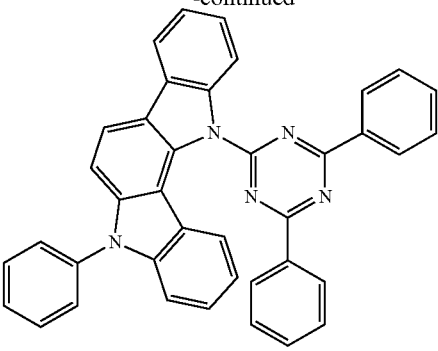
DF6(PIC-TRZ2)

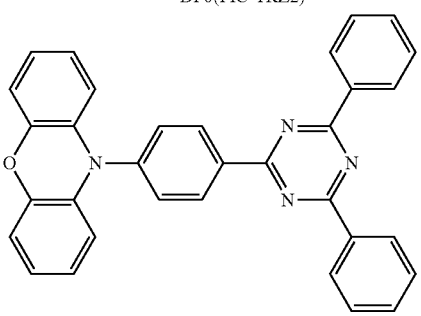
DF7(PXZ-TRZ)

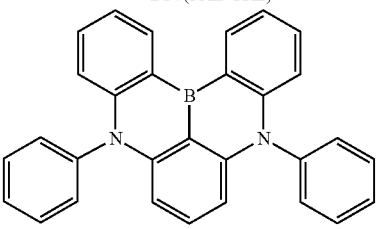
DF8(DABNA-1)

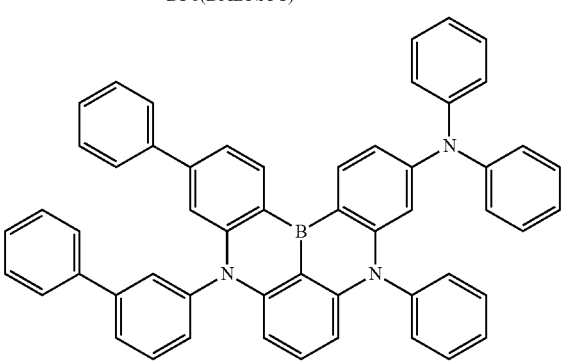
DF9(DABNA-2)

Quantum Dot

The emission layer may include a quantum dot. In the present specification, a quantum dot refers to a crystal of a semiconductor compound, and may include any material capable of emitting light of various emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) or molecular beam epitaxy (MBE), and which requires low costs.

The quantum dot may include Groups II-VI semiconductor compounds, Groups III-V semiconductor compounds, Groups III-VI semiconductor compounds, Group semiconductor compounds, Groups IV-VI semiconductor compounds, a Group IV element or compound; or any combination thereof.

Examples of the Groups II-VI semiconductor compound are a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound are a binary compound, such as GaN, GaP, GaAs, GaSb, AlN, AlP, AlAs, AlSb, InN, InP, InAs, InSb, or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or the like; or any combination thereof. Meanwhile, the Groups III-V semiconductor compound may further include Group II elements. Examples of the Groups III-V further including Group II elements are InZnP, InGaZnP, InAlZnP, etc.

Examples of the Groups III-VI semiconductor compound are a binary compound, such as GaS, GaSe, Ga$_2$Se$_3$, GaTe, InS, InSe, In$_2$S$_3$, In$_2$Se$_3$, or InTe; a ternary compound, such as InGaS$_3$, or InGaSe$_3$; and any combination thereof.

Examples of the Group semiconductor compound are a ternary compound, such as AgInS, AgInS$_2$, CuInS, CuInS$_2$, CuGaO$_2$, AgGaO$_2$, or AgAlO$_2$; or any combination thereof.

Examples of the Group IV-VI semiconductor compound are a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof.

The Group IV element or compound may include a single element compound, such as Si or Ge; a binary compound, such as SiC or SiGe; or any combination thereof.

Each element included in a multi-element compound such as the binary compound, ternary compound, and quaternary compound, may exist in a particle with a uniform concentration or non-uniform concentration.

The quantum dot may have a single structure or a dual core-shell structure. In the case of the quantum dot having a single structure, the concentration of each element included in the corresponding quantum dot is uniform. In an embodiment, the material contained in the core and the material contained in the shell may be different from each other.

The shell of the quantum dot may act as a protective layer to prevent chemical degeneration of the core to maintain semiconductor characteristics and/or as a charging layer to impart electrophoretic characteristics to the quantum dot. The shell may be a single layer or a multi-layer. The interface between the core and the shell may have a concentration gradient that decreases toward the center of the element present in the shell.

Examples of the shell of the quantum dot may be an oxide of metal, metalloid, or non-metal, a semiconductor compound, and any combination thereof. Examples of the oxide of metal, metalloid, or non-metal are a binary compound, such as SiO$_2$, Al$_2$O$_3$, TiO$_2$, ZnO, MnO, Mn$_2$O$_3$, Mn$_3$O$_4$, CuO, FeO, Fe$_2$O$_3$, Fe$_3$O$_4$, CoO, Co$_3$O$_4$, or NiO; a ternary compound, such as MgAl$_2$O$_4$, CoFe$_2$O$_4$, NiFe$_2$O$_4$, or CoMn$_2$O$_4$; and any combination thereof. Examples of the semiconductor compound are, as described herein, Groups II-VI semiconductor compounds; Groups III-V semiconductor compounds; Groups III-VI semiconductor compounds; Group I-III-VI semiconductor compounds; Groups IV-VI semiconductor compounds; and any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less, and within these ranges, color purity or color gamut may be increased. In addition, since the light emitted through the quantum dot is emitted in all directions, the wide viewing angle can be improved.

In addition, the quantum dot may be a spherical particle, a pyramidal particle, a multi-arm particle, a cubic nanoparticle, a nanotube particle, a nanowire particle, a nanofiber particle, or a nanoplate particle.

Since the energy band gap can be adjusted by controlling the size of the quantum dot, light having various wavelength bands can be obtained from the quantum dot emission layer. Therefore, by using quantum dots of different sizes, a light-emitting device that emits light of various wavelengths may be implemented. In one embodiment, the size of the quantum dot may be selected to emit red, green and/or blue light. In addition, the size of the quantum dot may be configured to emit white light by combining light of various colors.

Electron-Transporting Region in Interlayer 130

The electron-transporting region may have: i) a single-layered structure consisting of a single layer consisting of a single material, ii) a single-layered structure consisting of a single layer consisting of a plurality of different materials, or iii) a multi-layered structure including a plurality of layers including different materials.

The electron-transporting region may include a buffer layer, a hole-blocking layer, an electron control layer, an electron-transporting layer, an electron injection layer, or any combination thereof.

In an embodiment, the electron-transporting region may have an electron-transporting layer/electron injection layer structure, a hole-blocking layer/electron-transporting layer/electron injection layer structure, an electron control layer/electron-transporting layer/electron injection layer structure, or a buffer layer/electron-transporting layer/electron injection layer structure, wherein, for each structure, constituting layers are sequentially stacked from an emission layer.

In an embodiment, the electron-transporting region (for example, the buffer layer, the hole-blocking layer, the electron control layer, or the electron-transporting layer in the electron-transporting region) may include a metal-free compound including at least one π electron-deficient nitrogen-containing $C_1$-$C_{60}$ cyclic group.

In an embodiment, the electron-transporting region may include a compound represented by Formula 601 below:

[Ar601]xe11-[(L601)xe1-R601]xe21   Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $Si(Q_{601})(Q_{602})(Q_{603})$, —C(=O)($Q_{601}$), —S(=O)$_2$($Q_{601}$), or —P(=O)($Q_{601}$)($Q_{602}$), wherein $Q_{601}$ to $Q_{603}$ are the same as described in connection with $Q_1$, xe21 may be 1, 2, 3, 4, or 5, at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked via a single bond.

In an embodiment, $Ar_{601}$ in Formula 601 may be a substituted or unsubstituted anthracene group.

In an embodiment, the electron-transporting region may include a compound represented by Formula 601-1:

Formula 601-1

In Formula 601-1, $X_{614}$ may be N or C($R_{614}$), $X_{615}$ may be N or C($R_{615}$), $X_{616}$ may be N or C($R_{616}$), at least one of $X_{614}$ to $X_{616}$ may be N, $L_{611}$ to $L_{613}$ are the same as described in connection with $L_{601}$, xe611 to xe613 are the same as described in connection with xe1, $R_{611}$ to $R_{613}$ are the same as described in connection with $R_{601}$, $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron-transporting region may include one of Compounds ET1 to ET45, 2,9-dimethyl-4,7-diphenyl-1,10-phenanthroline (BCP), 4,7-diphenyl-1,10-phenanthroline (Bphen), Alq$_3$, BAlq, TAZ, NTAZ, or any combination thereof:

ET1

ET2

ET3

ET4
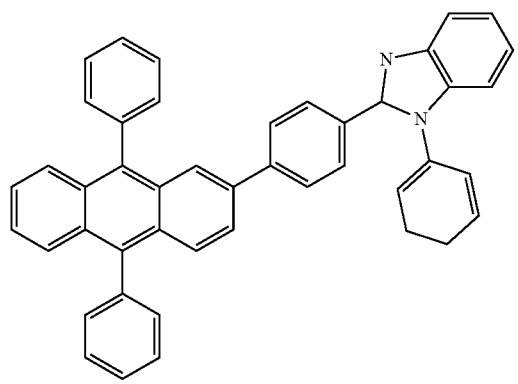
ET5
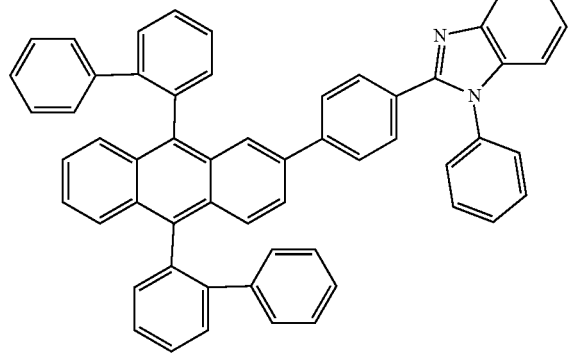
ET6
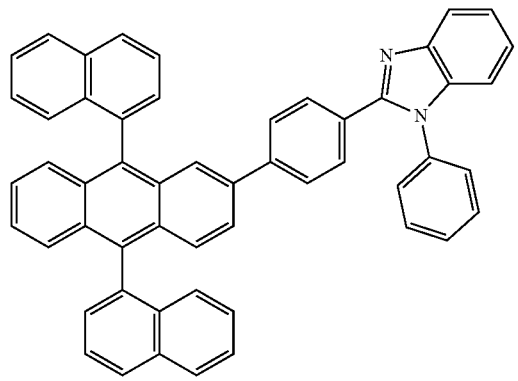
ET7
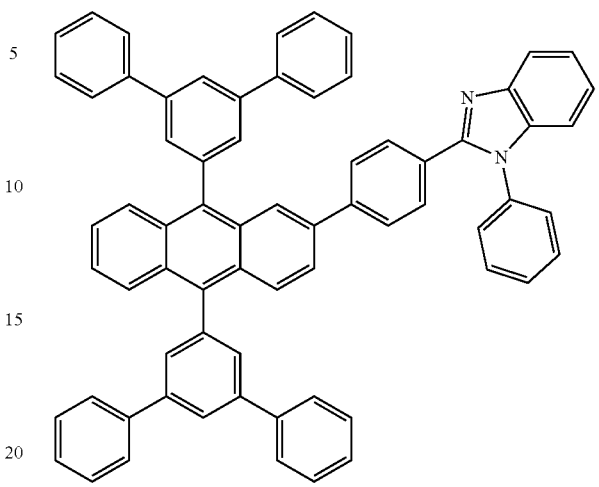
ET8
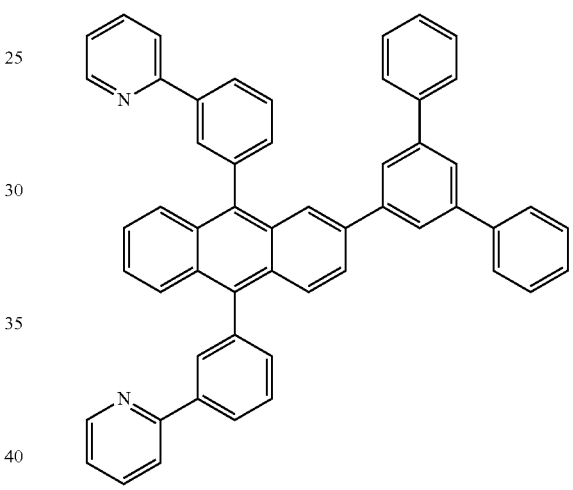
ET9
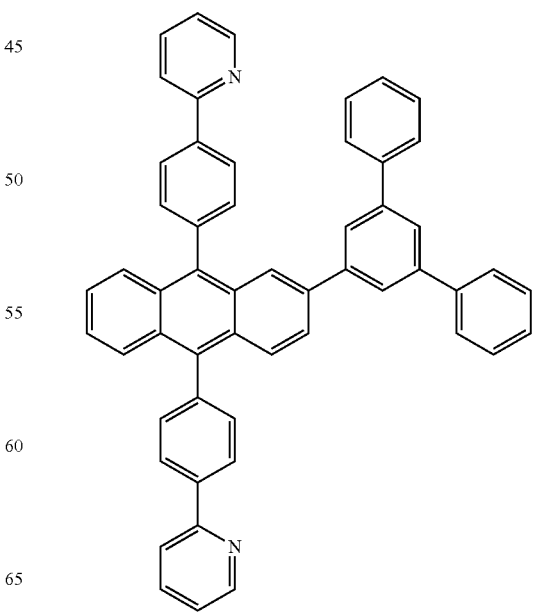

ET10
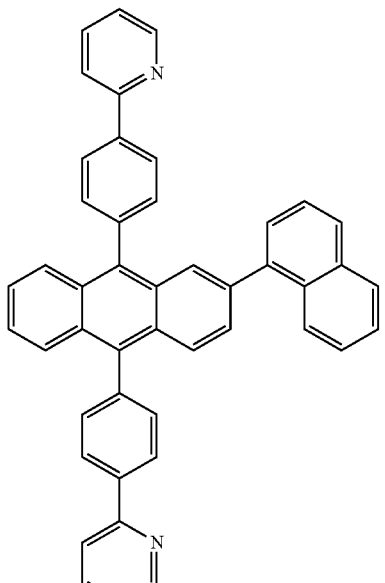
ET11
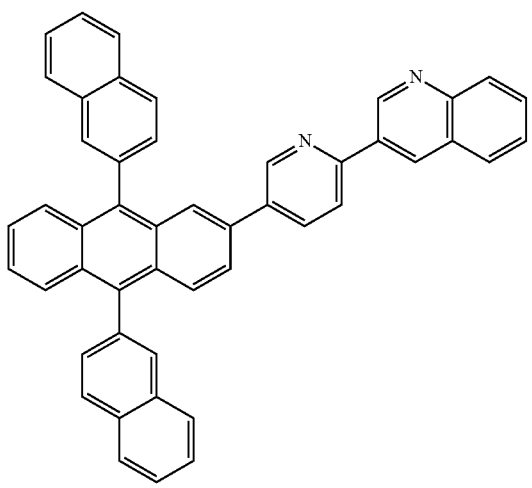
ET12
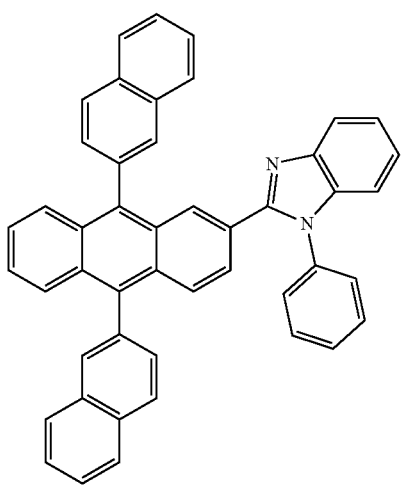
ET13
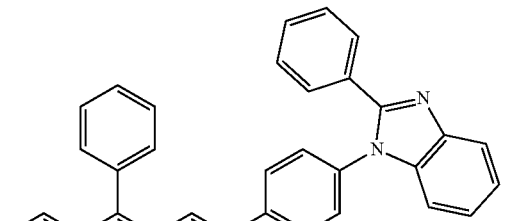
ET14
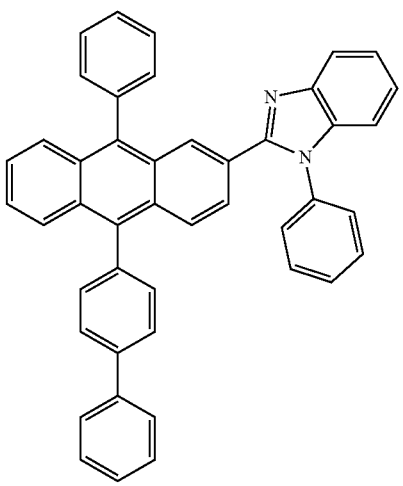
ET15
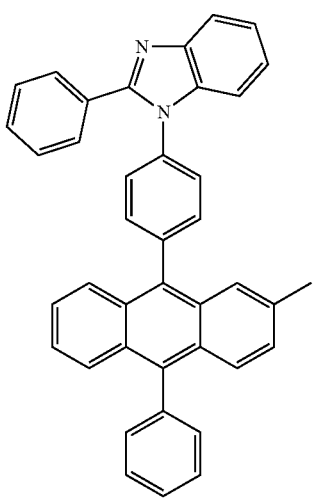

ET16
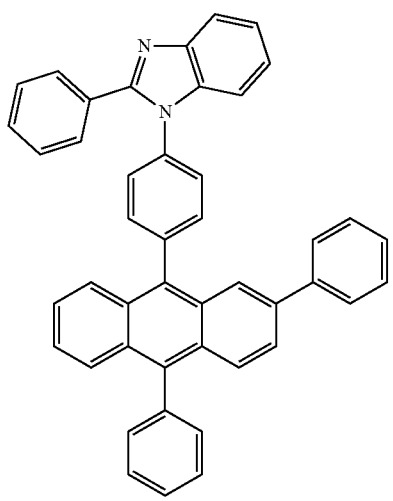
ET19
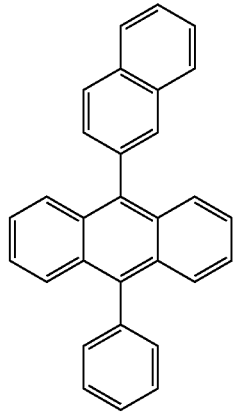
ET17
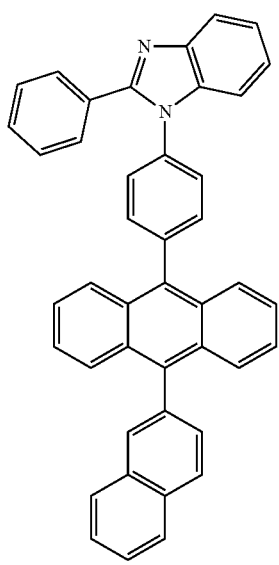
ET20
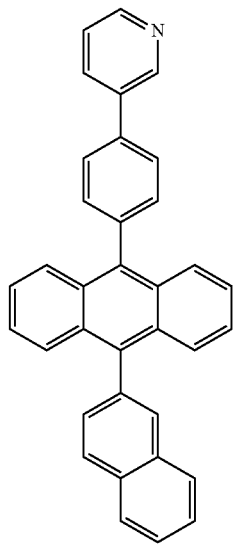
ET18
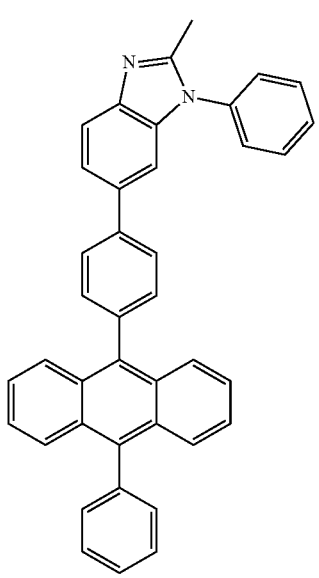
ET21
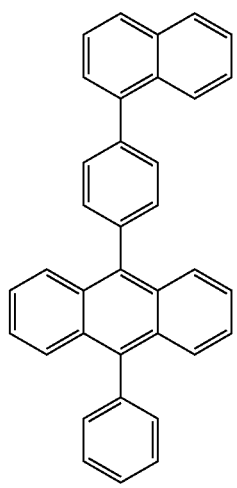

ET22
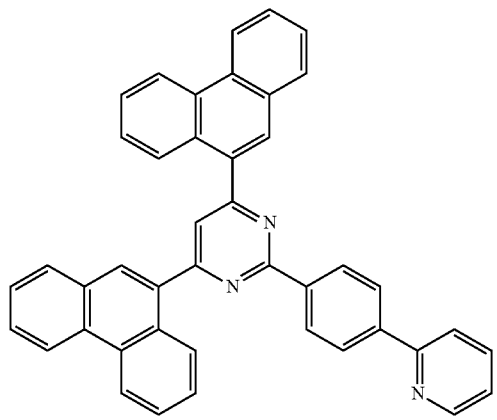
ET23
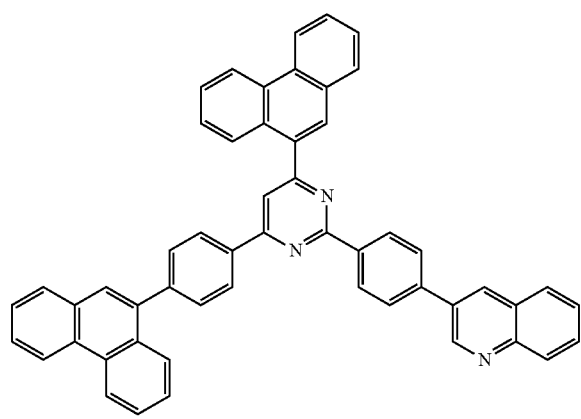
ET24
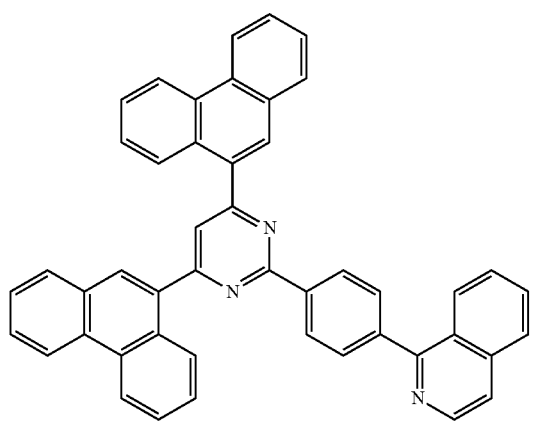
ET25
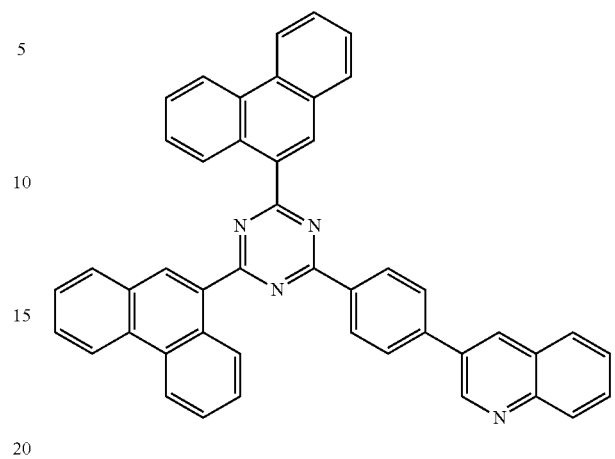
ET26
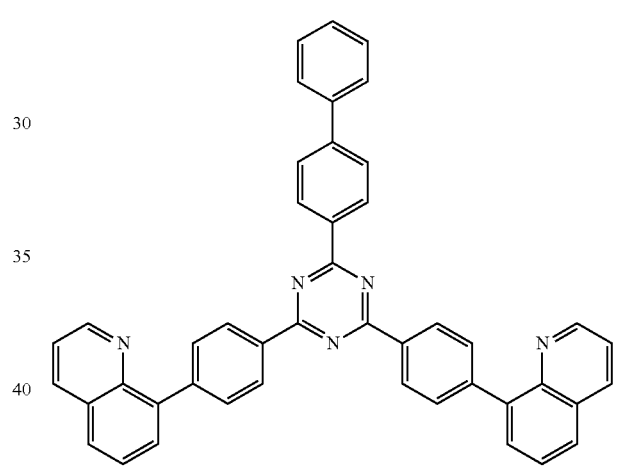
ET27
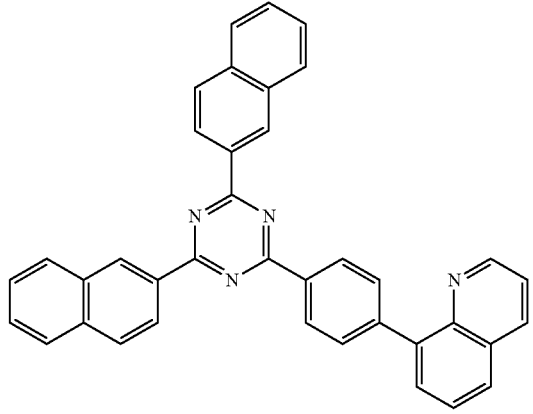

ET28
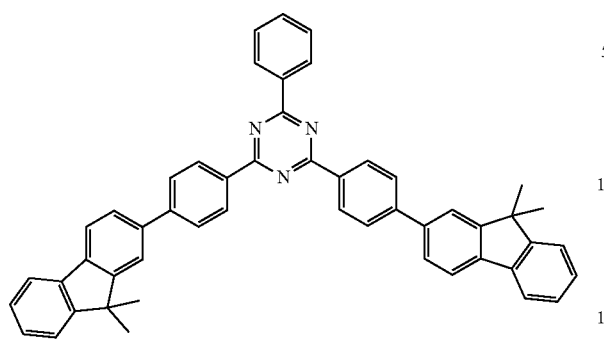
ET29
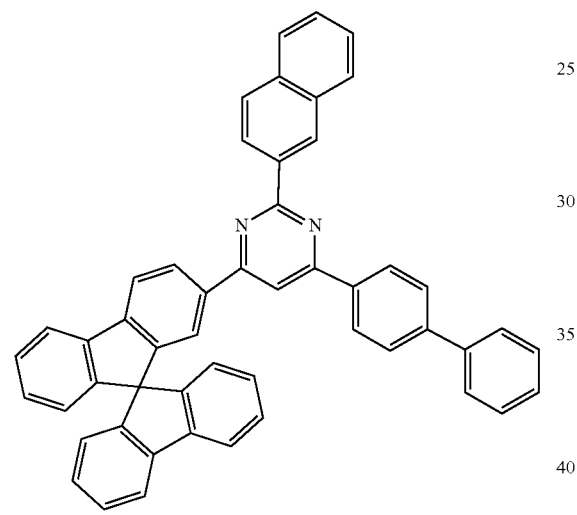
ET30
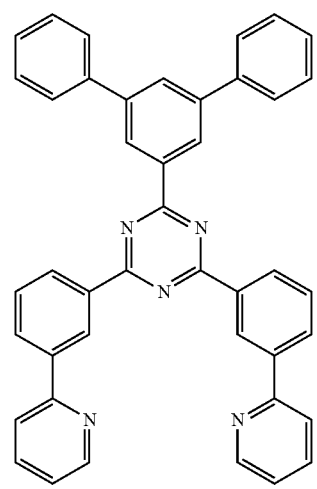
ET31
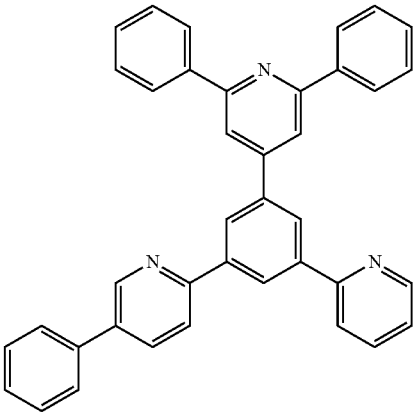
ET32
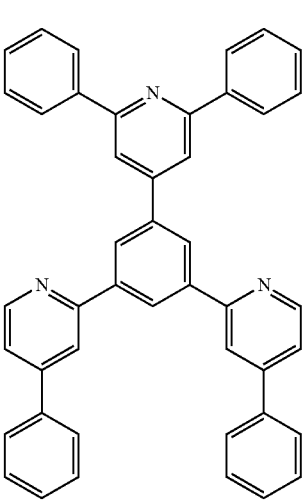
ET33
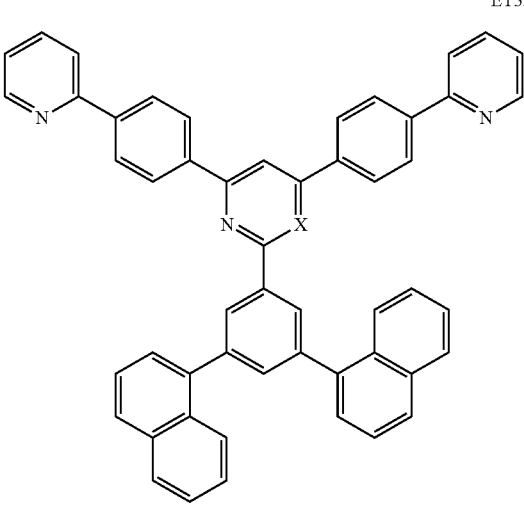

ET34
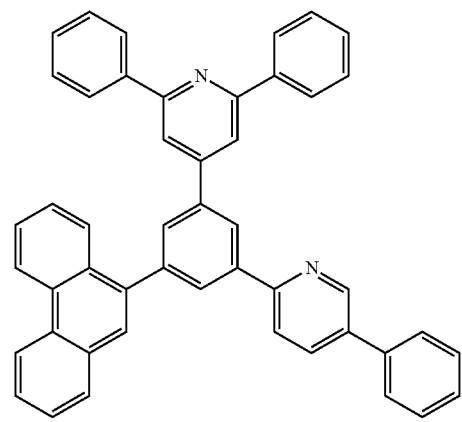
ET35
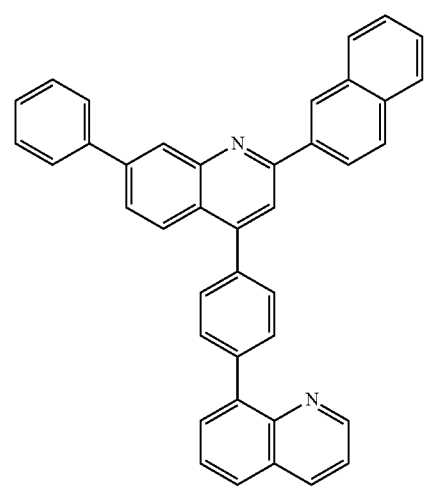
ET36
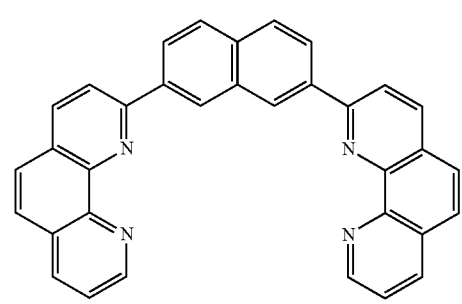
ET37
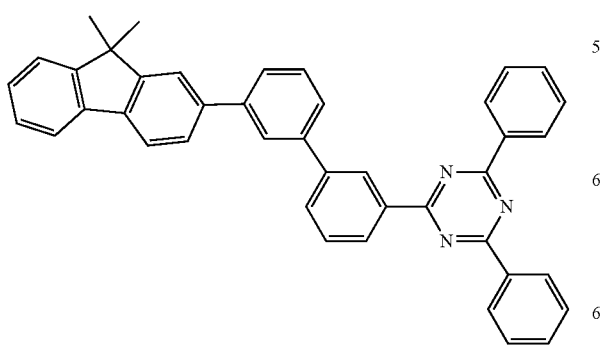
ET38
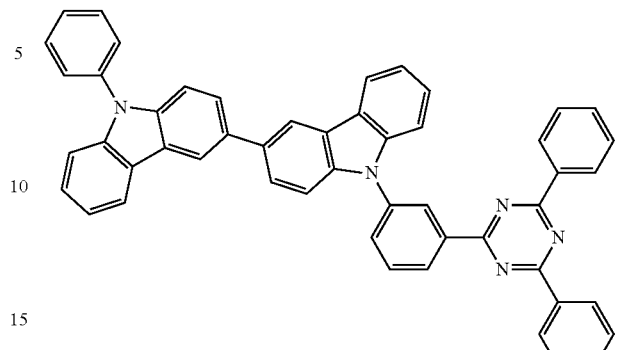
ET39
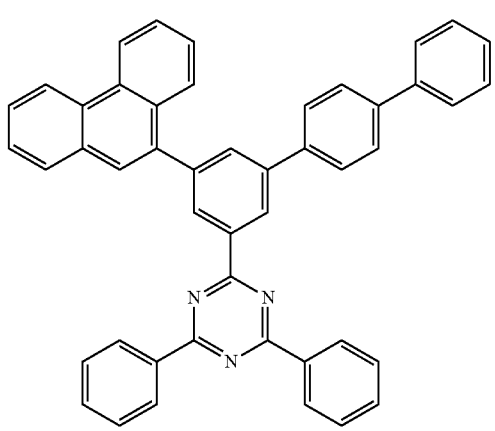
ET40
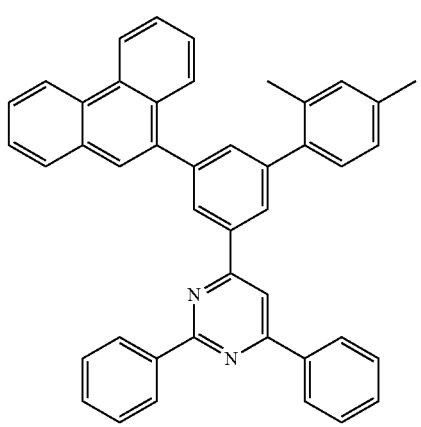

ET41
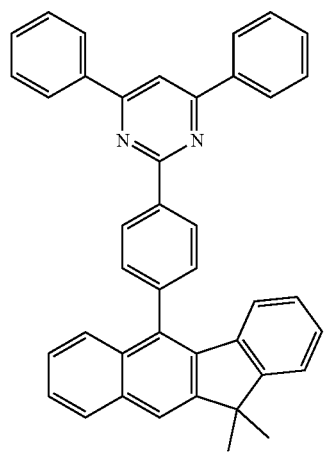
ET44
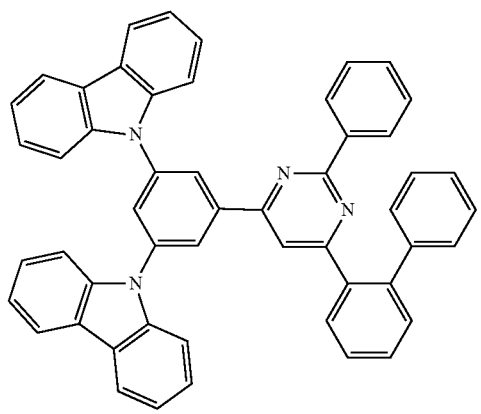
ET45
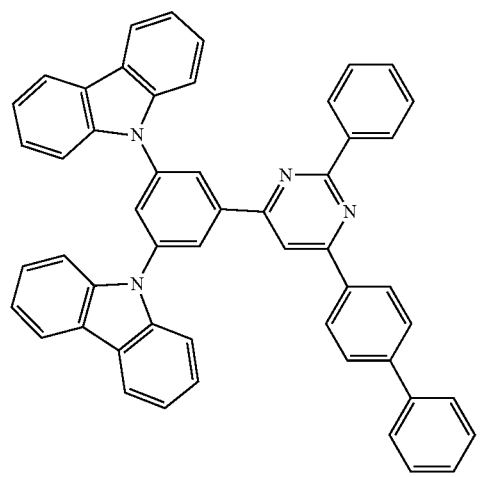
ET42
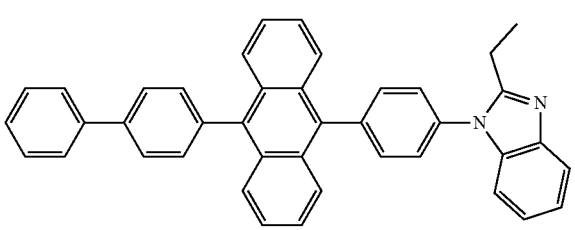
Alq₃
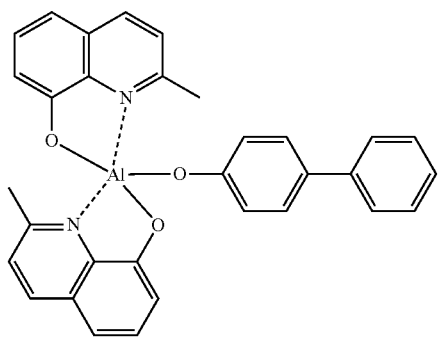
BAlq
ET43
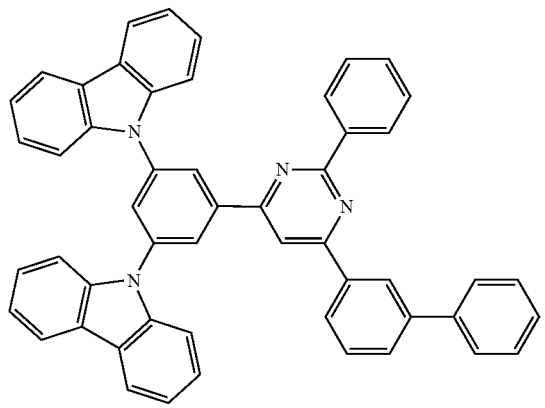
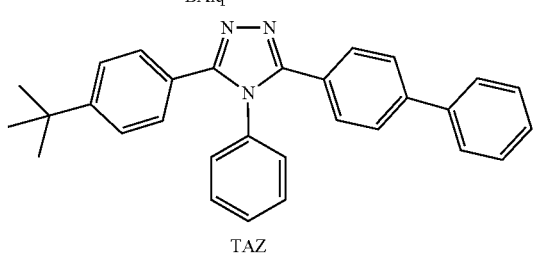
TAZ

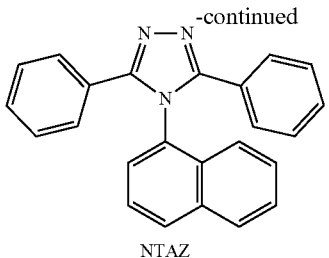

NTAZ

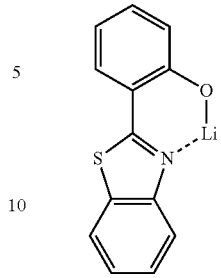

ET-D2

The electron-transporting region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphe- The thickness of the electron-transporting region may be from about 100 Å to about 5,000 Å, for example, from about 160 Å to about 4,000 Å. When the electron-transporting region includes a buffer layer, a hole-blocking layer, an electron control layer, an electron-transporting layer, or any combination thereof, the thickness of the buffer layer, the hole-blocking layer, or the electron control layer may each independently be from about 20 Å to about 1000 Å, for example, about 30 Å to about 300 Å, and the thickness of the electron-transporting layer may be from about 100 Å to about 1000 Å, for example, about 150 Å to about 500 Å. When the thicknesses of the buffer layer, hole-blocking layer, electron control layer, electron-transporting layer and/or electron-transporting layer are within these ranges, satisfactory electron transporting characteristics may be obtained without a substantial increase in driving voltage.

The electron-transporting region (for example, the electron-transporting layer in the electron-transporting region) may further include, in addition to the materials described above, a metal-containing material.

The metal-containing material may include an alkali metal complex, alkaline earth metal complex, or any combination thereof. The metal ion of an alkali metal complex may be a Li ion, a Na ion, a K ion, a Rb ion, or a Cs ion, and the metal ion of alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

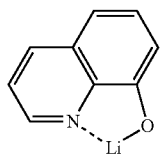

ET-D1 nylpyridine, hydroxyphenyl benzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, an RbI:Yb co-deposited layer, or the like.

When the electron injection layer further includes an organic material, alkali metal, alkaline earth metal, rare earth metal, an alkali metal-containing compound, an alkaline earth metal-containing compound, a rare earth metal-containing compound, alkali metal complex, alkaline earth-metal complex, rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110, and/or a second capping layer may be located outside the second electrode 150. In detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which is a semi-transmissive electrode or a transmissive electrode, and the first capping layer or light generated in an emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one selected from the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In one or more embodiments, at least one of the first capping layer and the second capping layer may each independently include one of Compounds HT28 to HT33, one of Compounds CP1 to CP6, β-NPB, or any combination thereof:

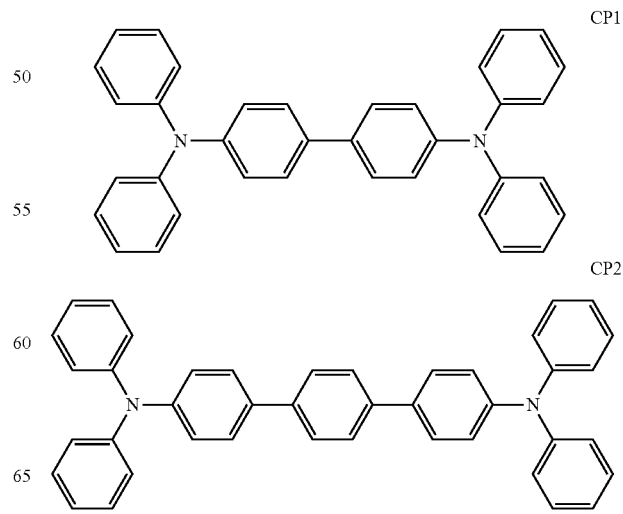

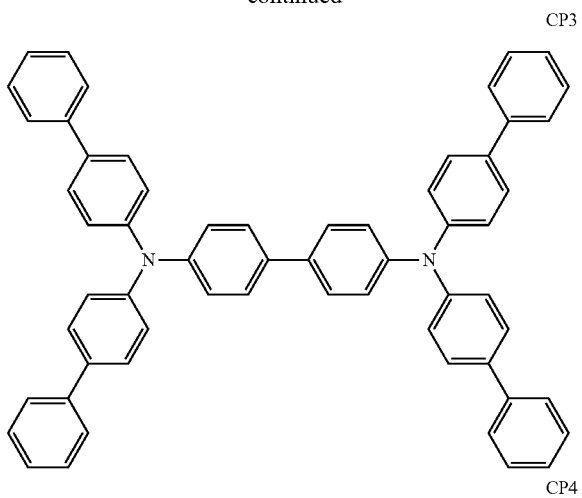

CP3

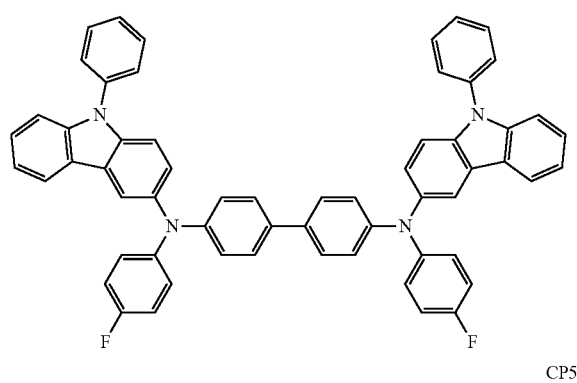

CP4

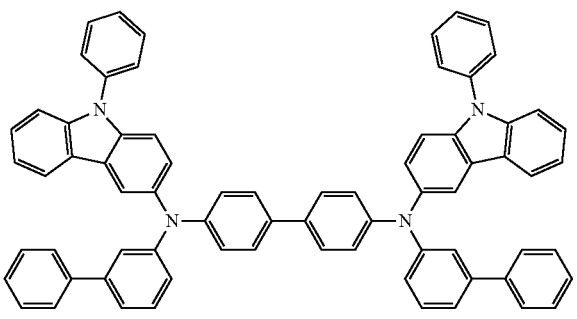

CP5

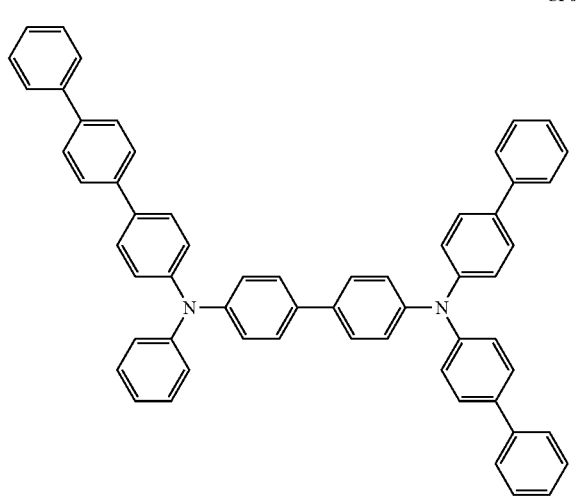

CP6

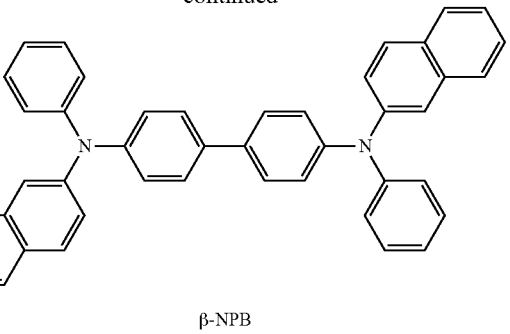

β-NPB

Electronic Apparatus

The light-emitting device may be included in various electronic apparatuses. In an embodiment, the electronic apparatus including the light-emitting device may be a display apparatus, a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, the light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-shielding patterns located among the color filter areas, and the color conversion layer may include a plurality of color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In detail, the first area may include a red quantum dot, the second area may include a green quantum dot, and the third area may not include a quantum dot. The quantum dot is the same as described in the present specification. The first area, the second area, and/or the third area may each include a scatter.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. In detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulating film, etc.

The activation layer may include crystalline silicon, amorphous silicon, organic semiconductor, oxide semiconductor, or the like.

The electronic apparatus may further include a sealing portion for sealing the light-emitting device. The sealing portion and/or the color conversion layer may be placed between the color filter and the light-emitting device. The sealing portion allows light from the light-emitting device to be extracted to the outside, while simultaneously preventing ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
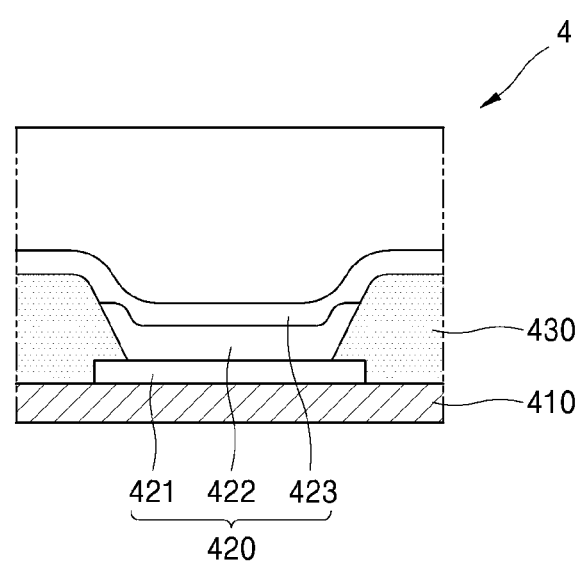
FIG. 2 is a schematic view of a light-emitting device according to an embodiment.

FIG. 2 is a cross-sectional view showing a light-emitting apparatus according to an embodiment of the present disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel defining layer 290 containing an insulating material may be located on the first electrode 110. The pixel defining layer 290 exposes a region of the first electrode 110, and an interlayer 130 may be formed in the exposed region of the first electrode 110. The pixel defining layer 290 may be a polyimide or polyacrylic organic film. Although not shown in FIG. 2, at least some layers of the interlayer 130 may extend beyond the upper portion of the pixel defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyl disiloxane, an acrylic resin (for example, polymethyl methacrylate, polyacrylic acid, or the like), an epoxy-based resin (for example, aliphatic glycidyl ether (AGE), or the like), or a combination thereof; or a combination of the inorganic film and the organic film.

FIG. 3 shows a cross-sectional view showing a light-emitting apparatus according to an embodiment of the present disclosure.

The light-emitting apparatus of FIG. 3 is the same as the light-emitting apparatus of FIG. 2, except that a light-shielding pattern 500 and a functional region 400 are additionally located on the encapsulation portion 300. The functional region 400 may be a combination of i) a color filter area, ii) a color conversion area, or iii) a combination of the color filter area and the color conversion area. In an embodiment, the light-emitting device included in the light-emitting apparatus of FIG. 3 may be a tandem light-emitting device.

Manufacture Method

Respective layers included in the hole-transporting region, the emission layer, and respective layers included in the electron-transporting region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole-transporting region, an emission layer, and layers constituting the electron-transporting region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group has 3 to 61 ring-forming atoms.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which at least one group T3 and at least one group T1 are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more group T4 are condensed with each other, iii) a condensed cyclic group in which at least one group T4 and at least one group T1 are condensed with each other, iv) a condensed cyclic group in which at least one group T4 and at least one group T3 are condensed with each other, or v)

a condensed cyclic group in which at least one group T4, at least one group T1, and at least one group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1] heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group condensed to any cyclic group or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group.

The term "$C_1$-$C_{60}$ alkylene group" as used herein refers to a divalent group having a similar carbon structure as a corresponding $C_1$-$C_{60}$ alkyl group defined above.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having a similar carbon structure as a corresponding $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having a similar carbon structure as a corresponding $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo [2.2.1]heptyl group), a bicyclo[1.1.1]pentyl group, a bicyclo [2.1.1]hexyl group, and a bicyclo[2.2.2]octyl group. The term "$C_3$-$C_{10}$ cycloalkylene group" as used herein refers to a divalent group having a similar carbon structure as a corresponding $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a similar carbon structure as a corresponding $C_1$-$C_{10}$ heterocycloalkyl group.

The term $C_3$-$C_{10}$ cycloalkenyl group used herein refers to a monovalent cyclic group that has three to ten carbon atoms and at least one carbon-carbon double bond in the ring thereof and no aromaticity, and examples thereof are a cyclopentenyl group, a cyclohexenyl group, and a cycloheptenyl group. The term "$C_3$-$C_{10}$ cycloalkenylene group" as used herein refers to a divalent group having a similar carbon structure as a corresponding $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a similar carbon structure as a corresponding $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom other than carbon atoms, as a ring-forming atom, and non-aromaticity in its entire molecular structure. Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic heterocondensed polycyclic group" as used herein refers to a divalent group having a similar carbon structure as a corresponding monovalent non-aromatic heterocondensed polycyclic group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$C_7$-$C_{60}$ aryl alkyl group" used herein refers to -$A_{104}A_{105}$ (where $A_{104}$ may be a $C_1$-$C_{54}$ alkylene group, and $A_{105}$ may be a $C_6$-$C_{59}$ aryl group), and the term $C_2$-$C_{60}$ heteroaryl alkyl group" used herein refers to -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted or unsubstituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each substituted or unsubstituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "hetero atom" as used herein refers to any atom other than a carbon atom. Examples of the heteroatom are O, S, N, P, Si, B, Ge, Se, and any combination thereof.

The term "the third-row transition metal" used herein includes hafnium (Hf), tantalum (Ta), tungsten(W), rhenium (Re), osmium (Os), iridium (Ir), platinum (Pt), gold (Au), etc.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group." A "biphenyl-like group" is a substituted phenyl group having a $C_6$-$C_{60}$ aryl group as a substituent.

The term "terphenyl group" as used herein refers to "a phenyl group substituted with a biphenyl group". A "terphenyl-like group" is a substituted phenyl group having, as a substituent, a $C_6$-$C_{60}$ aryl group that is further substituted with a $C_6$-$C_{60}$ aryl group.

* and *' as used herein, unless defined otherwise, each refer to a binding site to a neighboring atom in a corresponding formula or moiety.

EXAMPLES

Examples 1-1, 2-1, and 3-1 and Comparative Example 1

The ink compositions of Examples 1-1, 2-1, and 3-1 and Comparative Example 1 were prepared according to the compositions listed in Table 1 below. Next, adhesive values as measured according to method B in ASTM D3359 with respect to 10 μm films formed by exposing the compositions to a light exposure dose of 3J are shown in Table 1 below.

TABLE 1

| | | Example 1-1 | Example 2-1 | Example 3-1 | Comparative Example 1 |
|---|---|---|---|---|---|
| Composition (parts by weight) | First monomer: 1,6-hexanediol diacrylate (HDDA) | 30 | 35 | 35 | 50 |
| | Second monomer: ethyl acrylate | 12 | 15 | 0 | 0 |
| | Third monomer: ehyl methacrylate | 8 | 0 | 15 | 0 |
| | Photopolymerization initiator: Irgacure 819 | 1 | 1 | 1 | 1 |
| | Scatterer: TiO$_2$ | 4 | 4 | 4 | 4 |
| | Green quantum dot | 45 | 45 | 45 | 45 |
| Method B in ASTM D3359 | | 4B | 4B | 4B | 0B |

Referring to Table 1, it can be seen that the ink compositions of Examples 1-1, 2-1, and 3-1 showed an increased adhesive force.

Examples 1-1, 2-1, and 3-1 and Comparative Example 1

The ink compositions of Examples 1-1 to 1-4, 2-1 to 2-4, 3-1 to 3-4 and Comparative Example 1 were prepared according to the compositions listed in Tables 2 to 4. Next, the adhesive force and the peel-off force were measured, with respect to a 10 μm film formed by exposing the compositions to the light exposure dose of 3J, using a multi-axis fine adhesive force measuring instrument (TXA™, Precise Adhesion Testing Equipment, Ball Probe Tack Tester), and the results are shown in Tables 2 to 4.

TABLE 2

| | | Example 1-1 | Example 1-2 | Example 1-3 | Example 1-4 | Comparative Example 1 |
|---|---|---|---|---|---|---|
| Composition (parts by weight) | First monomer: 1,6-hexanediol diacrylate (HDDA) | 16.7 | 30 | 30 | 35 | 50 |
| | Second monomer: ethyl acrylate | 16.7 | 8 | 12 | 10 | 0 |
| | Third monomer: ethyl methacrylate | 16.7 | 12 | 8 | 10 | 0 |
| | Photopolymerization initiator: Irgacure 819 | 1 | 1 | 1 | 1 | 1 |
| | Scatterer: TiO$_2$ | 4 | 4 | 4 | 4 | 4 |
| | Green quantum dot | 45 | 45 | 45 | 40 | 45 |
| Adhesive force (kg f) | | 0.21 | 0.25 | 0.26 | 0.23 | 0.11 |
| Peel-off force (kgf)(kgf) | | 0.32 | 0.32 | 0.37 | 0.22 | 0.07 |

TABLE 3

| | | Example 2-1 | Example 2-2 | Example 2-3 | Example 2-4 | Comparative Example 1 |
|---|---|---|---|---|---|---|
| Composition (parts by weight) | First monomer: 1,6-hexanediol diacrylate (HDDA) | 25 | 30 | 35 | 35 | 50 |
| | Second monomer: ethyl acrylate | 25 | 20 | 15 | 20 | 0 |
| | Third monomer: ethyl methacrylate | 0 | 0 | 0 | 0 | 0 |
| | Photopolymerization initiator: Irgacure 819 | 1 | 1 | 1 | 1 | 1 |
| | Scatterer: $TiO_2$ | 4 | 4 | 4 | 4 | 4 |
| | Green quantum dot | 45 | 45 | 45 | 40 | 45 |
| Adhesive force (kgf) | | 0.18 | 0.21 | 0.20 | 0.16 | 0.11 |
| Peel-off force (kgf)(kgf) | | 0.10 | 0.08 | 0.10 | 0.08 | 0.047 |

TABLE 4

| | | Example 3-1 | Example 3-2 | Example 3-3 | Example 3-4 | Comparative Example 1 |
|---|---|---|---|---|---|---|
| Composition (parts by weight) | First monomer: 1,6-hexanediol diacrylate (HDDA) | 25 | 30 | 35 | 35 | 50 |
| | Second monomer: ethyl acrylate | 0 | 0 | 0 | 0 | 0 |
| | Third monomer: ethyl methacrylate | 25 | 20 | 15 | 20 | 0 |
| | Photopolymerization initiator: Irgacure 819 | 1 | 1 | 1 | 1 | 1 |
| | Scatterer: $TiO_2$ | 4 | 4 | 4 | 4 | 4 |
| | Green quantum dot | 45 | 45 | 45 | 40 | 45 |
| Adhesive force (kgf) | | 0.19 | 0.24 | 0.21 | 0.21 | 0.11 |
| Peel-off force (kgf)(kgf) | | 0.22 | 0.19 | 0.22 | 0.13 | 0.07 |

From a review of the property data of Tables 2 to 4, the films of the Examples have greater adhesive force and peel-off force than the film of Comparative Example 1. That is, when the ink composition according to the present disclosure is used in an electronic apparatus, the obtained electronic apparatus has improved reliability.

According to an embodiment of the present disclosure, a highly efficient flexible electronic apparatus can be provided. The scope of the present disclosure is not limited by such effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An ink composition comprising:
a first di(meth)acrylate monomer including two photofunctional groups and a first carbon-containing chain, wherein the first di(meth)acrylate monomer is represented by Formula 1;

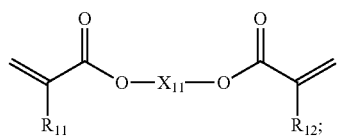

Formula 1 and
a second monofunctional monomer including one photofunctional group and a second carbon-containing chain, wherein the second monofunctional monomer is represented by Formula 2;

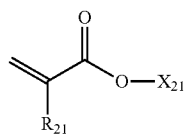

Formula 2 wherein, in Formula 1 and Formula 2, $R_{11}$, $R_{12}$ and $R_{21}$ are each independently hydrogen or a methyl group;

$X_{11}$ is an unsubstituted $C_1$-$C_{10}$ alkylene group, a $C_1$-$C_7$ alkylene group substituted with deuterium, a hydroxy group, or a $C_1$-$C_3$ alkyl group; and $X_{21}$ is an unsubstituted $C_1$-$C_{10}$ alkyl group, a $C_1$-$C_7$ alkyl group substituted with deuterium, a hydroxy group, or a $C_1$-$C_3$ alkyl group; and semiconductor nanoparticles;

wherein an amount of the first di(meth)acrylate monomer is from 25 parts by weight to 35 parts by weight, an amount of the second monofunctional monomer of Formula 2 is from 8 parts by weight to 25 parts by weight, and an amount of the semiconductor nanoparticles is from 40 parts by weight to 45 parts by weight, based on 100 parts by weigh of the ink composition.

2. The ink composition of claim 1, wherein $X_{11}$ is an unsubstituted $C_1$-$C_{10}$ alkylene group, or a $C_1$-$C_7$ alkylene group substituted with deuterium or a $C_1$-$C_3$ alkyl group; and $X_{21}$ is an unsubstituted $C_1$-$C_{10}$ alkyl group, or a $C_1$-$C_7$ alkyl group substituted with deuterium or a $C_1$-$C_3$ alkyl group.

3. The ink composition of claim 1, wherein the first di(meth)acrylate monomer comprises ethylene glycol diacrylate, ethylene glycol dimethacrylate, propylene glycol diacrylate, propylene glycol dimethacrylate, neopentyl glycol diacrylate, neopentyl glycol dimethacrylate, 1,3-butanediol diacrylate, 1,3-butanediol dimethacrylate, 1,4-butanediol diacrylate, 1,4-butanediol dimethacrylate, 1,6-hexanediol diacrylate, 1,6-hexanediol dimethacrylate, or any combination thereof, and the second monofunctional monomer comprises methyl acrylate, methyl methacrylate, ethyl acrylate, ethyl methacrylate, n-butyl acrylate, n-butyl methacrylate, iso-butyl acrylate, iso-butyl methacrylate, or any combination thereof.

4. The ink composition of claim 1, wherein the first di(meth)acrylate monomer is 1,6-hexanediol diacrylate; and the second monofunctional monomer is ethyl acrylate or ethyl methacrylate.

5. The ink composition of claim 1, further comprising a third monofunctional monomer including one photo-functional group and a third carbon-containing chain, wherein the third carbon-containing chain includes an alkyl group, the number of carbons in the third carbon-containing chain is less than the number of carbons in the first carbon-containing chain, and the second monofunctional monomer and the third monofunctional monomer are different from each other.

6. The ink composition of claim 5, wherein the third carbon-containing chain is a $C_1$-$C_5$ alkyl group.

7. The ink composition of claim 5, wherein the photo-functional group of the second monofunctional monomer is acrylate, and the photo-functional group of the third monofunctional monomer is methacrylate.

8. The ink composition of claim 5, wherein the third monofunctional monomer is represented by Formula 3:

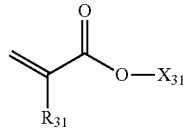

Formula 3 wherein, in Formula 3, $R_{31}$ is hydrogen or a methyl group, and $X_{31}$ is a $C_1$-$C_5$ alkyl group; or a $C_1$-$C_3$ alkyl group substituted with deuterium, a hydroxy group, or a $C_1$-$C_2$ alkyl group.

9. The ink composition of claim 5, wherein the third monofunctional monomer comprises methyl acrylate, methyl methacrylate, ethyl acrylate, ethyl methacrylate, n-butyl acrylate, n-butyl methacrylate, iso-butyl acrylate, iso-butyl methacrylate, or any combination thereof.

10. The ink composition of claim 5, wherein an amount of the third monofunctional monomer is from about 3 parts by weight to about 30 parts by weight based on 100 parts by weight of the ink composition.

11. The ink composition of claim 1, further comprising a solvent in an amount of less than 2 parts by weight based on 100 parts by weight of the ink composition.

12. The ink composition of claim 1, further comprising a scatterer, wherein the scatterer comprises $BiFeO_3$, $Fe_2O_3$, $WO_3$, $TiO_2$, SiC, $BaTiO_3$, ZnO, $ZrO_2$, ZrO, $Ta_2O_5$, $MoO_3$, $TeO_2$, $Nb_2O_5$, $Fe_3O_4$, $V_2O_5$, $Cu_2O$, BP, $Al_2O_3$, $In_2O_3$, $SnO_2$, $Sb_2O_3$, ITO, or any combination thereof.

13. The ink composition of claim 1, wherein the ink composition has a surface tension of about 10 dynes/cm to about 40 dynes/cm.

14. An electronic apparatus comprising a light-emitting device including a first electrode; a second electrode; and an interlayer disposed between the first electrode and the second electrode; wherein the interlayer includes a film formed using the ink composition of claim 1.

15. An electronic apparatus comprising a light-emitting device and a film formed using the ink composition of claim 1, wherein the film is positioned external to and proximate to a surface of the light-emitting device from which light is emitted.

16. The electronic apparatus of claim 14, further comprising a thin-film transistor, wherein the thin-film transistor includes a source electrode and a drain electrode, and the first electrode of the light-emitting device is electrically connected to the source electrode or the drain electrode of the thin-film transistor.

* * * * *